(12) United States Patent
Kim et al.

(10) Patent No.: US 12,484,385 B2
(45) Date of Patent: Nov. 25, 2025

(54) DISPLAY DEVICE

(71) Applicant: Samsung Display Co., Ltd., Yongin-si (KR)

(72) Inventors: Jiyoon Kim, Yongin-si (KR); Donghoon Kwak, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 361 days.

(21) Appl. No.: 18/328,015

(22) Filed: Jun. 2, 2023

(65) Prior Publication Data

US 2024/0090274 A1 Mar. 14, 2024

(30) Foreign Application Priority Data

Aug. 18, 2022 (KR) .................. 10-2022-0103607

(51) Int. Cl.
  *H10K 59/122* (2023.01)
  *H10K 50/115* (2023.01)
  *H10K 50/16* (2023.01)
  *H10K 50/17* (2023.01)
  *H10K 71/13* (2023.01)

(52) U.S. Cl.
  CPC ......... *H10K 59/122* (2023.02); *H10K 50/115* (2023.02); *H10K 50/16* (2023.02); *H10K 50/171* (2023.02); *H10K 71/135* (2023.02)

(58) Field of Classification Search
  CPC .... H10K 59/122; H10K 50/115; H10K 50/16; H10K 50/171
  See application file for complete search history.

(56) References Cited

U.S. PATENT DOCUMENTS

| 8,876,272 | B2 | 11/2014 | Linton et al. |
| 9,735,212 | B2 | 8/2017 | Pang |
| 10,504,967 | B2 | 12/2019 | Shimizu |
| 2019/0131577 | A1* | 5/2019 | Mishima ............... H10K 50/11 |
| 2022/0131108 | A1 | 4/2022 | Park et al. |
| 2024/0349561 | A1* | 10/2024 | Zhang ............... H10K 59/1315 |

FOREIGN PATENT DOCUMENTS

| CN | 103280539 | 9/2013 |
| KR | 10-2015-0141338 | 12/2015 |
| KR | 10-2022-0054498 | 5/2022 |

OTHER PUBLICATIONS

Zhang et al., "Inverted Quantum-Dot Light-Emitting Diodes Fabricated by All-Solution Processing", Applied Materials & Interfaces, Feb. 11, 2016, pp. 1-14.

* cited by examiner

*Primary Examiner* — Joseph L Williams
(74) *Attorney, Agent, or Firm* — Womble Bond Dickinson (US) LLP

(57) ABSTRACT

Provided is a display device including a base layer; a circuit layer on the base layer; a first electrode on the circuit layer; a pixel defining film on the circuit layer and having an opening exposing the first electrode; an electron injection layer on the first electrode and exposing a portion of the first electrode; an electron transport layer on the electron injection layer and overlapping the electron injection layer in plan view; an emission layer on the electron transport layer; a hole transport region on the emission layer; and a second electrode on the hole transport region, a first length of the electron injection layer in a direction is shorter than a second length of the first electrode exposed by the opening of the pixel defining film in a direction.

20 Claims, 7 Drawing Sheets

DISPLAY DEVICE

CROSS-REFERENCE TO RELATED APPLICATIONS

This application claims priority to and benefits of Korean Patent Application No. 10-2022-0103607 under 35 U.S.C. § 119, filed on Aug. 18, 2022 in the Korean Intellectual Property Office, the entire contents of which are incorporated herein by reference.

BACKGROUND

1. Technical Field

The disclosure herein relates to a display device, and, to a display device including a light emitting element having stacked functional layers.

2. Description of the Related Art

In manufacturing light emitting elements included in various display devices, for example, multimedia devices such as television sets, mobile phones, tablet computers, navigation systems, and/or game consoles, manufacturing methods including an inkjet printing method have been used.

Using a coating method such as an inkjet printing method causes the film properties of functional layers constituting light emitting elements to be non-uniform due to a difference in thickness between a center portion of a coating layer and an edge portion thereof. Accordingly, studies are being conducted on a method for manufacturing a display device that provides a greater light emitting area in the light emitting elements and exhibits uniform light emitting characteristics within the light emitting area.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device having improved light emitting efficiency by controlling thickness and width of an electron transport region included in a light emitting element.

An embodiment provides a display device that may include a base layer; a circuit layer disposed on the base layer; a first electrode disposed on the circuit layer; a pixel defining film disposed on the circuit layer and having an opening exposing the first electrode; an electron injection layer disposed on the first electrode and exposing a portion of the first electrode; an electron transport layer disposed on the electron injection layer and overlapping the electron injection layer in plan view; an emission layer disposed on the electron transport layer; a hole transport region disposed on the emission layer; and a second electrode disposed on the hole transport region, wherein a first length of the electron injection layer in a direction is shorter than a second length of the first electrode exposed by the opening of the pixel defining film in a direction.

In an embodiment, an average distance between an edge portion of the electron injection layer and a side surface of the pixel defining film adjacent to the edge portion of the electron injection layer may be in a range of about 1 µm to about 2 µm.

In an embodiment, the electron injection layer may include ZnO, and the electron transport layer may include ZnMgO.

In an embodiment, the first electrode exposed by the opening of the pixel defining film may include a first portion exposed by the electron injection layer; and a second portion overlapped by the electron injection layer in plan view.

In an embodiment, the first portion of the first electrode may be overlapped by the electron transport layer in plan view.

In an embodiment, the first electrode may be a reflective electrode.

In an embodiment, a difference between the first length of the electron injection layer and the second length of the first electrode may be in a range of about 2 µm to about 4 µm.

In an embodiment, a surface of the electron injection layer adjacent to the electron transport layer may be a substantially flat surface.

In an embodiment, the electron injection layer may have a substantially uniform thickness.

In an embodiment, the electron injection layer may be provided through a deposition, and the electron transport layer may be provided through an inkjet printing.

In an embodiment, the emission layer may include quantum dots.

In an embodiment, a display device may include a pixel defining film having openings spaced apart in plan view; and light emitting elements including at least one functional layer disposed in each of the openings of the pixel defining film, wherein the light emitting elements each include a first electrode; an electron injection layer disposed on the first electrode, having a substantially uniform thickness, and spaced apart from the pixel defining film; an electron transport layer disposed on the electron injection layer and being smaller in thickness at a center of the electron transport layer than at an outer periphery of the electron transport layer; an emission layer disposed on the electron transport layer; a hole transport region disposed on the emission layer; and a second electrode disposed on the hole transport region, and the first electrode includes a first portion exposed by the electron injection layer; and a second portion overlapped by the electron injection layer in plan view.

In an embodiment, a distance between an edge portion of the electron injection layer adjacent to the pixel defining film and an edge portion of the first electrode adjacent to the edge portion of the electron injection layer may be in a range of about 1 µm to about 4 µm.

In an embodiment, the electron transport layer may overlap the electron injection layer in plan view.

In an embodiment, the electron injection layer may have a greater electrical conductivity than an electrical conductivity of the electron injection layer.

In an embodiment, the first portion may be overlapped by the electron transport layer in plan view.

In an embodiment, a surface of the electron injection layer adjacent to the electron transport layer may be a substantially flat surface.

In an embodiment, an average distance between an edge portion of the electron injection layer adjacent to the pixel defining film and a side surface of the pixel defining film adjacent to the edge portion of the electron injection layer may be in a range of about 1 µm to about 2 µm.

In an embodiment, a display device may include light emitting elements, wherein the light emitting elements each include a first electrode; an electron injection layer disposed on the first electrode; an electron transport layer disposed on the electron injection layer; an emission layer disposed on the electron transport layer; a hole transport region disposed on the emission layer; and a second electrode disposed on the hole transport region, in plan view, the electron injection layer has a smaller area than an area of the first electrode in plan view, the electron injection layer has a substantially uniform thickness, and the electron transport layer is smaller in thickness at a center of the electron transport layer than at an outer periphery of the electron transport layer.

In an embodiment, the electron transport layer may be disposed directly on the first electrode that is exposed from the electron injection layer.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings.

DETAILED DESCRIPTION OF THE EMBODIMENTS

Figure 1:
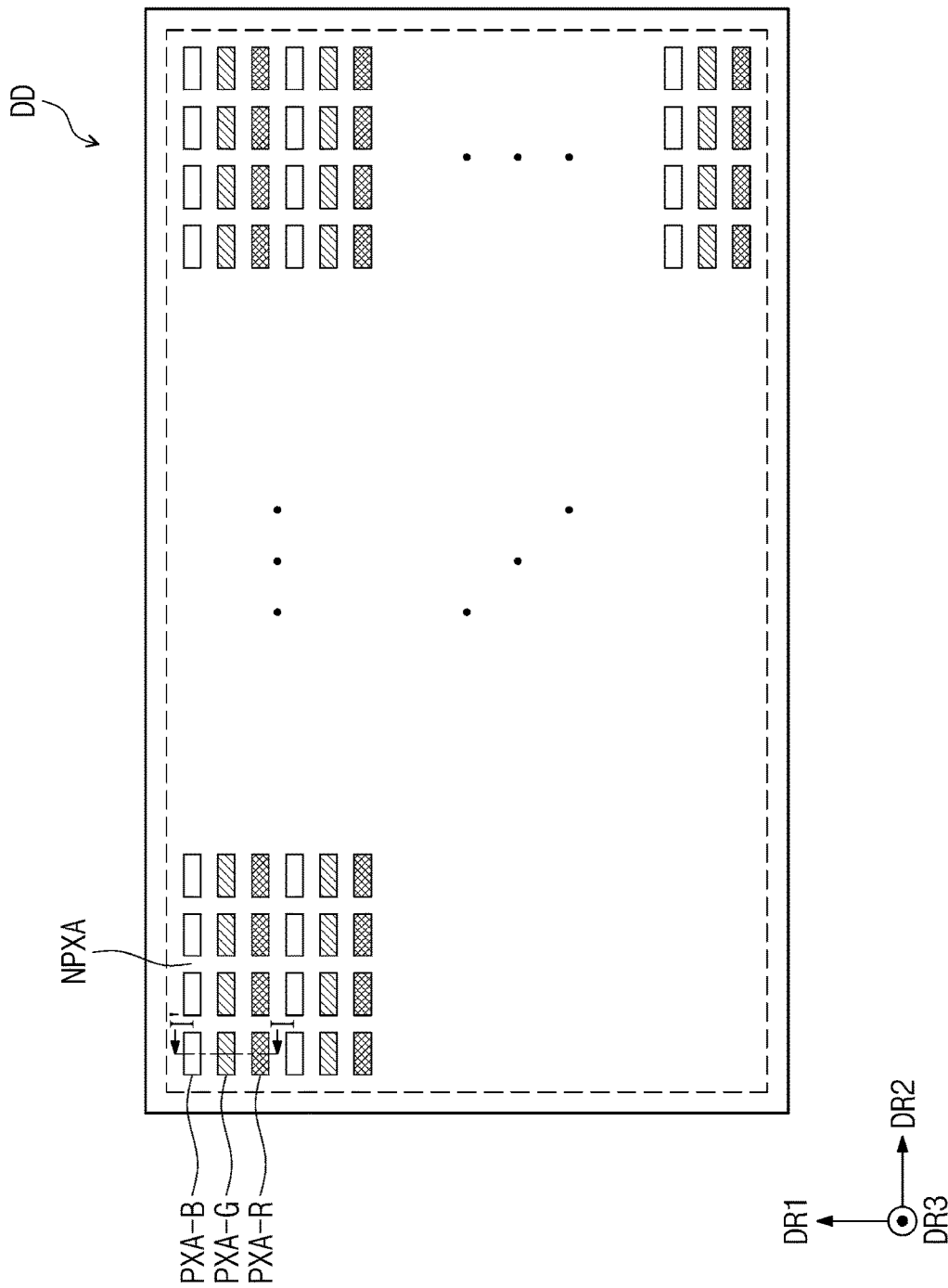
FIG. 1 is a schematic plan view showing a display device according to an embodiment.

The disclosure may be modified in many alternate forms, and thus embodiments will be described and illustrated in the drawings and described in detail. It should be understood, however, that it is not intended to limit the disclosure to the disclosed forms, but rather, is intended to cover all modifications, equivalents, and alternatives falling within the spirit and scope of the disclosure.

In the description, when an element (or a region, a layer, a portion, etc.) is referred to as being "on," "connected to," or "coupled to" another element, it means that the element may be directly disposed on/connected to/coupled to the other element, or that a third element or other elements may be disposed therebetween.

It will be understood that the terms "connected to" or "coupled to" may include a physical or electrical connection or coupling.

However, in this application, being "disposed directly on" may mean that there is no additional layer, film, region, plate, or the like between a part and another part such as a layer, a film, a region, a plate, or the like within the spirit and the scope of the disclosure. For example, being "disposed directly on" may mean that two layers or two members are disposed without using an additional member such as an adhesive member, therebetween.

Like numbers refer to like elements throughout. In the drawings, the thickness, the ratio, and the dimensions of elements are exaggerated for an effective description of technical contents and clarity.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc. may be used herein to describe various elements, these elements should not be limited by these terms. These terms are only used to distinguish one element from another element. For example, a first element may be referred to as a second element, and similarly, a second element may be referred to as a first element without departing from the teachings of the disclosure.

As used herein, the singular forms, "a," "an," and "the" are intended to include the plural forms as well, unless the context clearly indicates otherwise.

Terms such as "below," "lower," "above," "upper," and the like are used to describe the relationship of the configurations shown in the drawings. The terms are used as a relative concept and are described with reference to the direction indicated in the drawings but are not necessarily limited thereto. In the specification, being "disposed on" may represent not only being disposed on the top surface but also being disposed on the bottom surface.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should be understood that the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Hereinafter, a display device according to an embodiment of the disclosure and a method for manufacturing a display device will be described with reference to the accompanying drawings.

Figure 2:
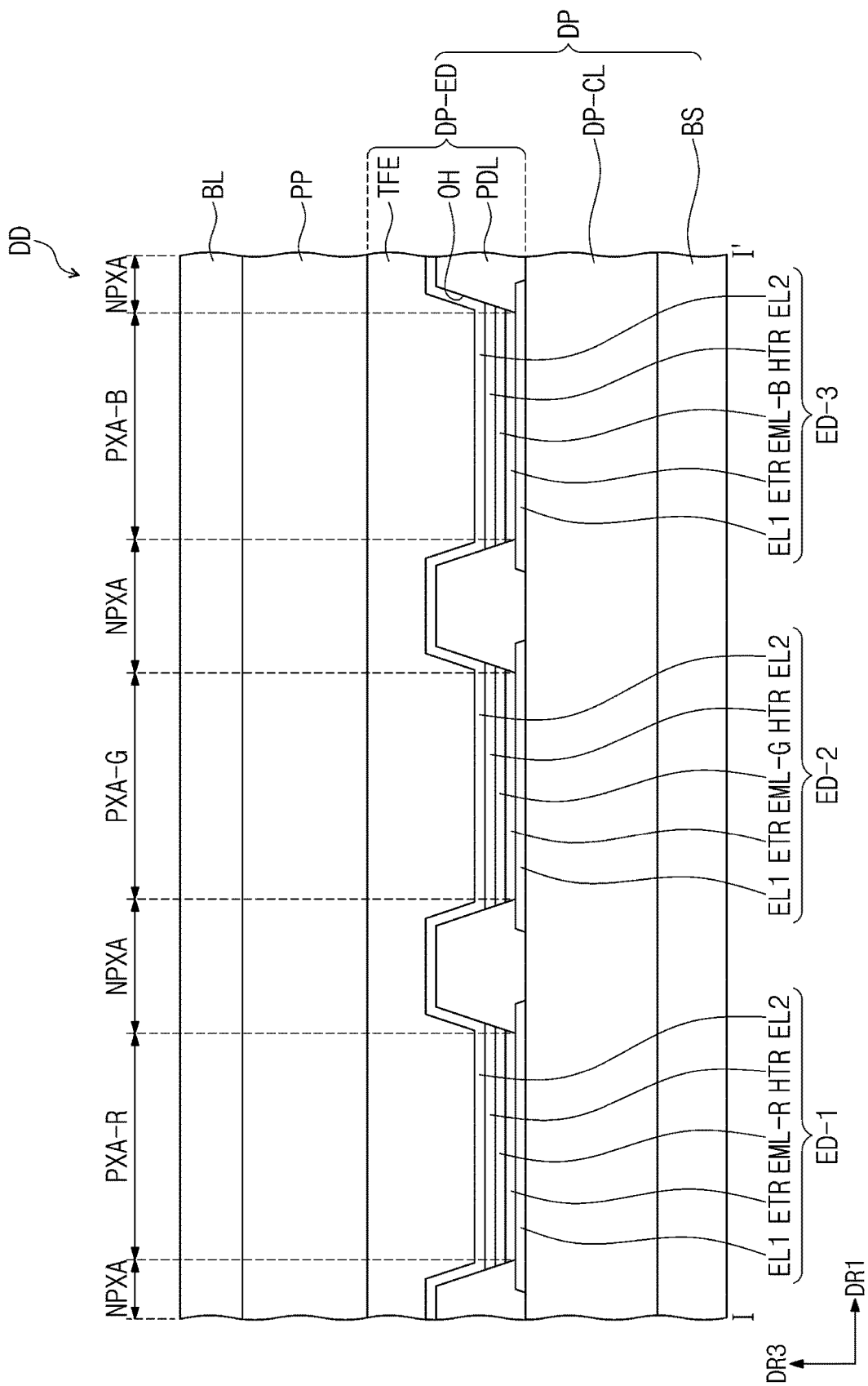
FIG. 2 is a schematic cross-sectional view of a display device according to an embodiment.
Figure 3:
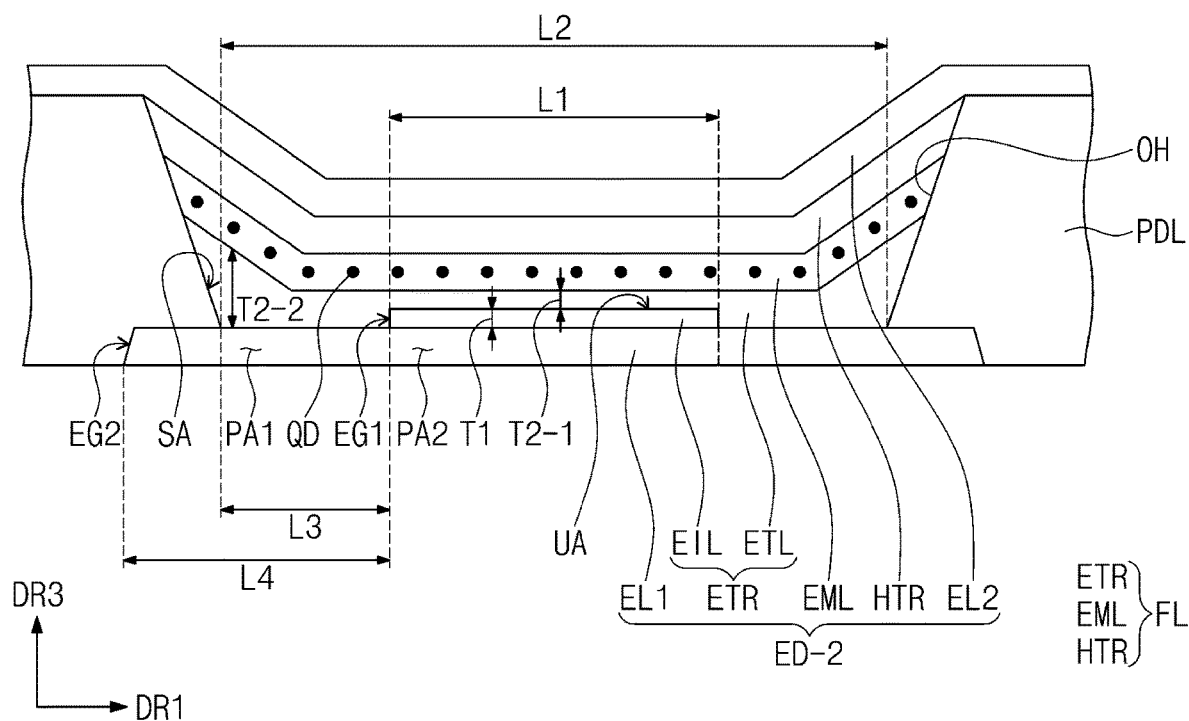
FIG. 3 is a schematic cross-sectional view showing a portion of a display device according to an embodiment.
Figure 4:
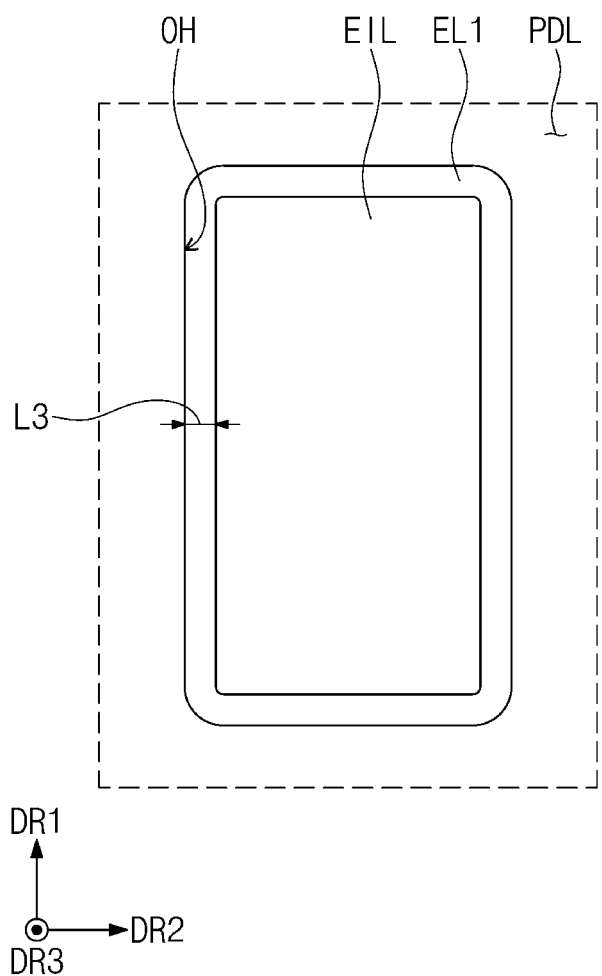
FIG. 4 is a schematic plan view showing a portion of a display device.

FIG. 1 is a schematic plan view showing a display device according to an embodiment. FIG. 2 is a schematic cross-sectional view of a display device according to an embodiment. FIG. 2 is a schematic cross-sectional view showing a portion corresponding to line I-I' of FIG. 1. FIG. 3 is a schematic cross-sectional view showing a portion of a display device. FIG. 4 is a schematic plan view showing a portion of a display.

Referring to FIGS. 1 and 4, a display device DD according to an embodiment may include light emitting elements ED-1, ED-2, and ED-3. In the display device DD according to an embodiment, the light emitting elements ED-1, ED-2, and ED-3 may each include a first electrode EL1 and a second electrode EL2, which face each other, and at least one functional layer FL disposed between the first electrode EL1 and the second electrode EL2.

The display device DD according to an embodiment may include a non-light emitting region NPXA and light emitting regions PXA-R, PXA-G, and PXA-R. The light emitting regions PXA-R, PXA-G, and PXA-B may each be a region emitting light generated from each of the light emitting elements ED-1, ED-2, and ED-3. The light emitting regions PXA-R, PXA-G, and PXA-B may be spaced apart from each other in case that viewed in plan view.

The light emitting regions PXA-R, PXA-G, and PXA-B may each be a region separated by a pixel defining film PDL. The non-light emitting regions NPXA may be regions between neighboring light emitting regions PXA-R, PXA-G, and PXA-B, and may correspond to the pixel defining film PDL. In the disclosure, the light emitting regions PXA-R, PXA-G, and PXA-B may each correspond to a pixel. The pixel defining film PDL may separate the light emitting elements ED-1, ED-2 and ED-3. Emission layers EML-R, EML-G, and EML-B of the light emitting elements ED-1, ED-2 and ED-3 may be disposed and separated in an opening OH defined by the pixel defining film PDL. In an embodiment, an electron transport region ETR, the emission layers EML-R, EML-G, and EML-B, and a hole transport region HTR of the light emitting elements ED-1, ED-2, and ED-3 may be disposed in the opening OH defined in the pixel defining film PDL.

The pixel defining film PDL may be formed of a polymer resin. For example, the pixel defining film PDL may be formed including a polyacrylate-based resin or a polyimide-based resin. The pixel defining film PDL may be formed by further including an inorganic material in addition to the polymer resin. The pixel defining film PDL may be formed including a light absorbing material, or may be formed including a black pigment or a black dye. The pixel defining film PDL formed including a black pigment or a black dye may implement a black pixel defining film. In case that forming the pixel defining film PDL, carbon black may be used as a black pigment or a black dye, but an embodiment is not limited thereto.

The pixel defining film PDL may be formed of an inorganic material. For example, the pixel defining film PDL may be formed including silicon nitride ($SiN_x$), silicon oxide ($SiO_x$), silicon oxide ($SiO_xN_y$), and the like within the spirit and the scope of the disclosure. The pixel defining film PDL may define the light emitting regions PXA-R, PXA-G, and PXA-B. The light emitting regions PXA-R, PXA-G, and PXA-B, and the non-light emitting region NPXA may be separated by the pixel defining film PDL.

In an embodiment, a side surface SA of the pixel defining film PDL may be hydrophobic. The side surface SA of the pixel defining film defining the opening OH and contacting the functional layers FL may exhibit hydrophobicity. For example, the pixel defining film PDL itself may be formed including a hydrophobic material, or may include a hydrophobic coating layer (not shown) at least on the side surface SA of the pixel defining film.

The light emitting regions PXA-R, PXA-G, and PXA-B may be divided into groups according to the color of light generated from the light emitting elements ED-1, ED-2, and ED-3. In the display device DD of an embodiment shown in FIGS. 1 and 2, three light emitting regions PXA-R, PXA-G, and PXA-B which emit red light, green light, and blue light, are shown as an example. For example, the display device DD of an embodiment may include a red light emitting region PXA-R, a green light emitting region PXA-G, and a blue light emitting region PXA-B, which are distinct from one another.

In the display device DD according to an embodiment, the light emitting elements ED-1, ED-2, and ED-3 may emit light having different wavelength ranges. For example, in an embodiment, the display device DD may include a first light emitting element ED-1 emitting red light, a second light emitting element ED-2 emitting green light, and a third light emitting element ED-3 emitting blue light. For example, the red light emitting region PXA-R, the green light emitting region PXA-G, and the blue light emitting region PXA-B of the display device DD may correspond to the first light emitting element ED-1, the second light emitting element ED-2, and the third light emitting element ED-3, respectively.

However, an embodiment is not limited thereto, and the first to third light emitting elements ED-1, ED-2 and ED-3 may emit light in a same wavelength range or emit light in at least one different wavelength range. For example, the first to third light emitting elements ED-1, ED-2, and ED-3 may all emit blue light.

In case that the first to third light emitting elements ED-1, ED-2, and ED-3 all emit blue light, the display device DD may further include a light control layer (not shown) disposed on a display panel DP. The light control layer (not shown) may be a layer including a light conversion material such as quantum dots or phosphors. The light control layer (not shown) may include a first light control portion corresponding to the red light emitting region PXA-R and including a red light converter that converts blue light into red light, and a second light control portion corresponding to the green light emitting region PXA-G and including a green light converter that converts blue light into green light.

The light emitting regions PXA-R, PXA-G, and PXA-B in the display device DD according to an embodiment may be arranged or disposed in the form of a stripe. Referring to FIG. 1, red light emitting regions PXA-R, green light emitting regions PXA-G, and blue light emitting regions PXA-B may each be arranged or disposed along a second directional axis DR2. By way of example, the red light emitting region PXA-R, the green light emitting region PXA-G, and the blue light emitting region PXA-B may be alternately arranged or disposed in turn along a first directional axis DR1.

FIGS. 1 and 2 show that the light emitting regions PXA-R, PXA-G, and PXA-B are all similar in size, but an embodiment is not limited thereto, and the light emitting regions PXA-R, PXA-G and PXA-B may be different in size from each other according to wavelength range of emitted light. The areas of the light emitting regions PXA-R, PXA-G, and PXA-B may refer to areas in case that viewed in plan view defined by the first directional axis DR1 and the second directional axis DR2.

The arrangement of the light emitting regions PXA-R, PXA-G, and PXA-B is not limited to what is shown in FIG. 1, and the order in which the red light emitting region PXA-R, the green light emitting region PXA-G, and the blue light emitting region PXA-B are arranged or disposed comes with varied combination according to display quality characteristics required for the display device DD. For example, the light emitting regions PXA-R, PXA-G, and PXA-B may be arranged or disposed in the form of a pentile (PENTILE™) or a diamond (Diamond Pixel™).

Areas of each of the light emitting regions PXA-R, PXA-G, and PXA-B may be different in size from one another. For example, in an embodiment, the green light emitting region PXA-G may be smaller than the blue light emitting region PXA-B in size, but an embodiment is not limited thereto.

The display device DD according to an embodiment may include a display panel DP including a light emitting element layer DP-ED. In an embodiment, the display panel DP may include a base layer BS, a circuit layer DP-CL and a light emitting element layer DP-ED provided on the base layer BS, and an upper insulating layer TFE disposed on the light emitting element layer DP-ED. The light emitting element layer DP-ED may include the pixel defining film PDL and the light emitting elements ED-1, ED-2, and ED-3 including at least one functional layer FL disposed between the pixel defining films PDL.

The base layer BS may be a member providing a base surface in which the light emitting element layer DP-ED is disposed. The base layer BS may be a glass substrate, a metal substrate, a plastic substrate, and the like within the spirit and the scope of the disclosure. However, an embodiment is not limited thereto, and the base layer BS may be an inorganic layer, an organic layer, or a composite material layer.

In an embodiment, the circuit layer DP-CL may be disposed on the base layer BS, and the circuit layer DP-CL may include transistors (not shown). The transistors (not shown) may each include a control electrode, an input electrode, and an output electrode. For example, the circuit layer DP-CL may include a switching transistor and a driving transistor for driving the light emitting elements ED-1, ED-2 and ED-3 of the light emitting element layer DP-ED.

The light emitting elements ED-1, ED-2, and ED-3 may each include a first electrode EL1, an electron transport region ETR, emission layers EML-R, EML-G, and EML-B, a hole transport region HTR, and a second electrode EL2, which are sequentially staked. The light emitting elements ED-1, ED-2, and ED-3 may each have an inverted element structure in which the electron transport region ETR is disposed below the emission layers EML-R, EML-G, and EML-B, and the hole transport region HTR is disposed above the emission layers EML-R, EML-G, and EML-B.

FIG. 3 shows a structure of the light emitting elements ED-1, ED-2, and ED-3 as an example, and the structure of light emitting elements shown in FIG. 3 may be equally applied to each of the light emitting elements ED-1, ED-2, and ED-3 shown in FIG. 2.

Referring to FIG. 2, in an embodiment, the electron transport region ETR of the light emitting elements ED-1, ED-2, and ED-3, the emission layers EML-R, EML-G, and EML-B, and the hole transport region HTR may be disposed in the opening OH defined in the pixel defining film PDL and the second electrode EL2 may be provided as a common layer throughout the light emitting elements ED-1, ED-2, and ED-3.

In an embodiment, the first electrode EL1 and the electron transport region ETR may be provided using a deposition method. The first electrode EL1 and the electron transport region ETR may be provided through a deposition method and patterned through a photolithography process. In an embodiment, the hole transport region HTR, the emission layers EML-R, EML-G, and EML-B, and the like of the light emitting elements ED-1, ED-2, and ED-3 may be provided through an inkjet printing method. The emission layers EML-R, EML-G, and EML-B and the hole transport region HTR may be sequentially provided using the inkjet printing method. The emission layers EML-R, EML-G, and EML-B and the hole transport region HTR formed using the inkjet printing method may be formed by providing an emission layer material or a hole transport material, along with a solvent, as a solution for a printing layer, or may be formed from a light emitting layer material or a hole transport material without a separate solvent. Processes of forming the first electrode EL1, the electron transport region ETR, the emission layer EML, the hole transport region HTR, and the second electrode EL2 will be described in more detail with reference to FIGS. 5 to 10.

The upper insulating layer TFE may be disposed on the light emitting elements ED-1, ED-2, and ED-3. The upper insulating layer TFE may overlap the light emitting elements ED-1, ED-2, and ED-3 in a direction or view (e.g., in plan view). For example, the upper insulating layer TFE may cover and seal the light emitting elements ED-1, ED-2, and ED-3. The upper insulating layer TFE may be a thin film encapsulation layer. The upper insulating layer TFE may be a single layer or a stack layer of layers. The upper insulating layer TFE according to an embodiment may include at least one inorganic film (hereinafter, an encapsulation inorganic film). The upper insulating layer TFE according to an embodiment may include at least one organic film (hereinafter, an encapsulation organic film) and at least one encapsulation inorganic film.

The encapsulation inorganic film protects the light emitting element layer DP-ED from moisture/oxygen, and the encapsulation organic film protects the light emitting element layer DP-ED from foreign substances such as dust particles. The encapsulation inorganic film may include silicon nitride, silicon oxy nitride, silicon oxide, titanium oxide, aluminum oxide, etc., but is not particularly limited thereto. The encapsulation organic layer may include an acrylic compound, an epoxy-based compound, etc. The encapsulation organic layer may include a photopolymerizable organic material, and is not particularly limited.

The upper insulating layer TFE may be disposed on the second electrode EL2, and may be disposed to fill the opening OH.

The display device DD according to an embodiment may include a display panel DP and an optical layer PP disposed on the display panel DP. The optical layer PP may be disposed on the display panel DP to control reflected light in the display panel DP due to external light. The optical layer PP may include, for example, a polarizing layer or a color filter layer. Unlike what is shown in the drawings, the optical layer PP may be omitted in the display device DD of an embodiment.

A base substrate BL may be disposed on the optical layer PP. The base substrate BL may be a member providing a base surface on which the optical layer PP is disposed. The base substrate BL may be a glass substrate, a metal substrate, a plastic substrate, etc. However, an embodiment is not limited thereto, and the base substrate BL may be an inorganic layer, an organic layer, or a composite material layer. Unlike what is shown, the base substrate BL may be omitted in an embodiment.

The first electrode EL1 has conductivity. The first electrode EL1 may be formed of a metal material, a metal alloy or a conductive compound. The first electrode EL1 may be a cathode. The first electrode EL1 may be a transmissive electrode, a transflective electrode, or a reflective electrode. The first electrode EL1 may be a transmissive electrode, a transflective electrode, or a reflective electrode. The first electrode may include at least one selected from Ag, Mg, Cu, Al, Pt, Pd, Au, Ni, Nd, Ir, Cr, Li, Ca, LiF, Mo, Ti, W, In, Sn, and Zn, two or more compounds selected therefrom, two or more mixtures selected therefrom, or an oxide thereof.

In case that the first electrode EL1 is the transmissive electrode, the first electrode EL1 may include a transparent metal oxide such as indium tin oxide (ITO), indium zinc oxide (IZO), zinc oxide (ZnO), and indium tin zinc oxide (ITZO). In case that the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca (a stack structure of LiF and Ca), LiF/Al (a stack structure of LiF and Al), Mo, Ti, W, a compound thereof, or a mixture thereof (for example, a mixture of Ag and Mg). By way of example, the first electrode EL1 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the first electrode EL1 may have a three-layer structure of ITO/Ag/ITO, but is not limited thereto. An embodiment is not limited thereto, and the first electrode EL1 may include the above-described metal materials, a combination of two or more metal materials selected from the above-described metal materials, or oxides of the above-described metal materials. The first electrode EL1 may have a thickness in a range of about 700 Å to about 10000 Å. For example, the first electrode EL1 may have a thickness in a range of about 1000 Å to about 3000 Å.

Openings OH may be defined in the pixel defining film PDL disposed on the base layer BS. The first electrode EL1 may be disposed on the base layer BS, and an upper surface of the first electrode EL1 may be exposed through the opening OH. In an embodiment, the first electrode EL1 is disposed on the circuit layer DP-CL, and although not shown, the first electrode EL1 may be electrically connected to the circuit layer DP-CL.

The electron transport region ETR may be provided on the first electrode EL1 in the openings OH defined in the pixel defining film PDL.

In an embodiment, the electron transport region ETR may include an electron injection layer EIL adjacent to the first electrode EL1 and an electron transport layer ETL disposed on the electron injection layer EIL. The electron injection layer EIL may have greater electrical conductivity than the electron transport layer ETL. Materials included in the electron injection layer EIL may have greater electrical conductivity than materials included in the electron transport layer ETL. For example, the electron injection layer EIL may include ZnO, and the electron transport layer ETL may include ZnMgO. However, this is presented only as an example, and an embodiment of the disclosure is not limited thereto.

One surface or a surface UA adjacent to the electron transport layer ETL may be a flat surface in the electron injection layer EIL. A thickness T1 of the electron injection layer EIL may be uniform. For example, the electron injection layer EIL may be formed through a deposition method, and thus, the one surface or a surface UA may be flat and the thickness T1 may be uniform.

The electron transport layer ETL may have a thickness T2-1 at a center of the electron transport layer ETL, which is smaller than a thickness T2-1 at an outer periphery thereof. The electron transport layer ETL may be disposed on the side surface SA of the pixel defining film PDL to follow the shape of the pixel defining film PDL. For example, the electron transport layer ETL may be formed through an inkjet printing method to have a structure in which the center is thinner than the outer periphery, and may be disposed on the side surface SA of the pixel defining film PDL to follow the shape of the pixel defining film PDL. The electron transport layer ETL may have relatively low electrical conductivity at the outer periphery which is thicker. Accordingly, in the electron transport layer ETL, an electron transport function may be better at the center than at the outer periphery.

In an embodiment, the electron injection layer EIL may have a first length L1 in a first direction DR1. The first electrode EL1 exposed from the pixel defining film PDL may have a second length L2 in the first direction DR1. The first length L1 may be shorter than the second length L2. Accordingly, the electron injection layer EIL may cover a portion of the first electrode EL1 and expose a portion of the first electrode EL1. A difference between the first length L1 and the second length L2 may be in a range of about 2 μm to about 4 μm.

The electron injection layer EIL may be disposed to be spaced apart from the pixel defining film PDL disposed on both sides of the electron injection layer EIL in the first direction DR1. For example, the electron injection layer EIL may be non-contact with the side surface SA of the pixel defining film PDL. An average distance L3 between an edge EG1 of the electron injection layer EIL adjacent to the pixel defining film PDL and the pixel defining film PDL may be in a range of about 1 μm to about 2 μm.

The edge EG1 of the electron injection layer EIL and an edge EG2 of the first electrode EL1 adjacent to the edge EG1 of the electron injection layer EIL may be disposed to be spaced apart by a fourth distance L4 in the first direction DR1. The fourth distance L4 may be in a range of about 1 µm to about 4 µm.

Referring to FIG. 4, in case that viewed in plan view, the first electrode EL1 may have a greater area than the electron injection layer EIL. Accordingly, the first electrode EL1 may be partially covered and partially exposed from the electron injection layer EIL.

The difference in length between the electron injection layer EIL and the first electrode EL1, and the distance between the edge EG1 of the electron injection layer EIL and the edge EG2 of the first electrode EL1 may be caused by a difference in reactivity between the first electrode EL1 and the electron injection layer EIL in the process of forming the first electrode EL1 and the electron injection layer EIL. This will be described in more detail with reference to FIGS. 5 to 10.

The first electrode EL1 may include a first portion PA1 exposed by the electron injection layer EIL and a second portion PA2 covered by the electron injection layer EIL. A portion of the first portion PA1 may be covered by the pixel defining film PDL. The first portion PA1 exposed from the pixel defining film PDL may be covered by the electron transport layer ETL. The electron transport layer ETL may be directly disposed on the first portion PA1. In an embodiment, a current may flow to the electron transport layer ETL in the first portion PA1, and a current may flow to the electron transport layer ETL through the electron injection layer EIL in the second portion PA2.

The electron transport layer ETL may cover the electron injection layer EIL. The electron transport layer ETL may have a thickness T2-2 at the center of the electron transport layer ETL, which is smaller than a thickness T2-1 at the outer periphery thereof. The center may be a portion adjacent to a center of the opening OH defined in the pixel defining film PDL, and the outer periphery may be a portion adjacent to the pixel defining film PDL.

The outer periphery may be a portion having a lower light emitting efficiency due to a thicker functional layer than the center. For example, the light emitting efficiency of the light emitting element ED may increase in case that the amount of current flowing through the center of the light emitting element ED is greater than the amount of current flowing through the outer periphery of the light emitting element ED.

The electron transport region ETR corresponding to the center may have a structure in which the electron injection layer EIL and the electron transport layer ETL are stacked each other, and the electron transport region ETR corresponding to the outer periphery may have a structure in which only the electron transport layer ETL is stacked. Since the electron injection layer EIL has greater electrical conductivity than the electron transport layer ETL, a portion corresponding to the center may have greater electrical conductivity than a portion corresponding to the outer periphery in the electron transport region ETR. Accordingly, in the light emitting element ED according to an embodiment, the amount of current flowing through the center rather than the outer periphery increases, and accordingly, the light emitting efficiency of the light emitting element may increase.

The electron transport region ETR may have a thickness of, for example, in a range of about 1000 Å to about 1500 Å.

The electron transport region ETR may further include a compound represented by Formula ET-1 below.

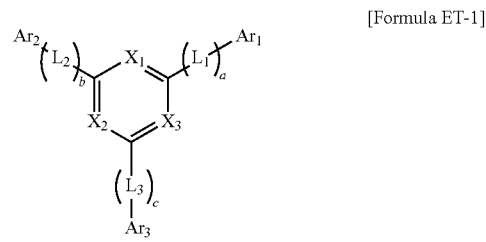

[Formula ET-1]

In Formula ET-1, at least one of $X_1$ to $X_3$ is N and the rest are $CR_a$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may each independently be an integer of 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. In case that a to c are an integer of 2 or greater, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, an embodiment is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris (3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq$_2$), 9,10-di(naphthalene-2-yl) anthracene (ADN), 1,3-bis[3,5-di(pyridin-3-yl)phenyl] benzene (BmPyPhB), or a mixture thereof.

The electron transport region ETR may further include at least one of compounds ET1 to ET36 below.

ET1
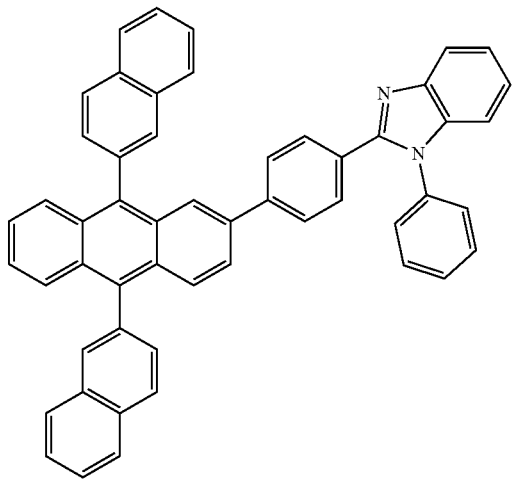
ET2
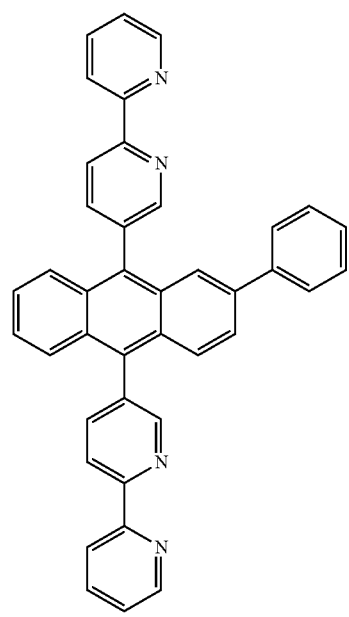
ET3
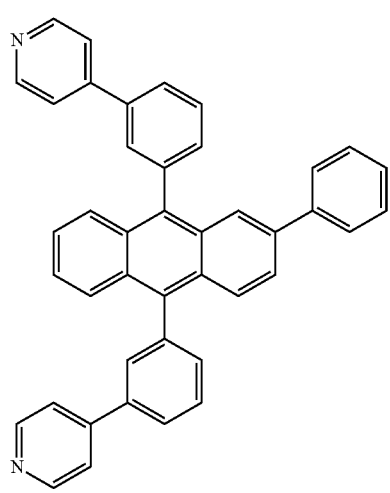
ET4
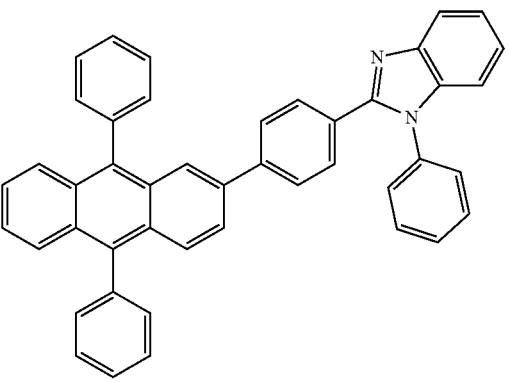
ET5
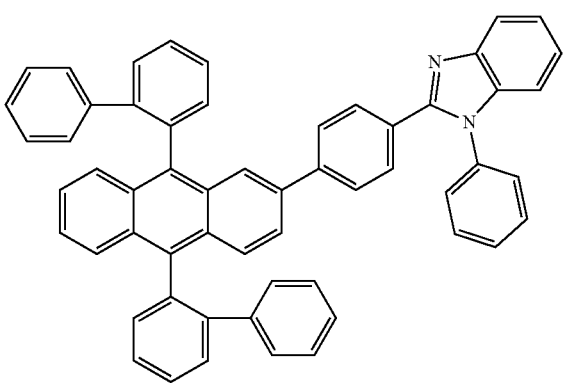
ET6
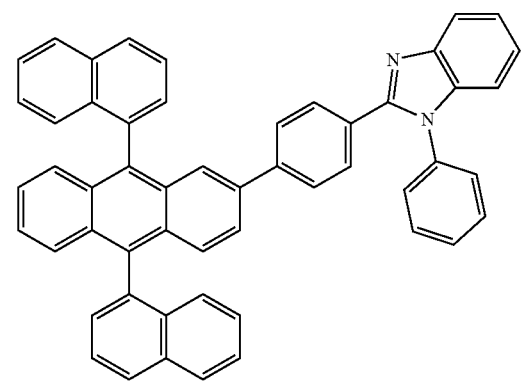

ET7
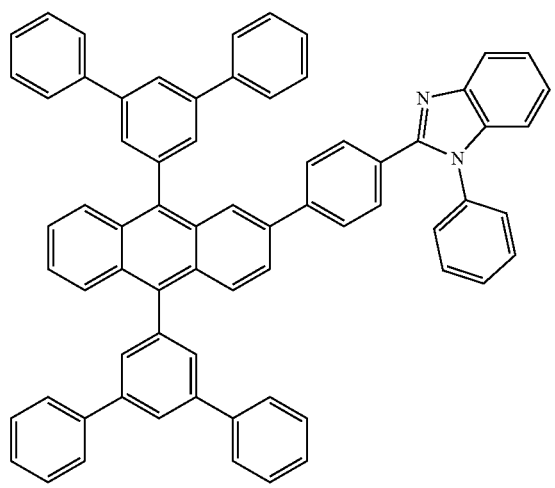
ET8
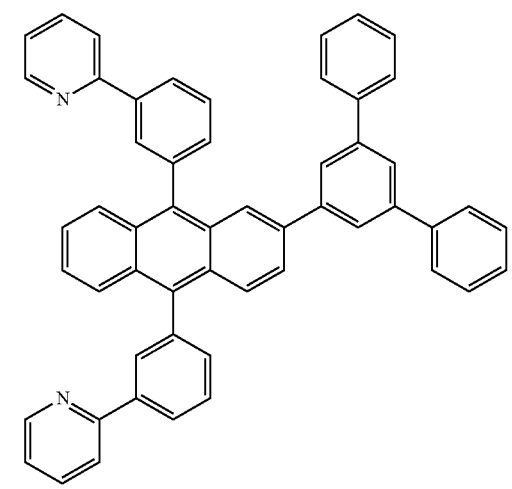
ET9
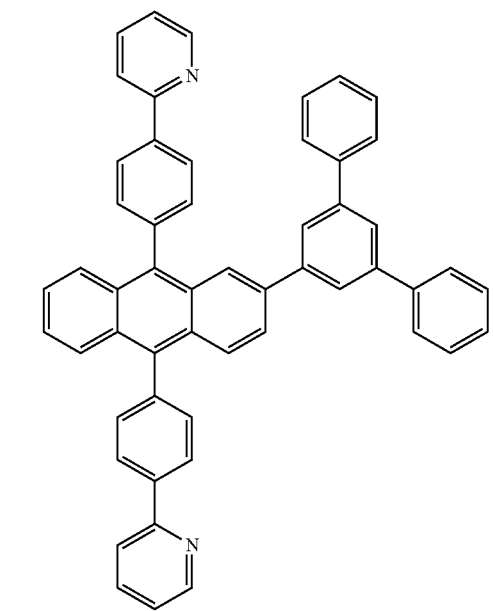
ET10
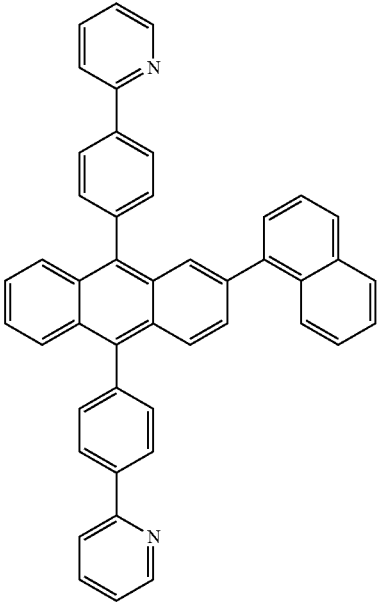
ET11
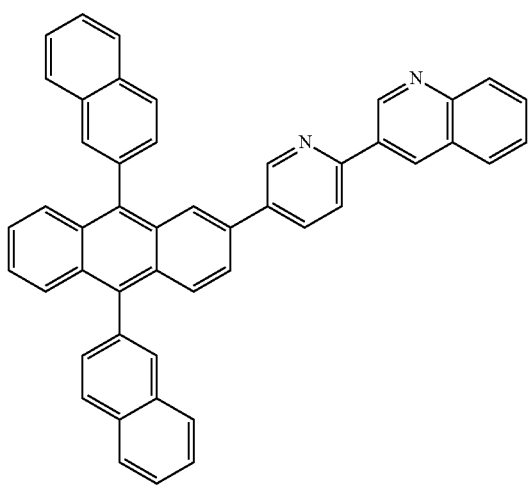
ET12
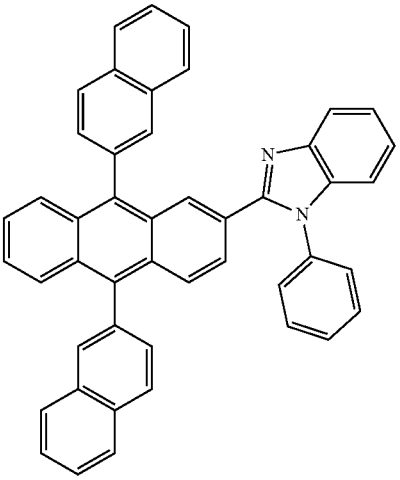

ET13
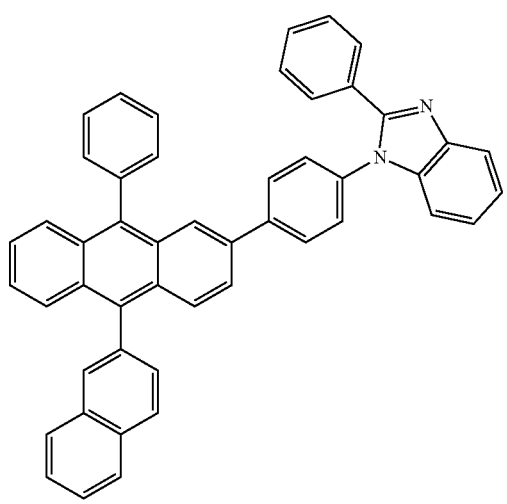
ET14
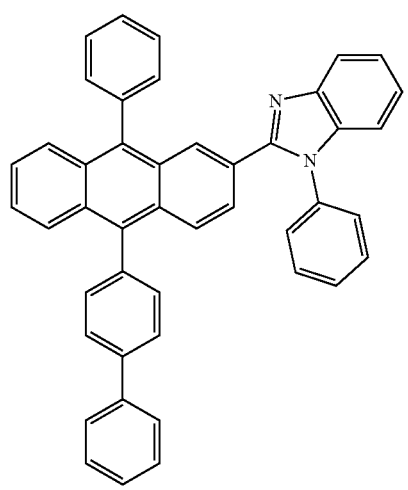
ET15
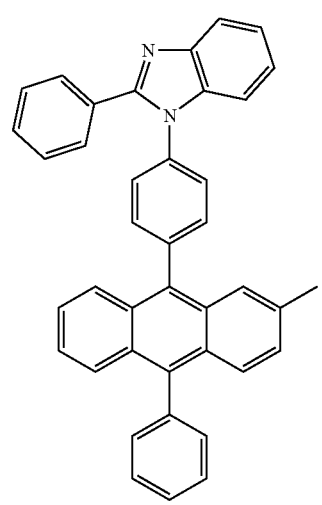
ET16
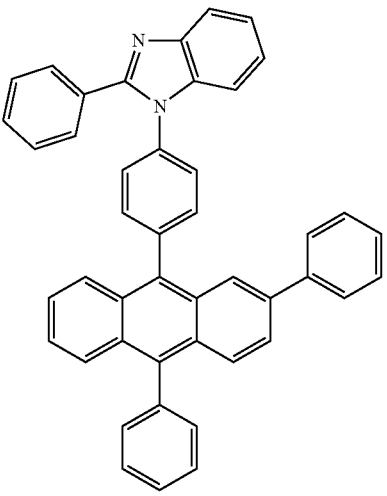
ET17
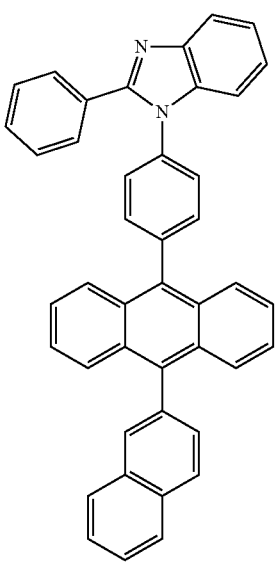
ET18
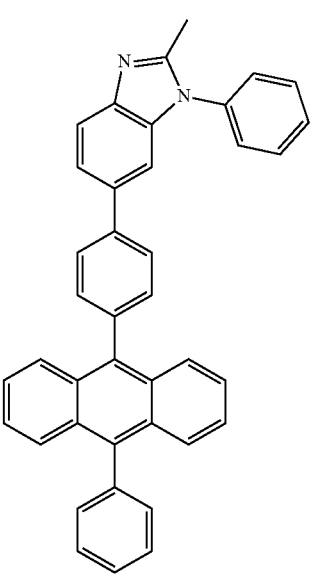

ET19
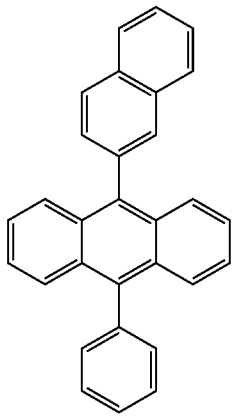
ET20
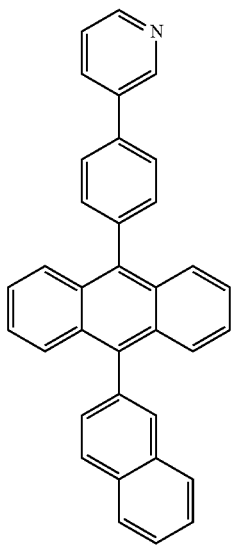
ET21
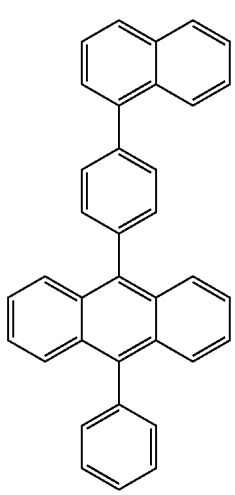
ET22
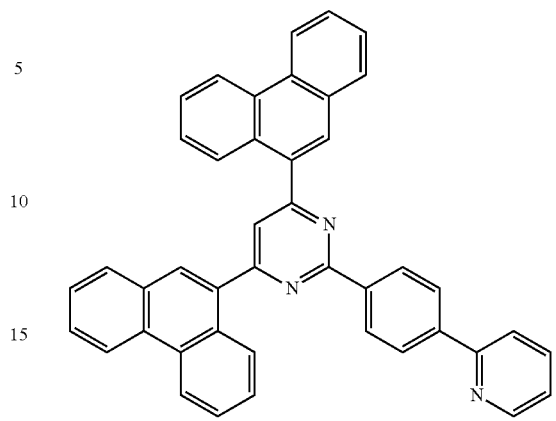
ET23
ET24
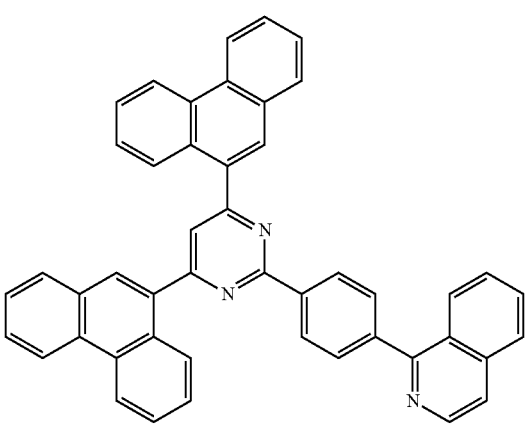

ET25
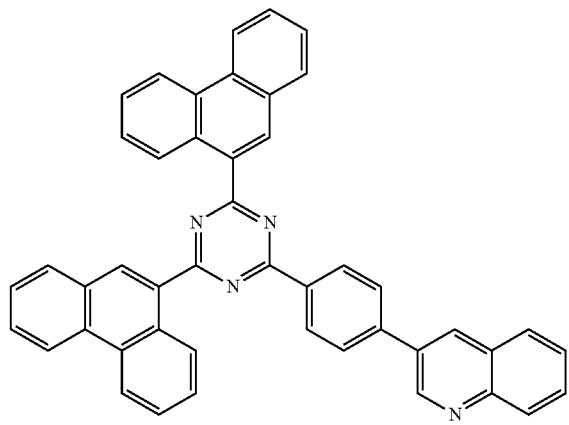
ET26
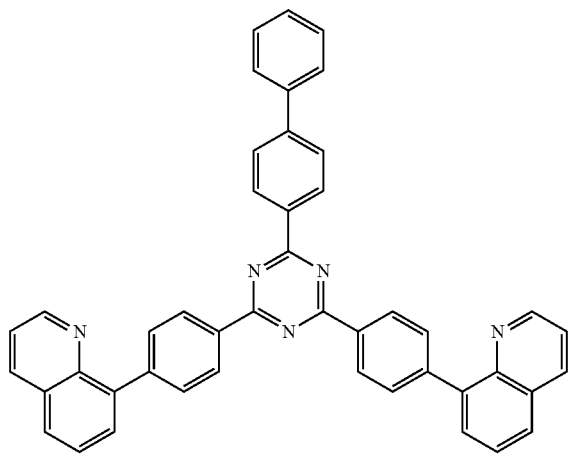
ET27
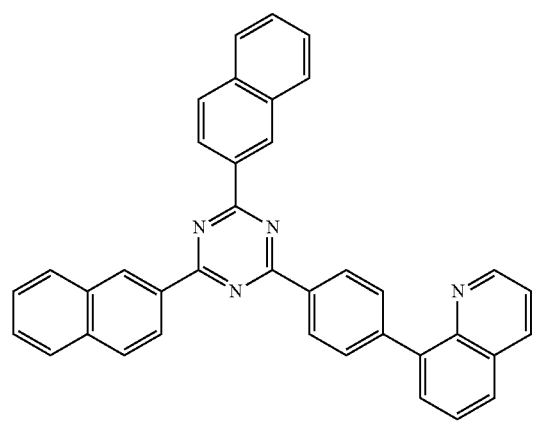
ET28
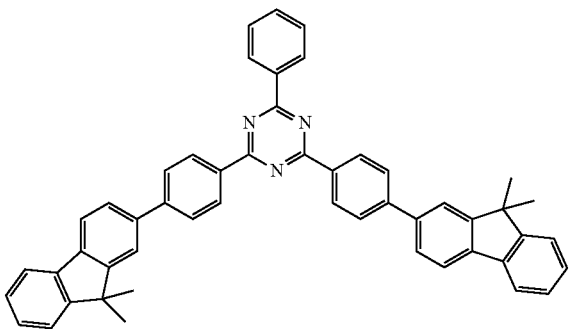
ET29
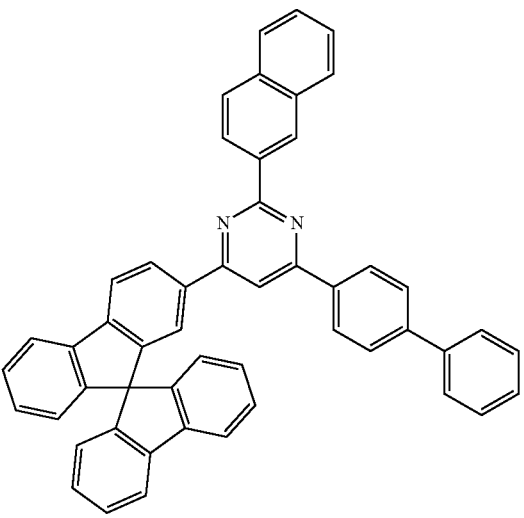
ET30
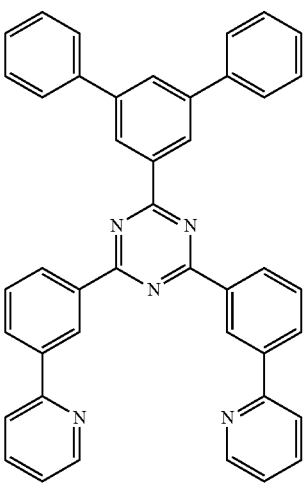

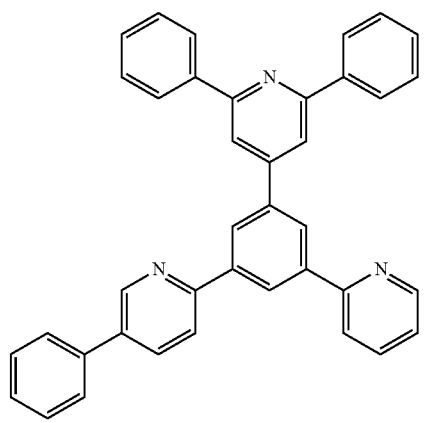

ET31

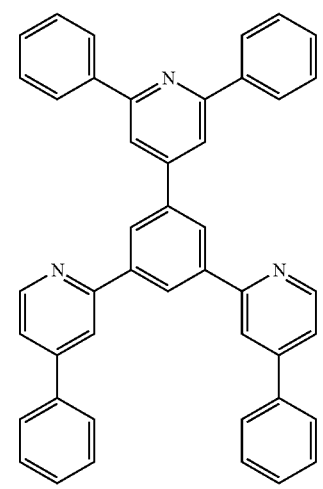

ET32

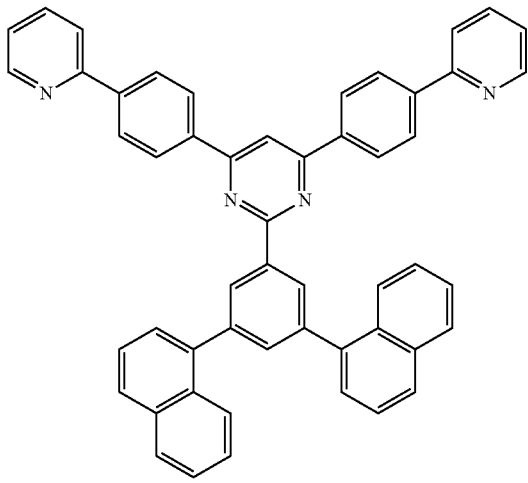

ET33

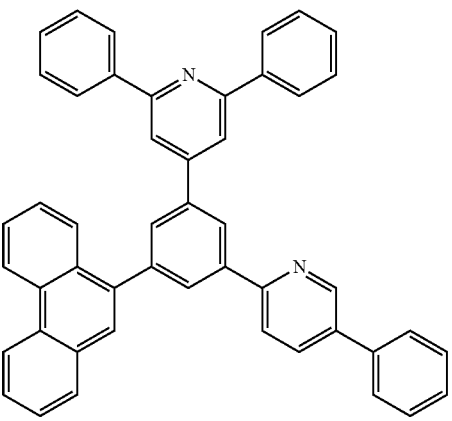

ET34

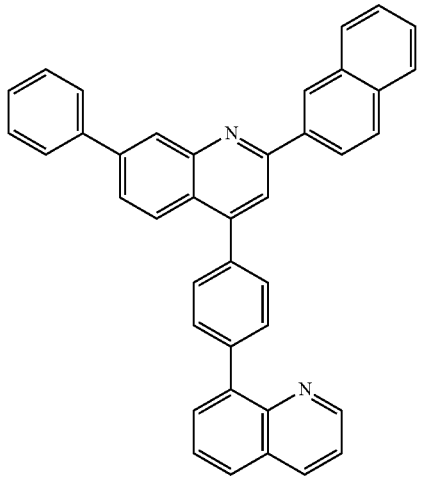

ET35

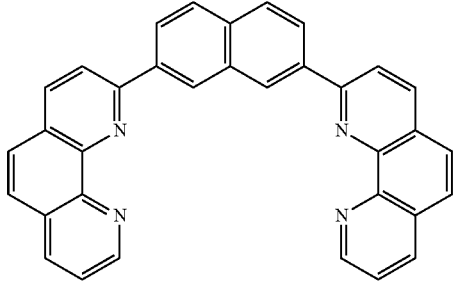

ET36

The electron transport region ETR may further include halogenated metals such as LiF, NaCl, CsF, RbCl, RbI, CuI, and KI, lanthanide metals such as Yb, co-deposition materials of a halogenated metal and a lanthanide metal. For example, the electron transport region ETR may include KI:Yb, RbI:Yb, LiF:Yb, etc. as a co-deposition material. For the electron transport region ETR, a metal oxide such as $Li_2O$ and BaO, or 8-hydroxyl-lithium quinolate (Liq), etc. may be used, but an embodiment limited thereto. The electron transport region ETR may also be formed of a mixture material of an electron transport material and an insulating organo-metal salt. The organo-metal salt may be a material having an energy band gap of about 4 eV or greater. For example, the organo-metal salt may include, for example, metal acetates, metal benzoates, metal acetoacetates, metal acetylacetonates, or metal stearates.

The electron transport region ETR may further include, for example, at least one of 2,9-dimethyl-4,7-diphenyl-1,10- phenanthroline (BCP), diphenyl(4-(triphenylsilyl)phenyl) phosphine oxide (TSPO1), and 4,7-diphenyl-1,10-phenanthroline (Bphen) in addition to the materials described above, but an embodiment is not limited thereto.

In an embodiment, the electron transport region ETR may further include a hole blocking layer (not shown) disposed between the electron transport layer ETL and the emission layer EML. The electron transport region ETR may include the compounds of the electron transport region described above in at least one among the electron injection layer EIL, the electron transport layer ETL, and the hole blocking layer (not shown).

In case that the electron transport region ETR may include the electron transport layer ETL, the electron transport layer ETL may have a thickness in a range of about 100 Å to about 1000 Å, for example, in a range of about 150 Å to about 500 Å. In case that the thickness of the electron transport layer ETL satisfies the above-described ranges, satisfactory electron transport properties may be obtained without a substantial increase in driving voltage. In case that the electron transport region ETR may include the electron injection layer EIL, the electron injection layer EIL may have a thickness in a range of about 1 Å to about 300 Å. In case that the thickness of the electron injection layer EIL satisfies the above-described ranges, satisfactory electron injection properties may be obtained without a substantial increase in driving voltage.

The emission layer EML is provided on the hole transport region HTR. The emission layer EML may have, for example, a thickness in a range of about 100 Å to about 1000 Å or in a range of about 100 Å to about 300 Å. The emission layer EML may have a single layer formed of a single material, a single layer formed of different materials, or a multilayer structure having layers formed of different materials.

In the light emitting element ED of an embodiment, the emission layer EML may include an anthracene derivative, a pyrene derivative, a fluoranthene derivative, a chrysene derivative, a dihydrobenzanthracene derivative, or a triphenylene derivative. By way of example, the emission layer EML may include an anthracene derivative or a pyrene derivative.

In the light emitting element ED of the embodiment shown in FIGS. 3 to 6, the emission layer EML may include a host and a dopant, and the emission layer EML may include a compound represented by Formula E-1 below. The compound represented by Formula E-1 below may be used as a fluorescent host material.

[Formula E-1]

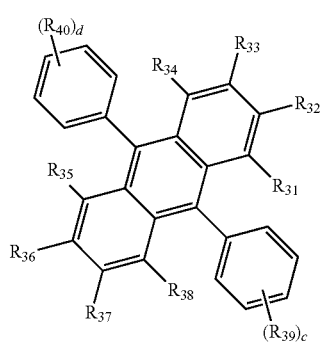

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring. $R_{31}$ to $R_{40}$ may be linked to an adjacent group to form a saturated hydrocarbon ring, an unsaturated hydrocarbon ring, a saturated heterocycle, or an unsaturated heterocycle.

In Formula E-1, c and d may each independently be an integer of 0 to 5.

Formula E-1 may be represented by any one among compounds E1 to E19 below.

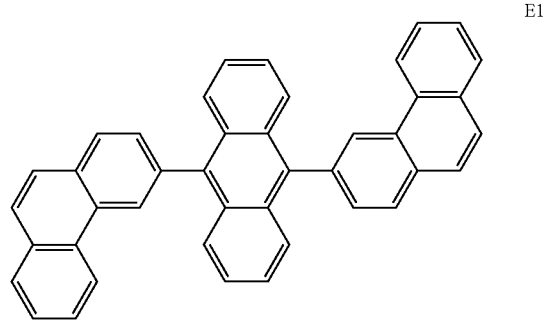

E1

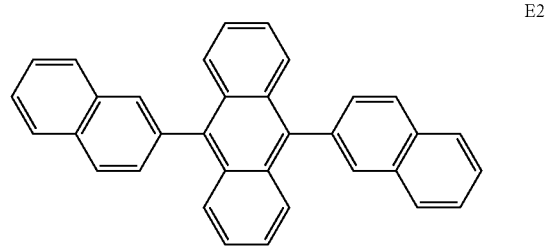

E2

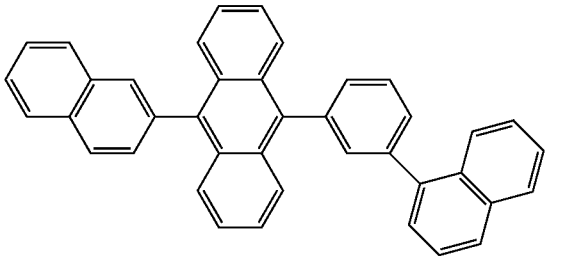

E3

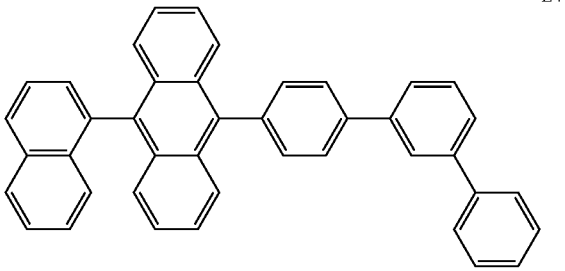

E4

E5
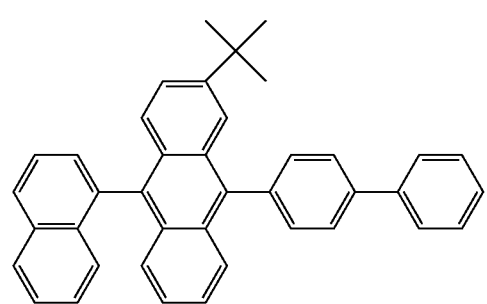
E6
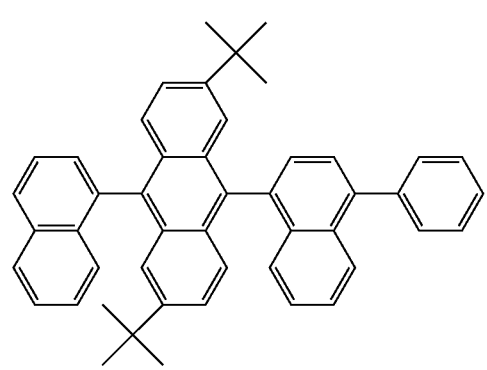
E7
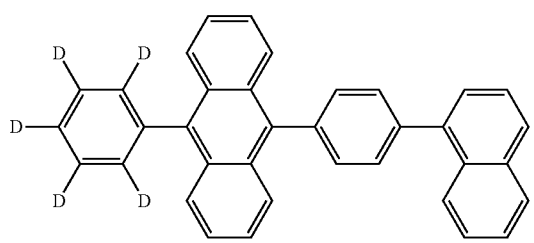
E8
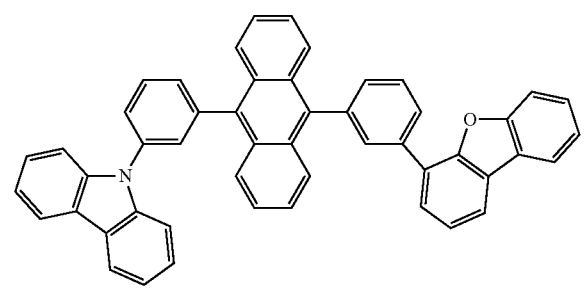
E9
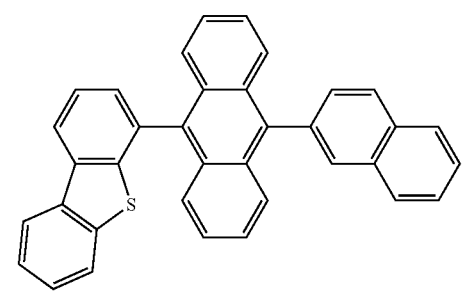
E10
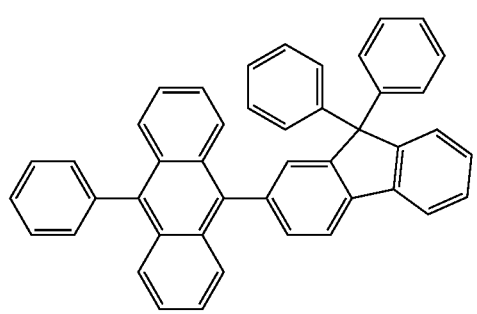
E11
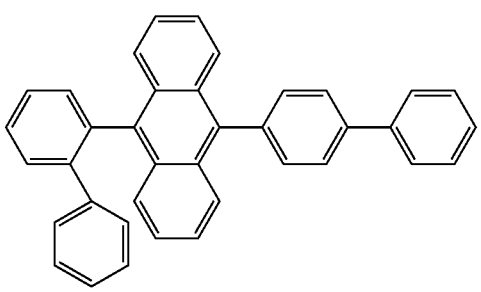
E12
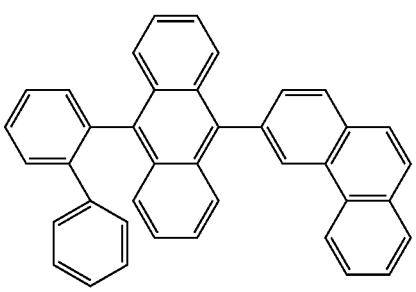
E13
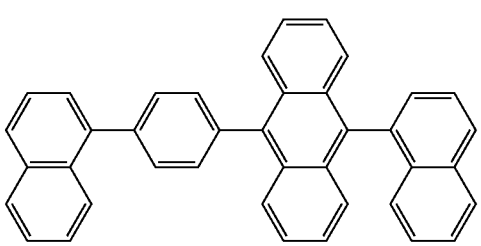
E14
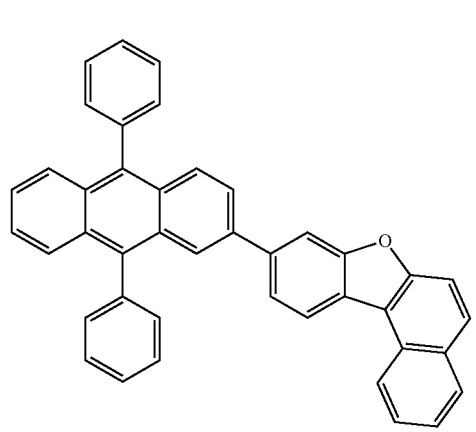

E15
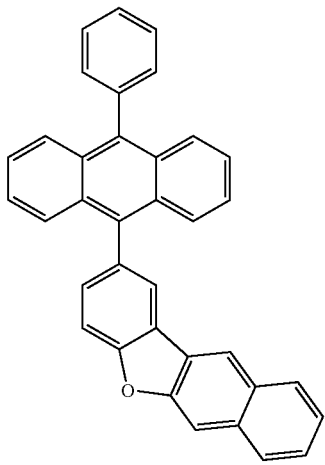

E16
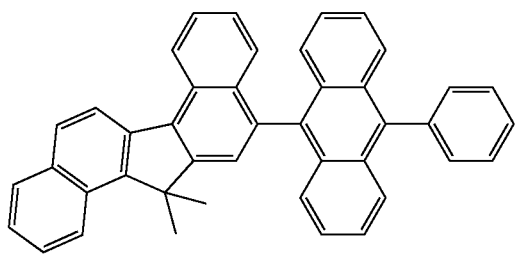

E17
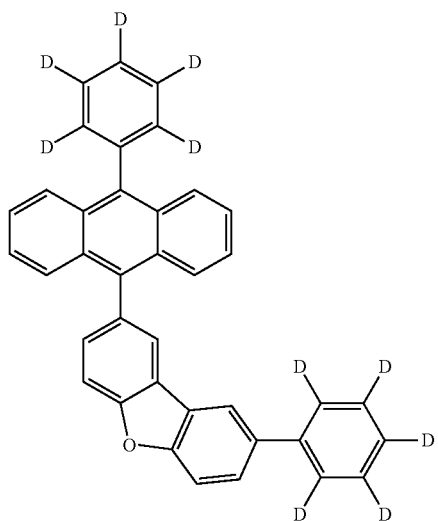

E18
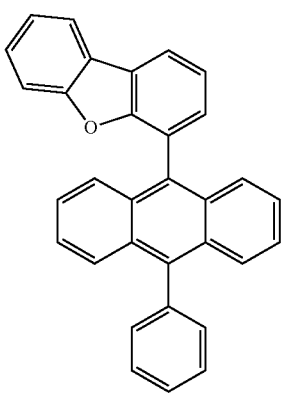

E19
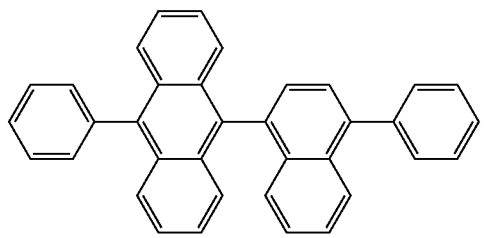

In an embodiment, the emission layer EML may include a first compound represented by Formula 1, and at least one of a second compound represented by Formula HT-1 below, a third compound represented by Formula ET-1 below, or a fourth compound represented by Formula M-b below.

In an embodiment, the second compound may be used as a hole transporting host material of the emission layer EML.

[Formula HT-1]
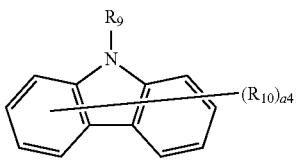

In Formula HT-1, a4 may be an integer of 0 to 8. In case that a4 is an integer of 2 or greater, $R_{10}$'s may all be the same or at least one may be different from the others. $R_9$ and $R_{10}$ may each independently be a hydrogen atom, a deuterium atom, a substituted or unsubstituted aryl group having 6 to 60 ring-forming carbon atoms, or a substituted or unsubstituted heteroaryl group having 2 to 60 ring-forming carbon atoms. For example, $R_9$ may be a substituted phenyl group, an unsubstituted dibenzofuran group, or a substituted fluorenyl group. $R_{10}$ may be a substituted or unsubstituted carbazole group.

The second compound may be represented by any one among compounds of Compound Group 2 below. In Compound Group 2 below, "D" is a deuterium atom.

[Compound Group 2]

HT1
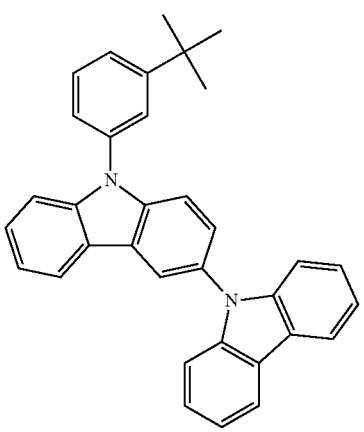

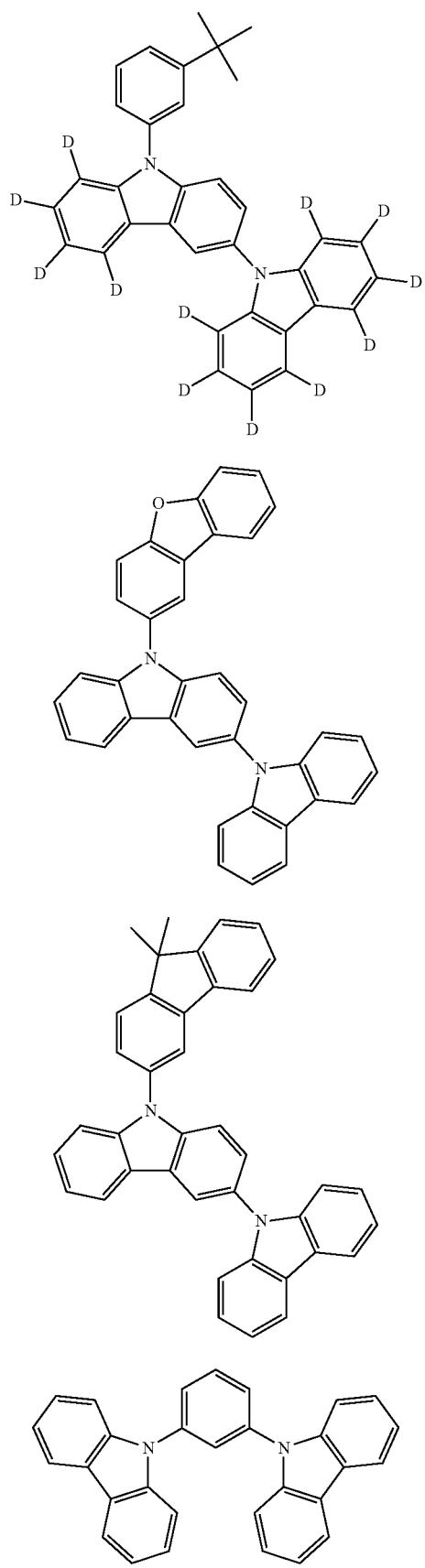
HT2
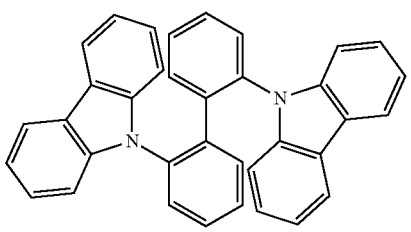
HT6
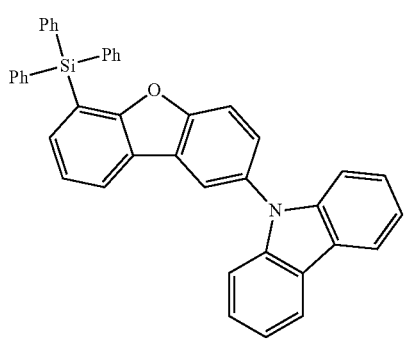
HT7
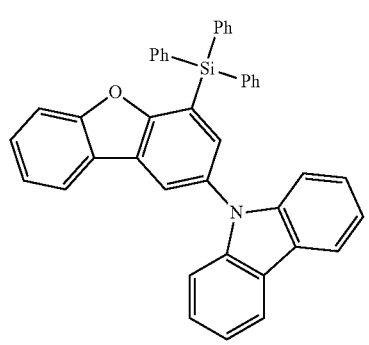
HT8
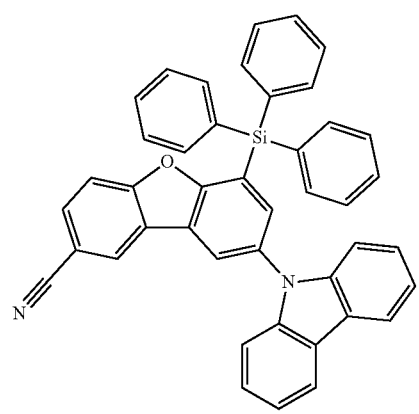
HT13
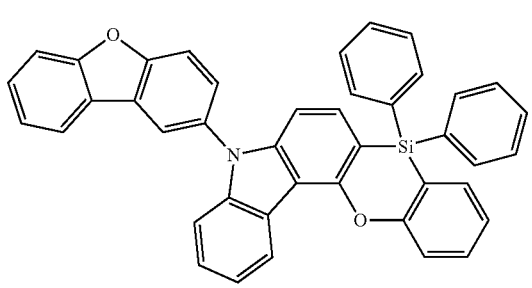
HT14

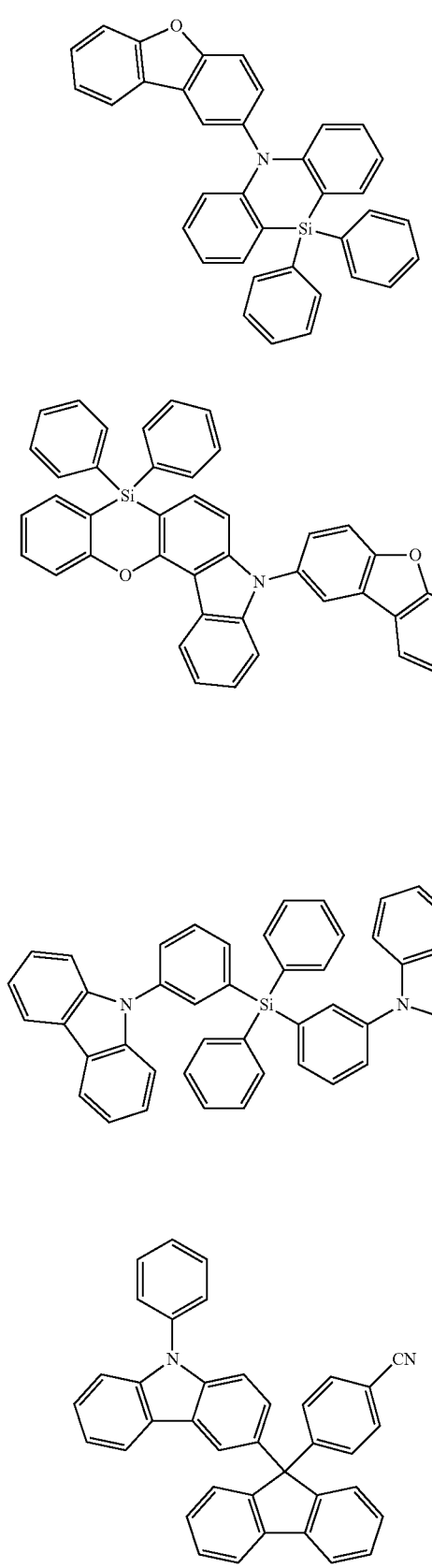
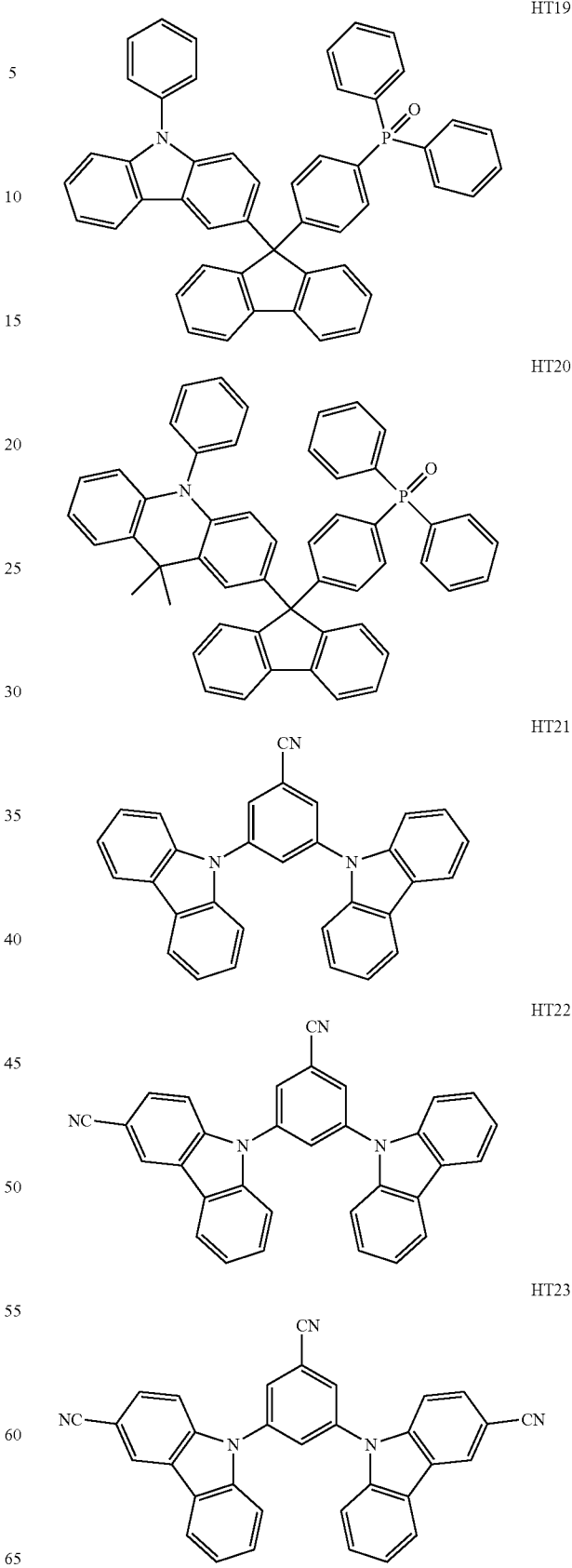

HT24
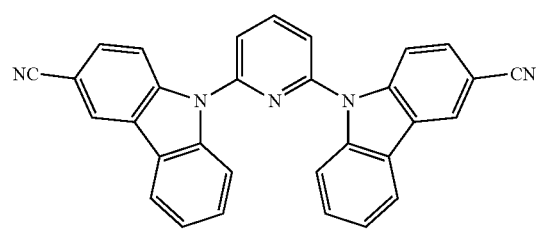
HT25
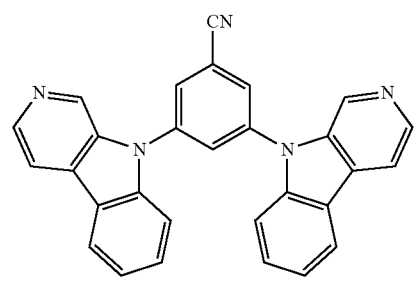
HT26
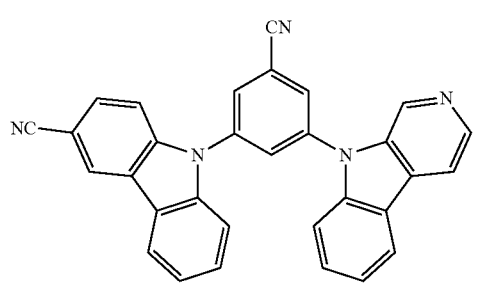
HT27
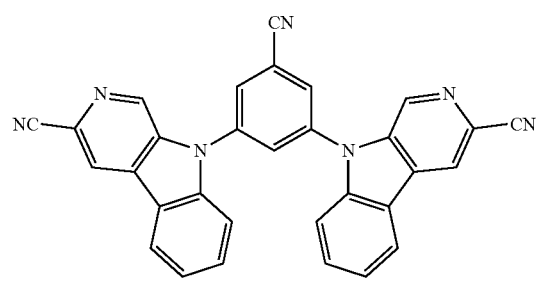
HT28
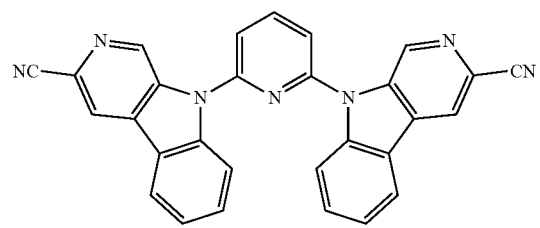
HT29
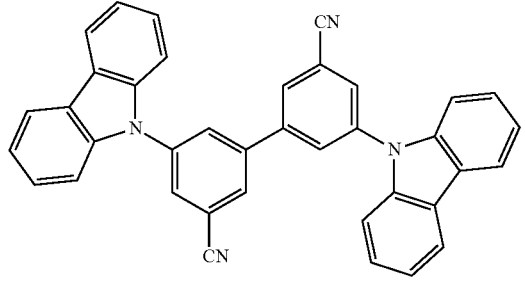
HT30
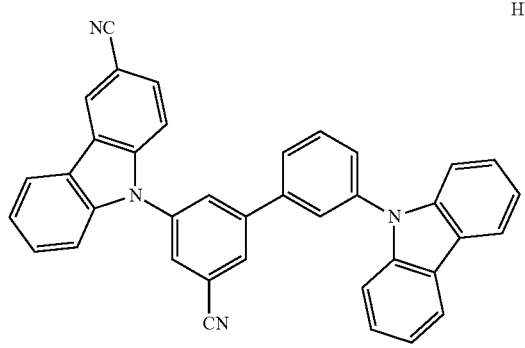
HT31
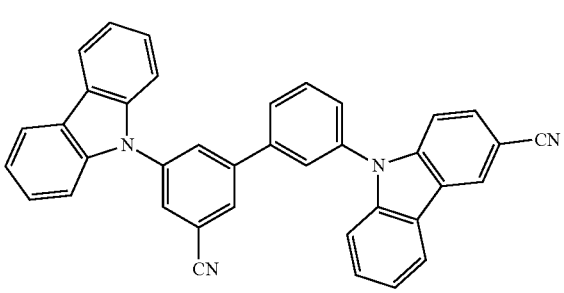
HT32
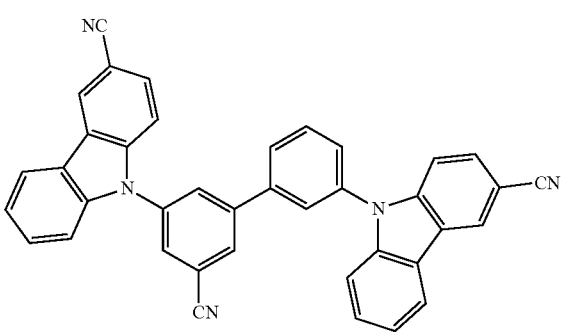
HT33
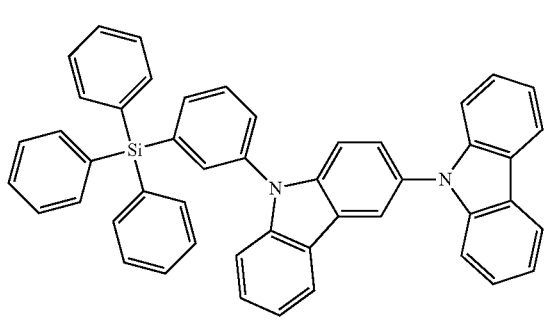

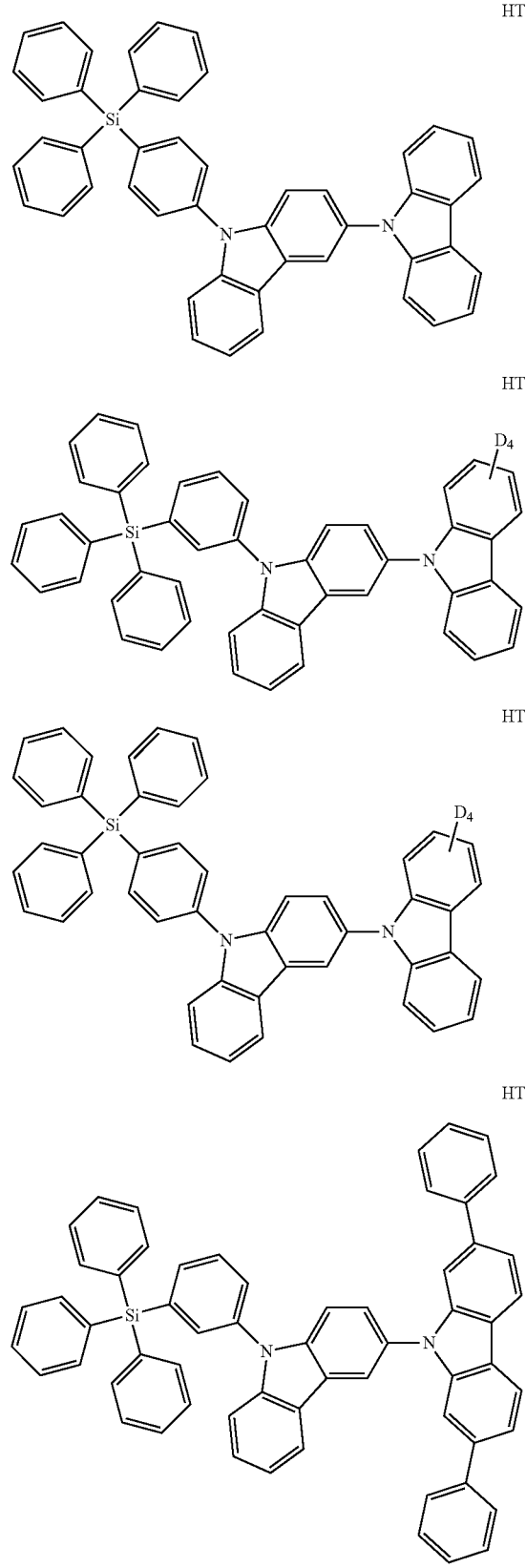
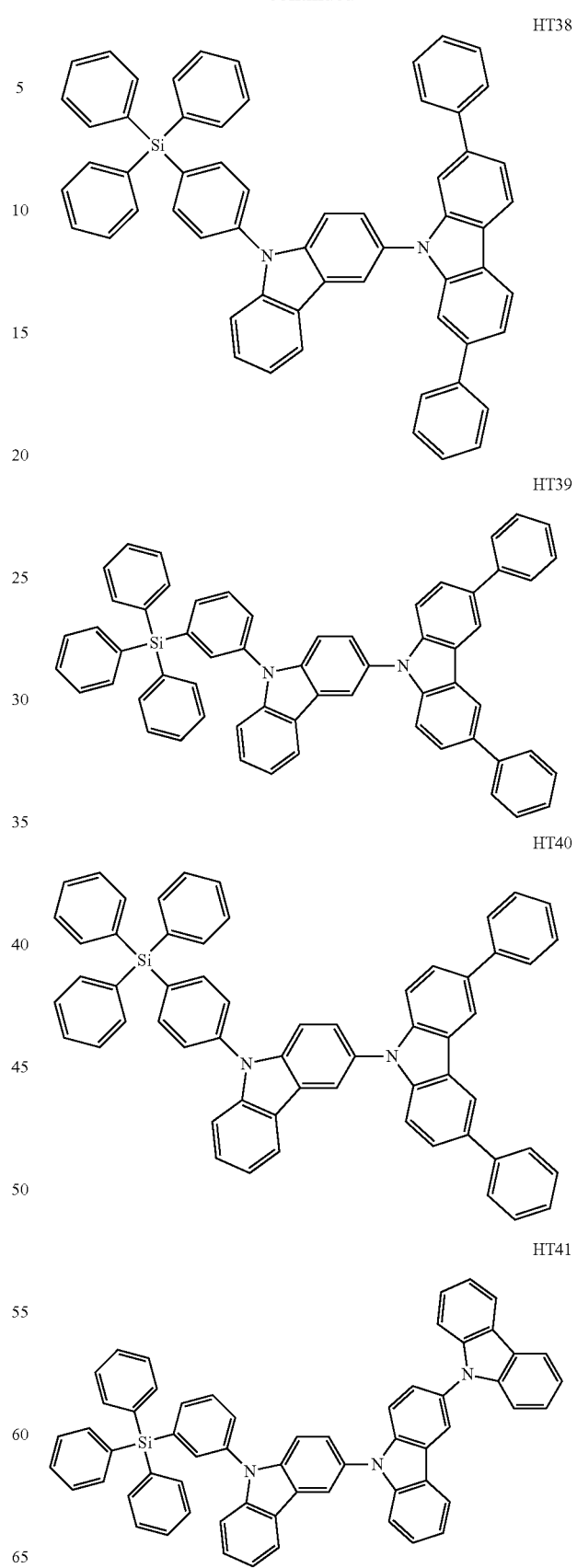

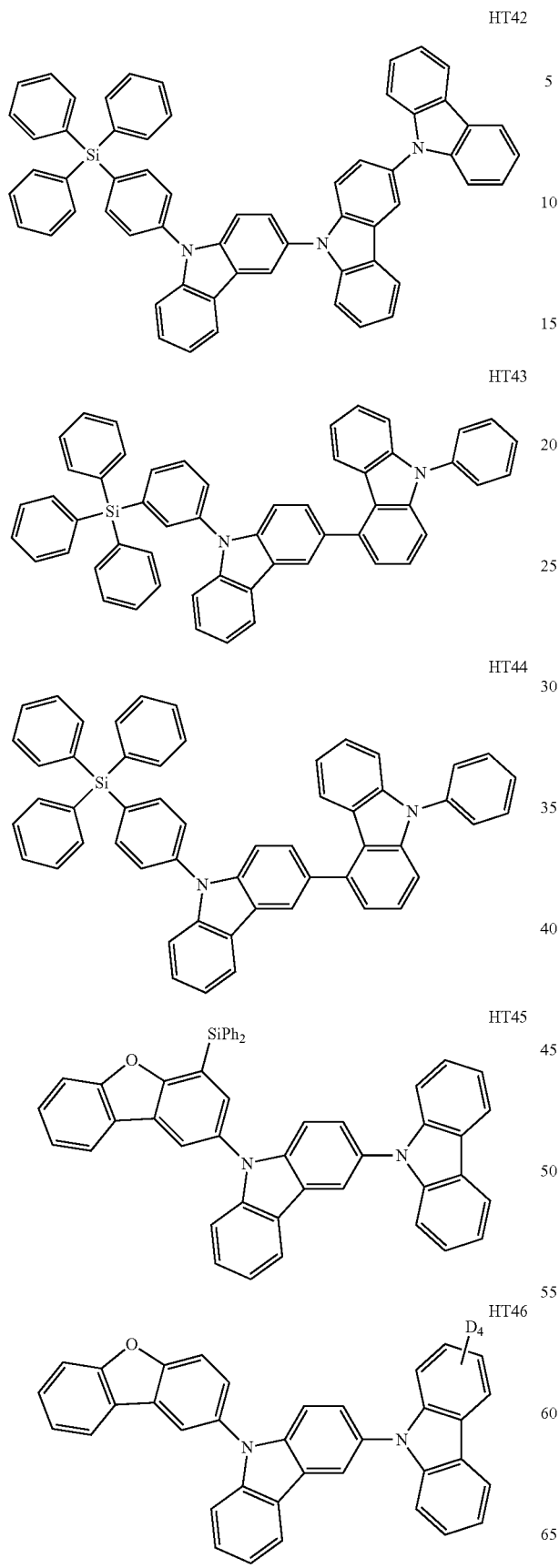
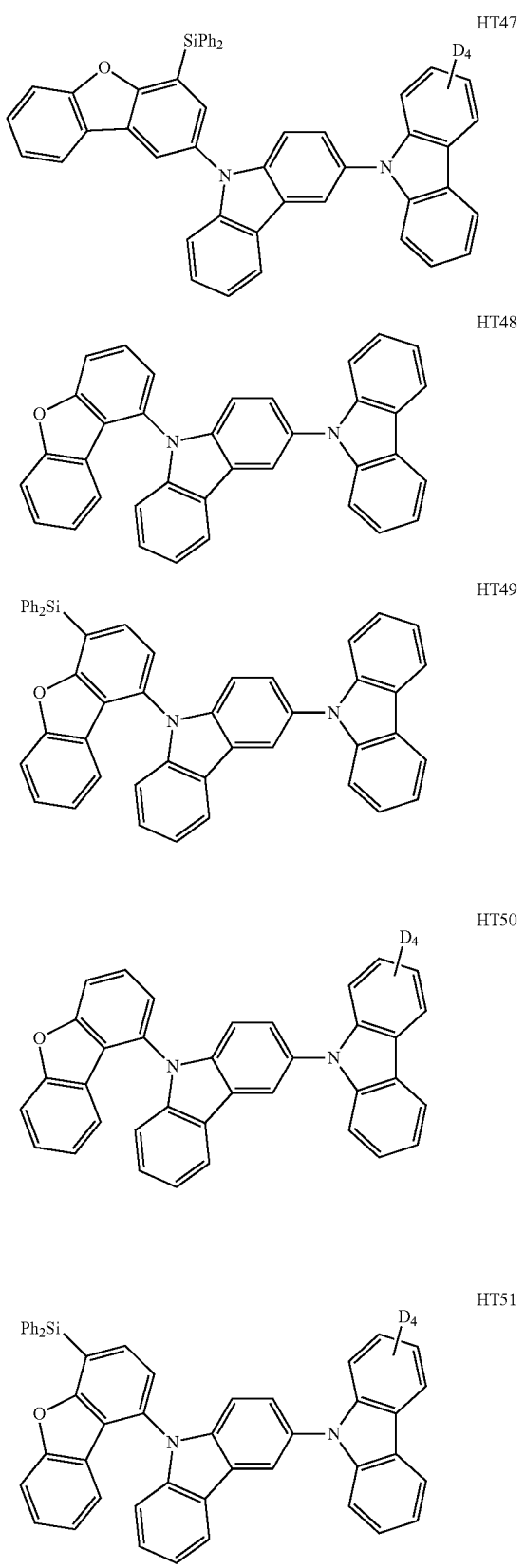

HT52

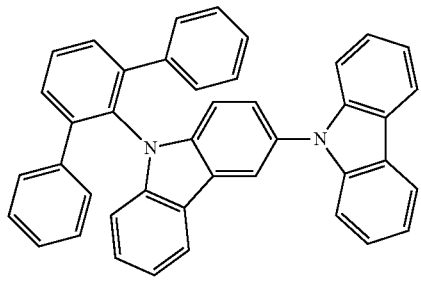

HT53

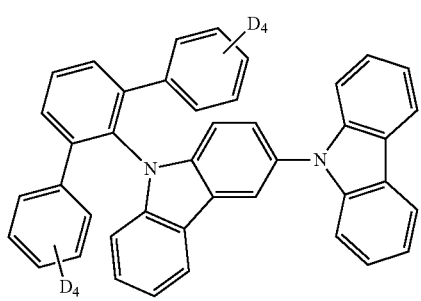

HT54

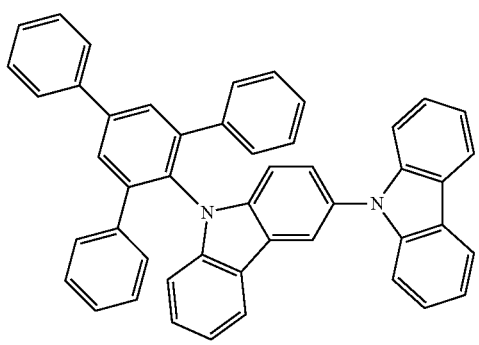

HT55

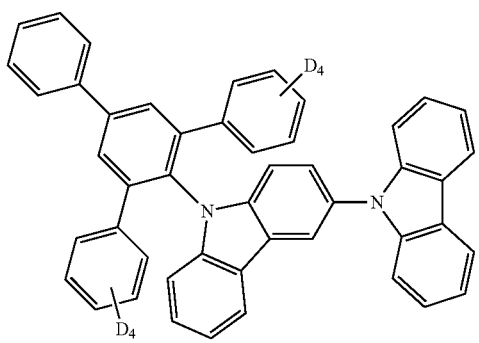

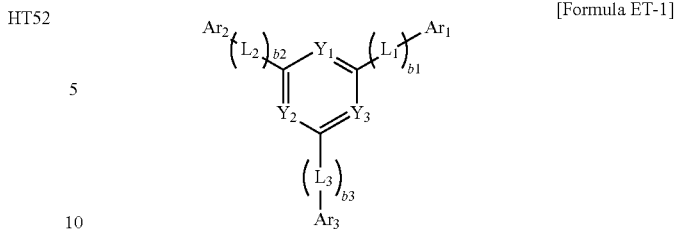

[Formula ET-1]

In Formula ET-1, at least one of $Y_1$ to $Y_3$ may be N, and the rest may be $CR_a$, and $R_a$ may be a hydrogen atom, a deuterium atom, a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms.

b1 to b3 may each independently be an integer of 0 to 10. $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms.

$Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. For example, $Ar_1$ to $Ar_3$ may be a substituted or unsubstituted phenyl group or a substituted or unsubstituted carbazole group.

The third compound may be represented by any one among compounds of Compound Group 3 below. The light emitting element ED of an embodiment may include any one among compounds of Compound Group 3 below. In Compound Group 3 below, "D" is a deuterium atom.

[Compound Group 3]

ETH1

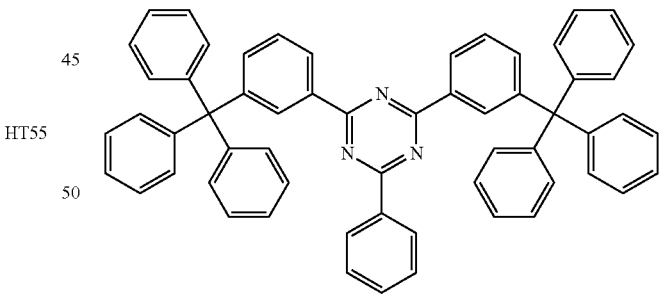

ETH2

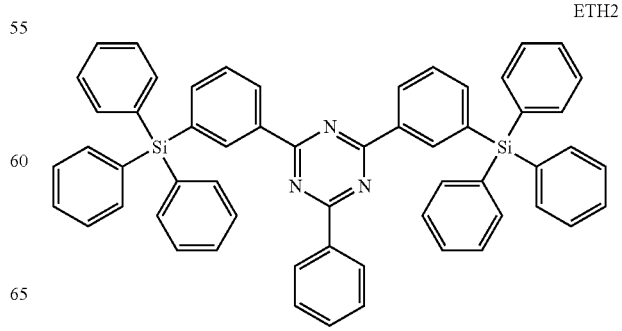

In an embodiment, the emission layer EML may include a third compound represented by Formula ET-1 below. For example, the third compound may be used as an electron transporting host material of the emission layer EML.

ETH3
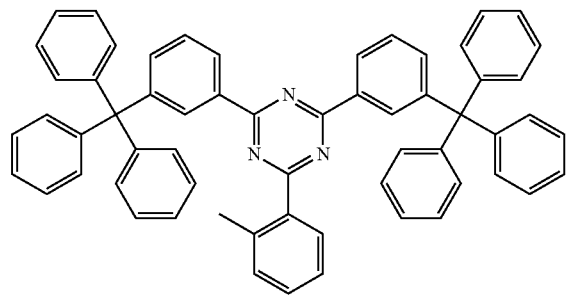
ETH4
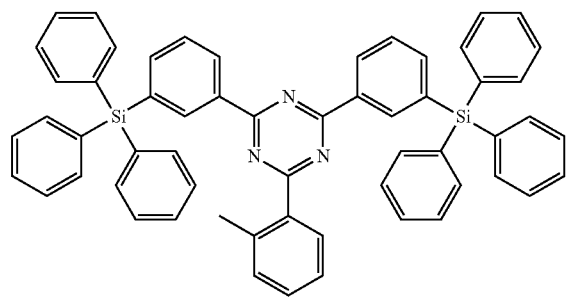
ETH5
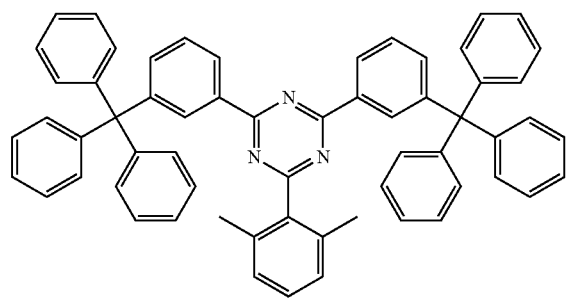
ETH6
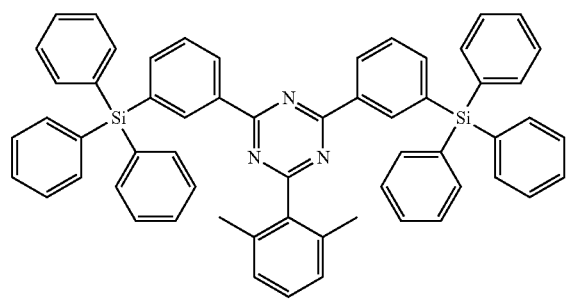
ETH7
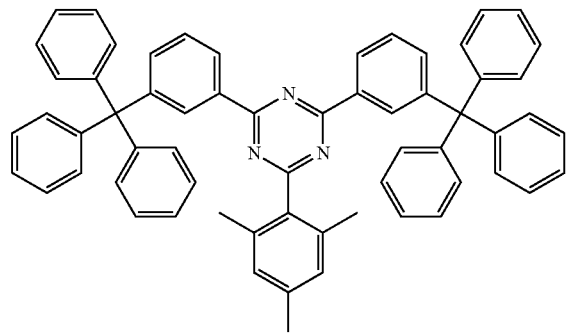
ETH8
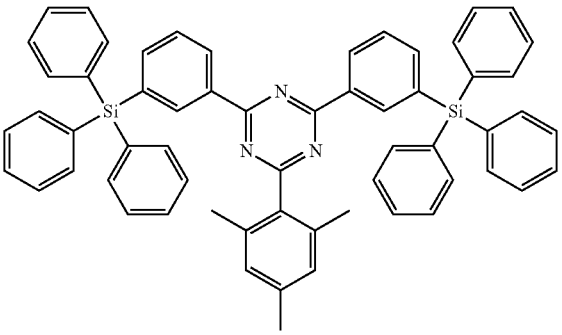
ETH9
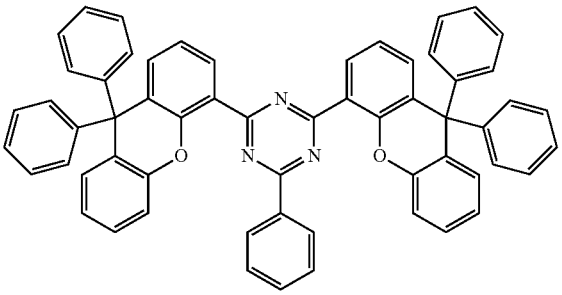
ETH10
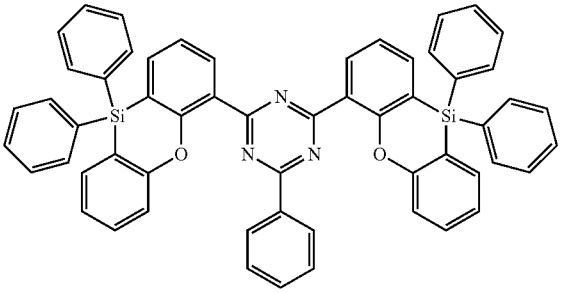
ETH11
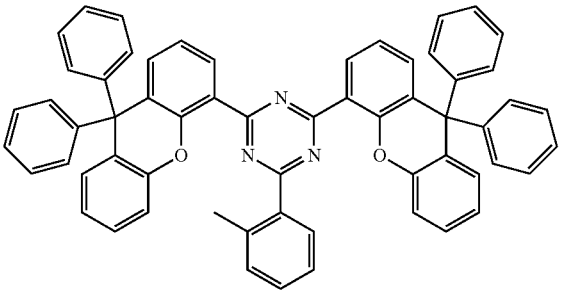
ETH12
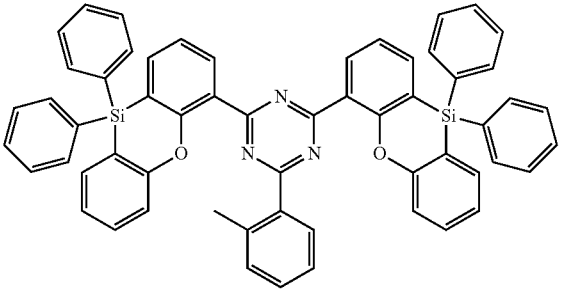

ETH13
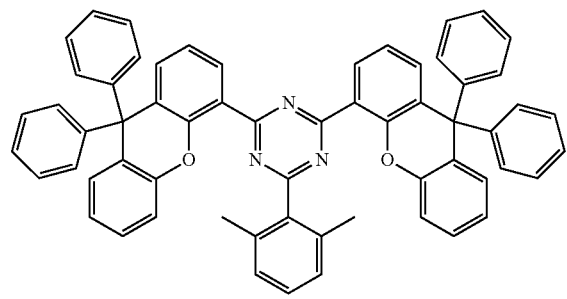
ETH14
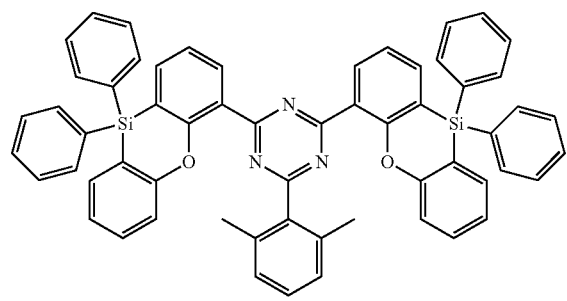
ETH15
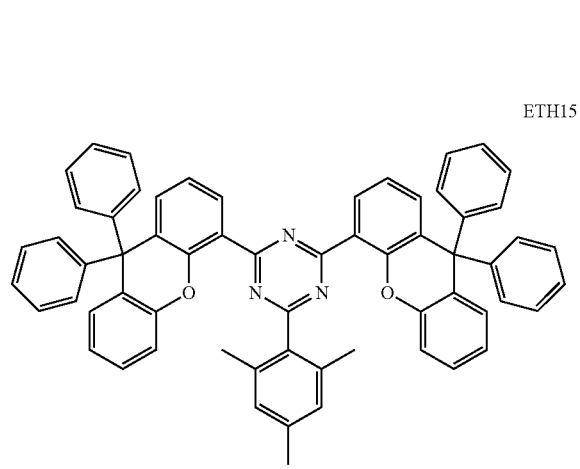
ETH16
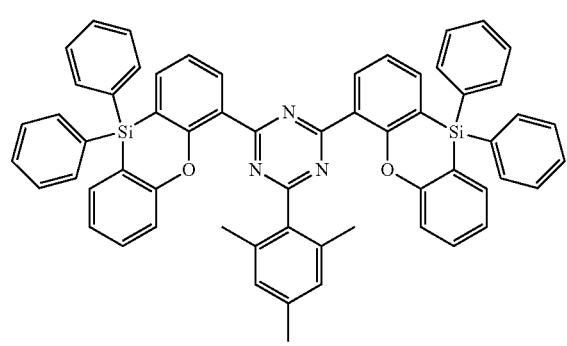
ETH17
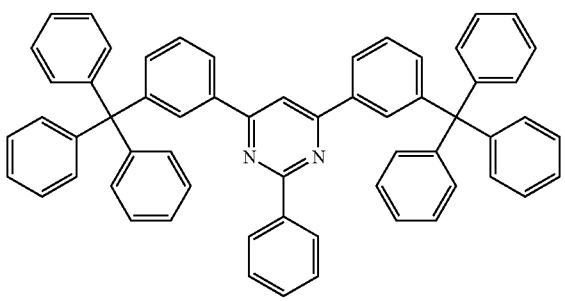
ETH18
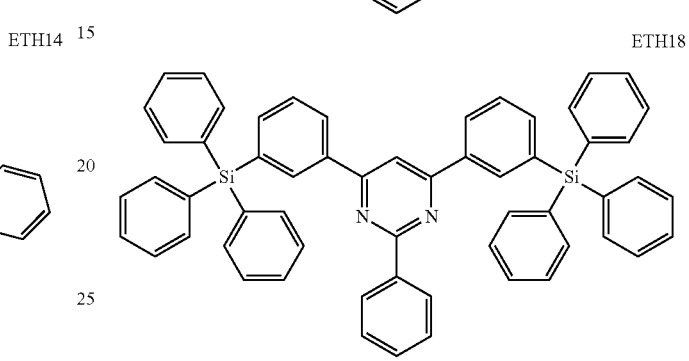
ETH10
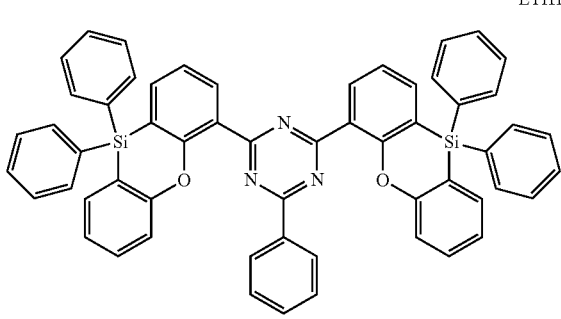
ETH11
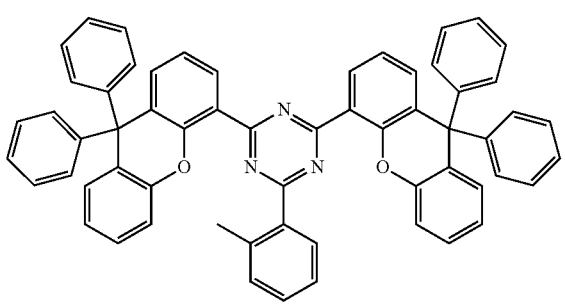
ETH12
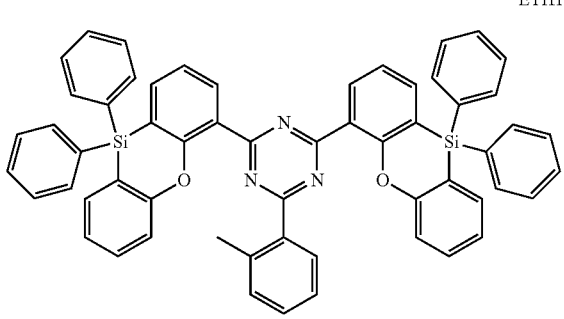

ETH13
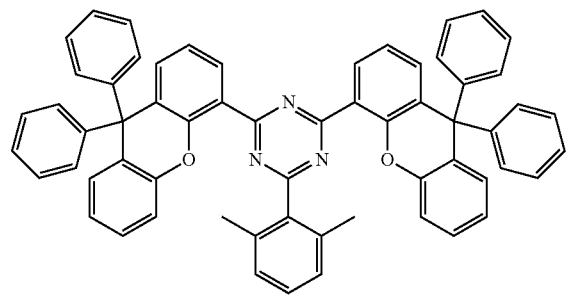
ETH17
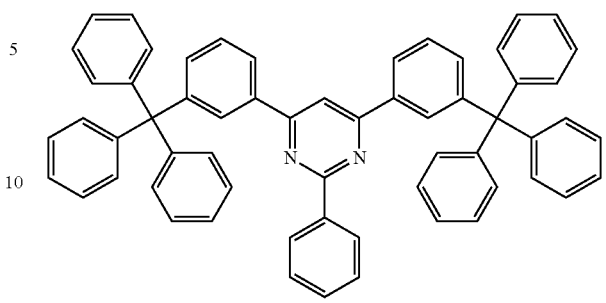
ETH14
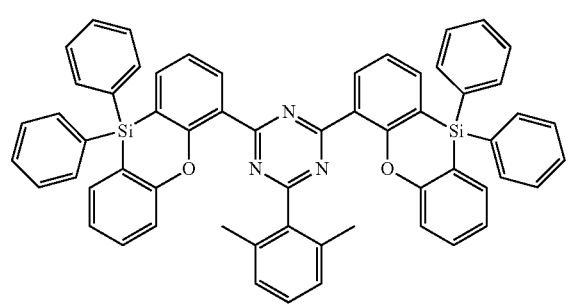
ETH18
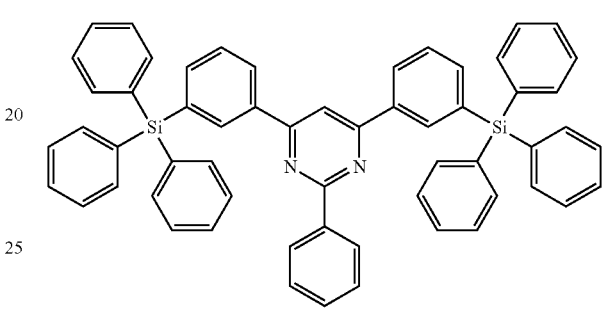
ETH19
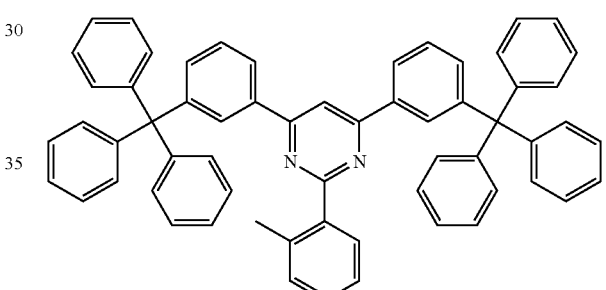
ETH15
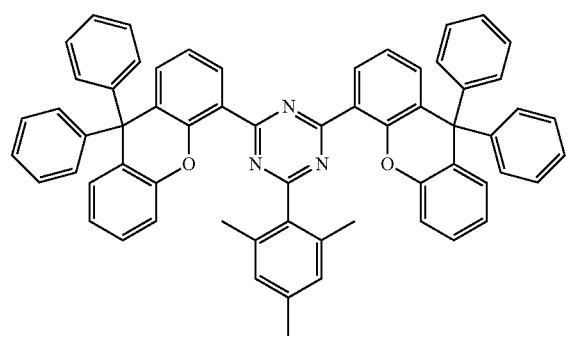
ETH20
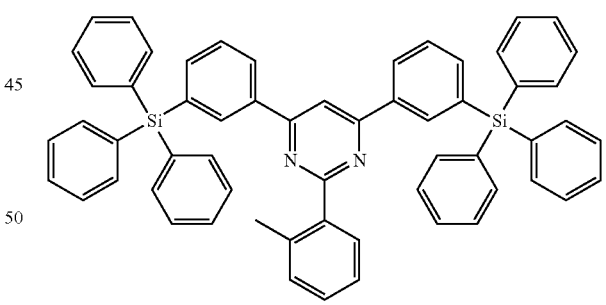
ETH16
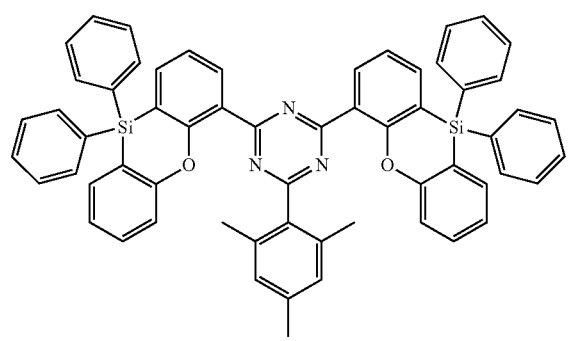
ETH21
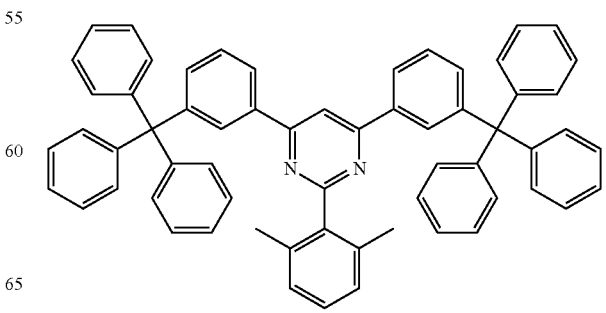

ETH22
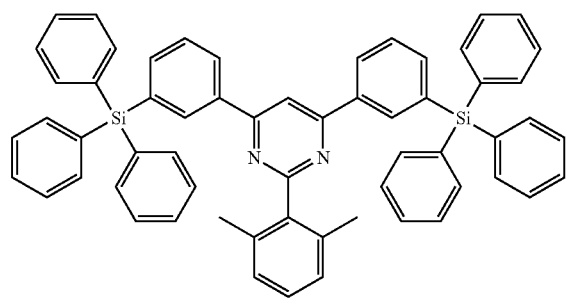
ETH23
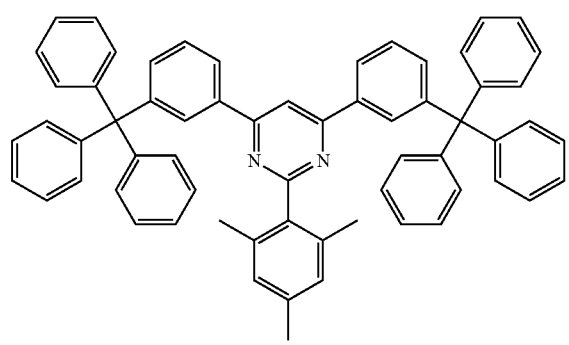
ETH24
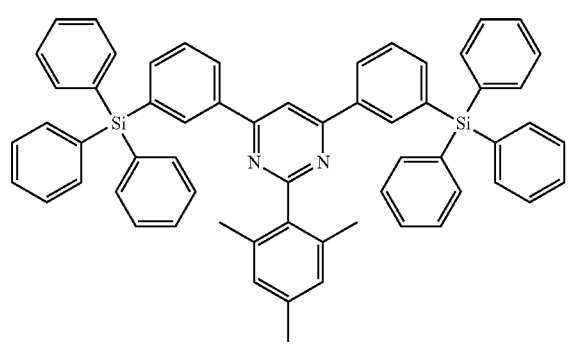
ETH25
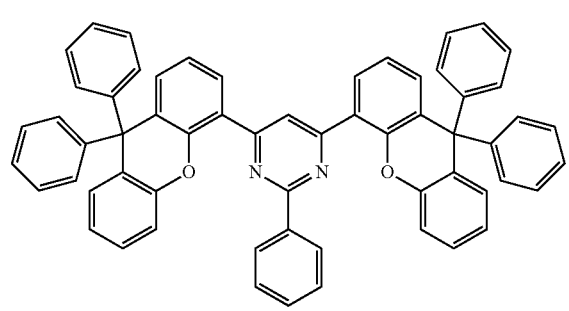
ETH26
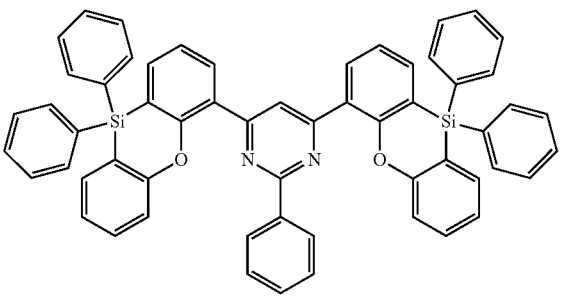
ETH27
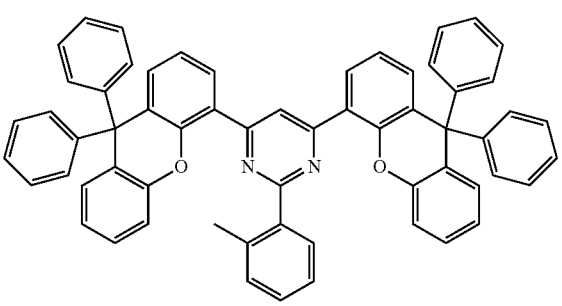
ETH28
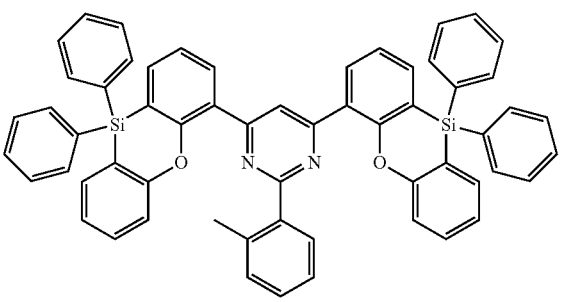
ETH29
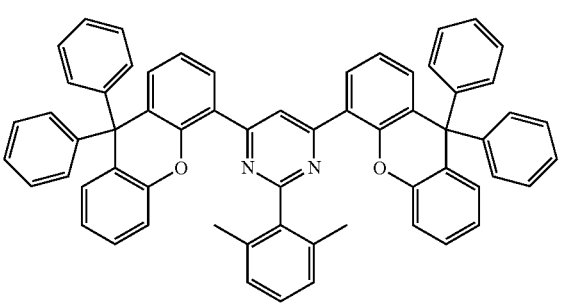
ETH30
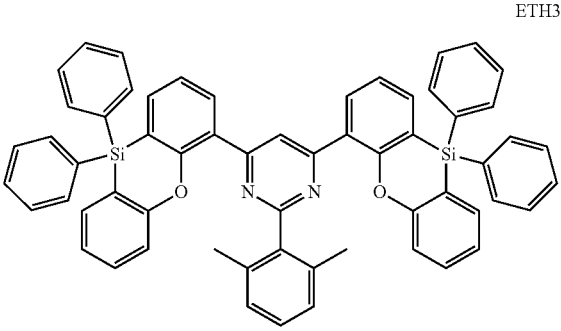

ETH31
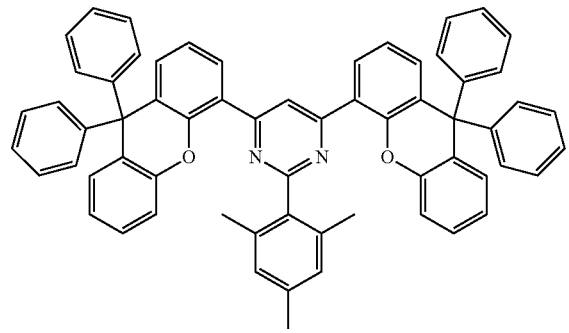
ETH32
ETH33
ETH34
ETH35
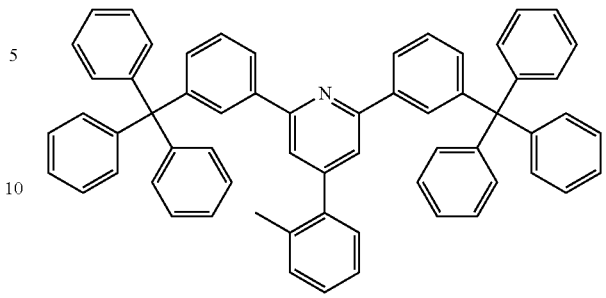
ETH36
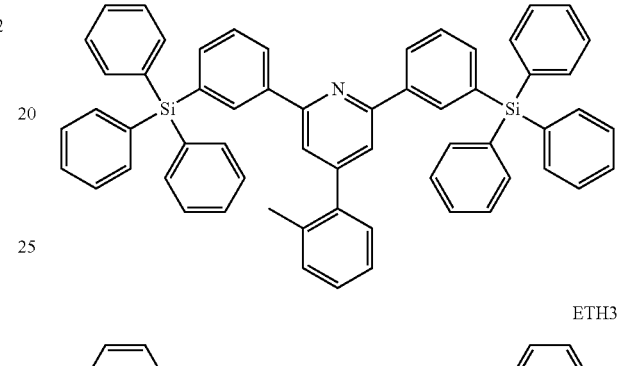
ETH37
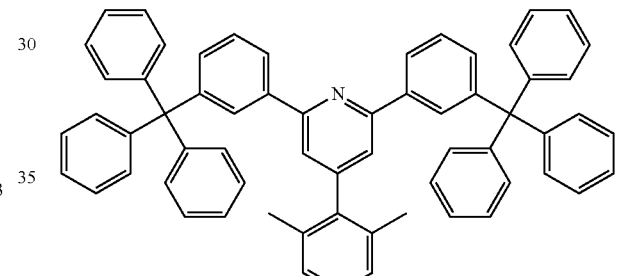
ETH38
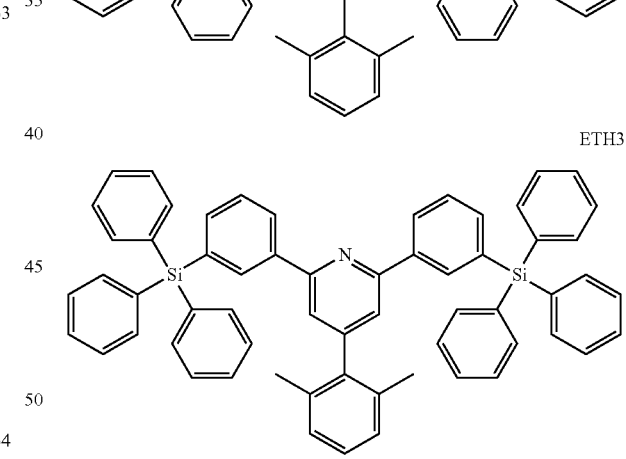
ETH39
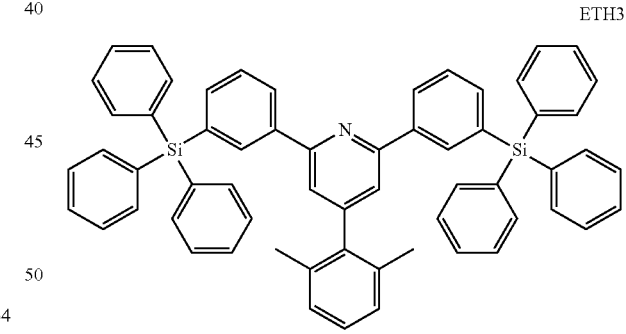

ETH40
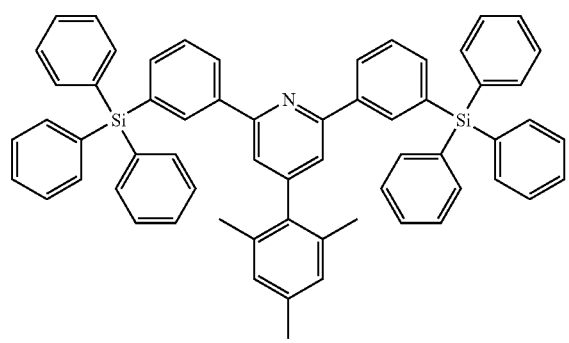
ETH41
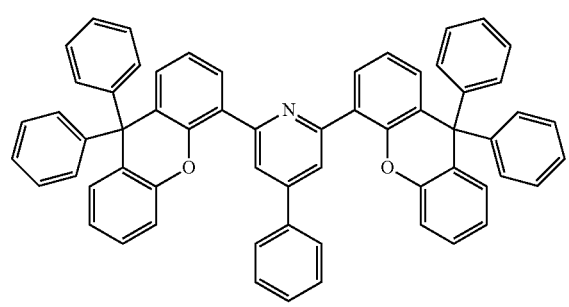
ETH42
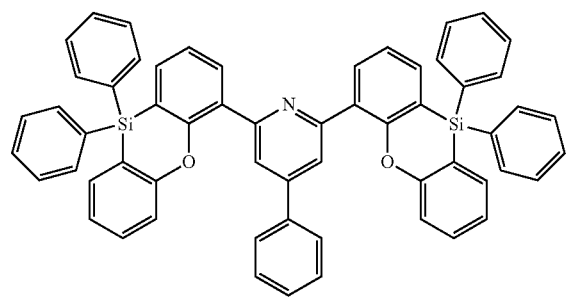
ETH43
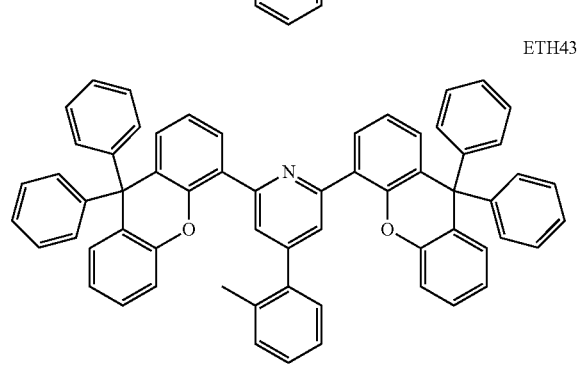
ETH44
ETH45
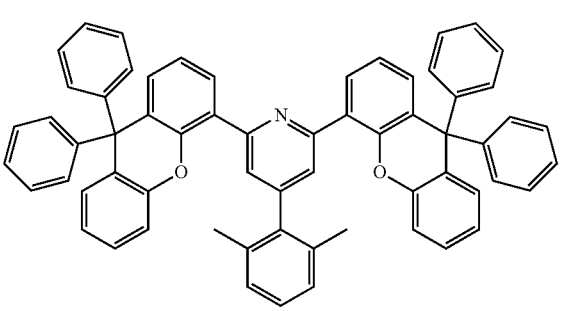
ETH46
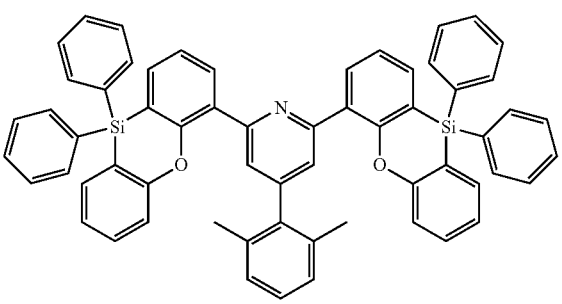
ETH47
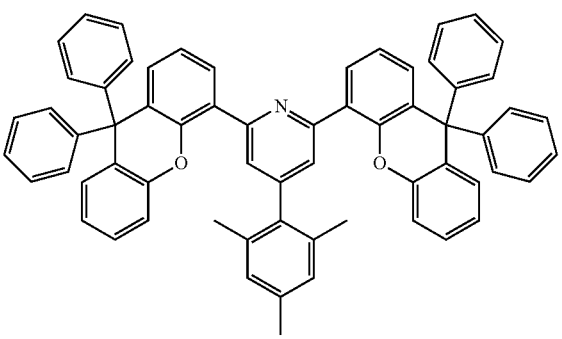
ETH48
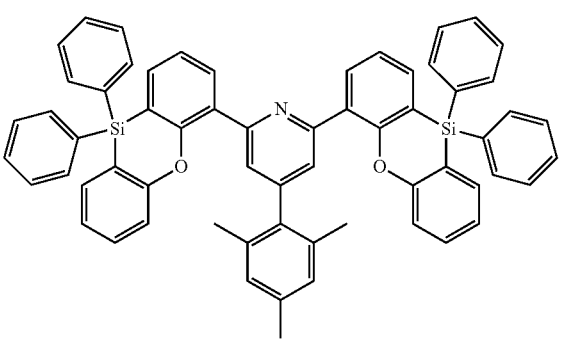

ETH49
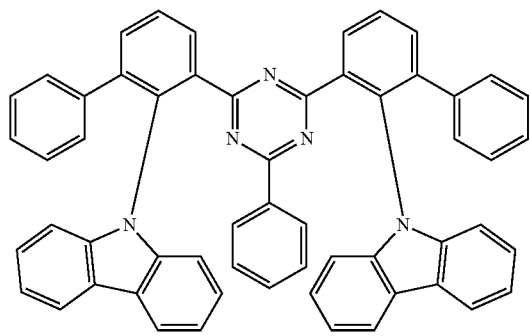
ETH53
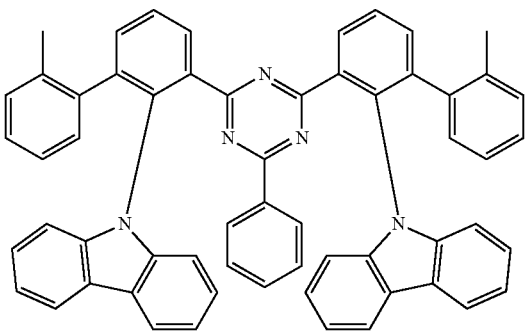
ETH50
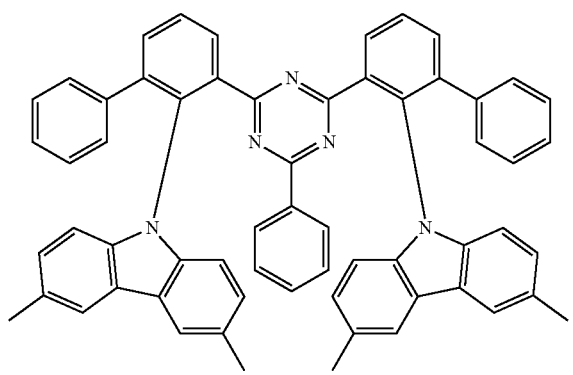
ETH54
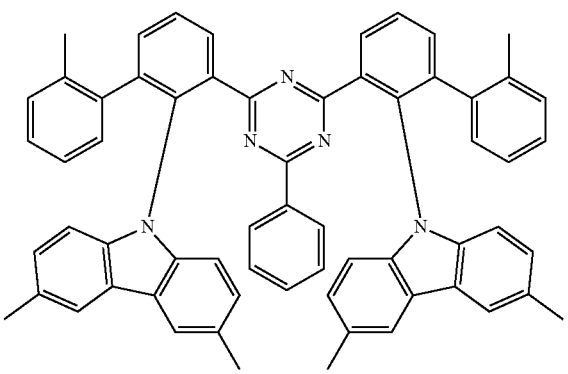
ETH51
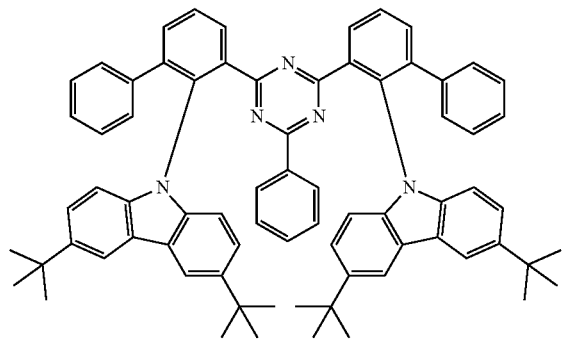
ETH55
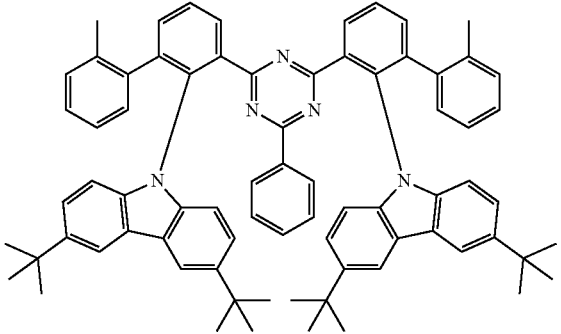
ETH52
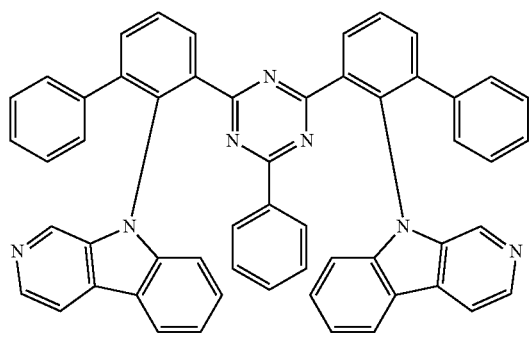
ETH56
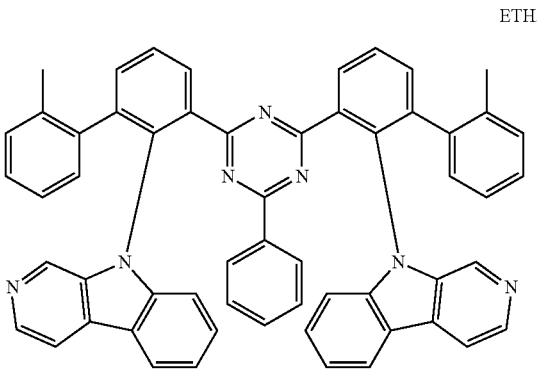

ETH57
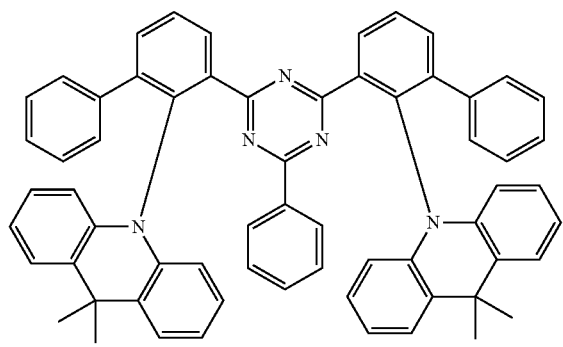
ETH58
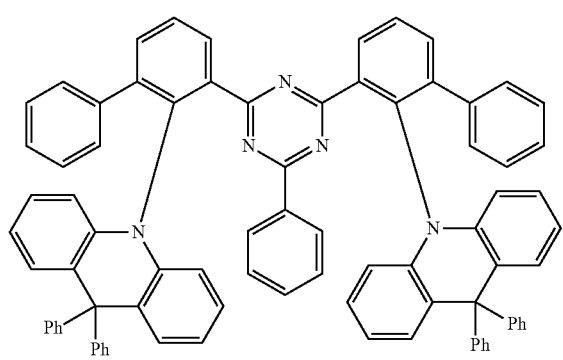
ETH59
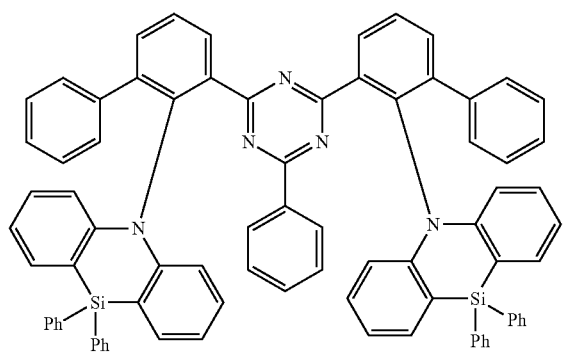
ETH60
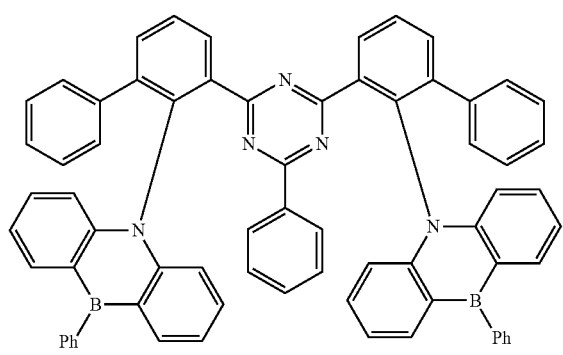
ETH61
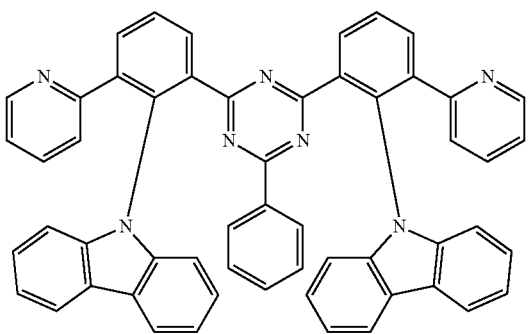
ETH62
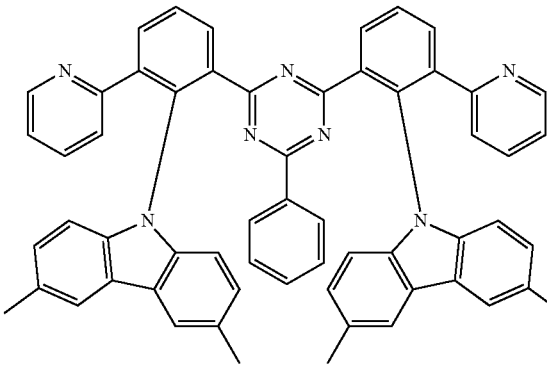
ETH63
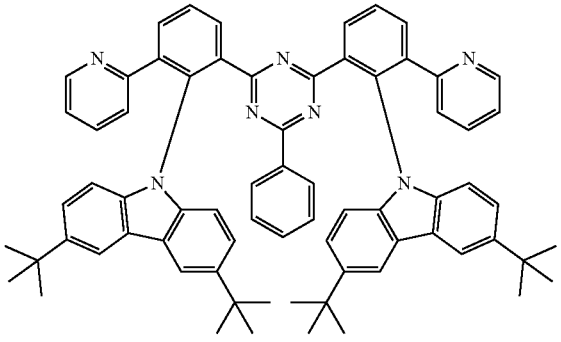
ETH64
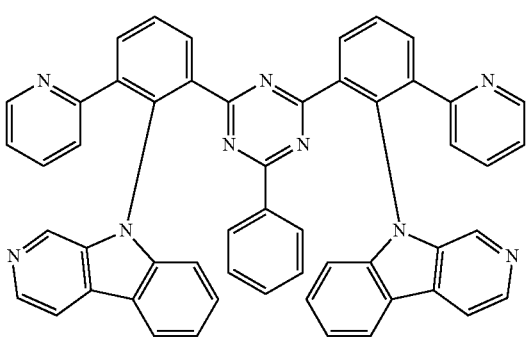

ETH65
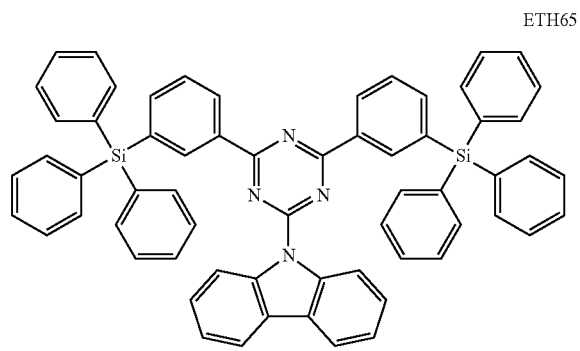
ETH66
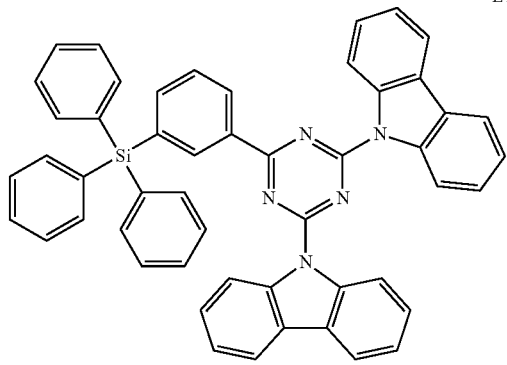
ETH67
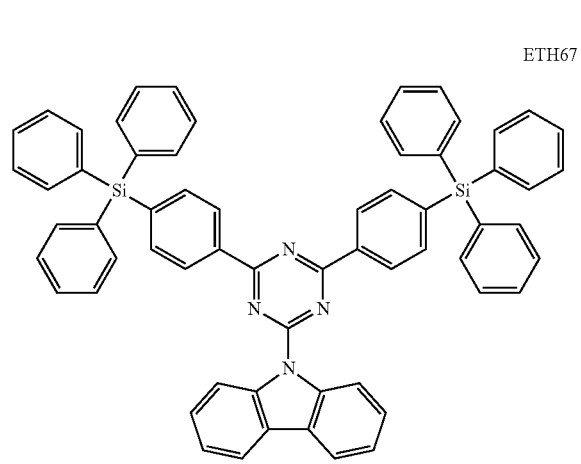
ETH68
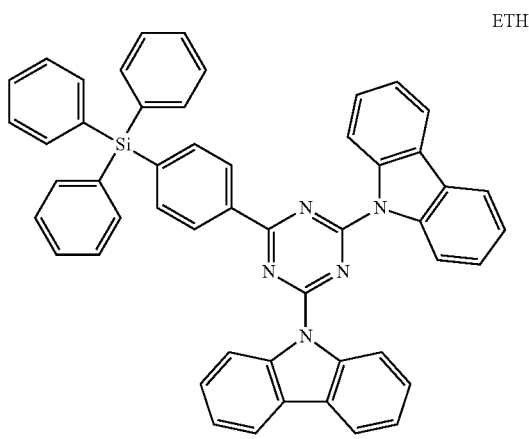
ETH69
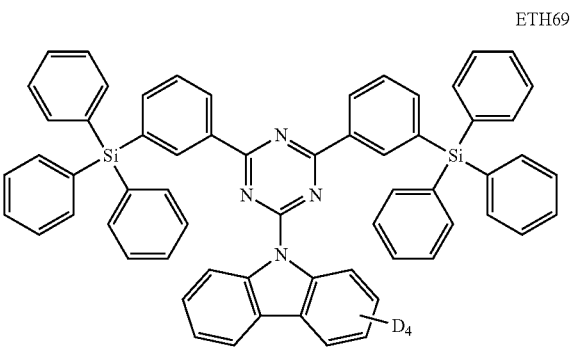
ETH70
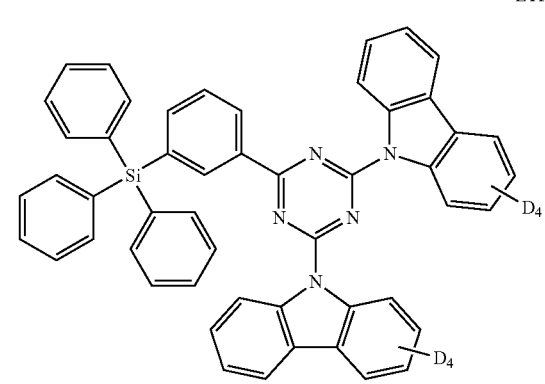
ETH71
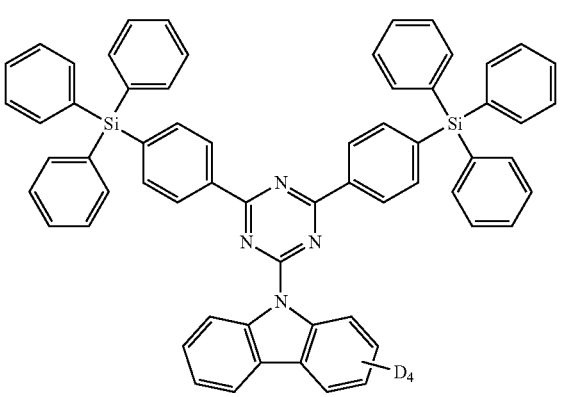
ETH72
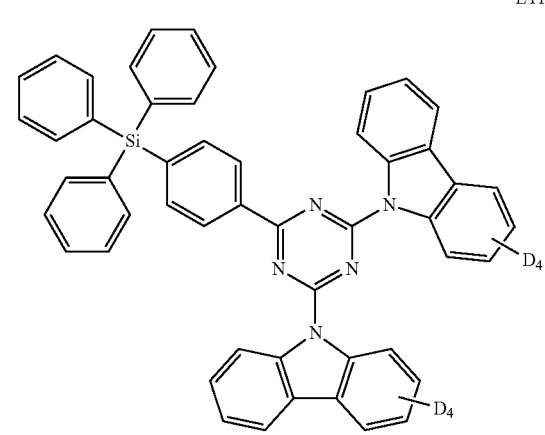

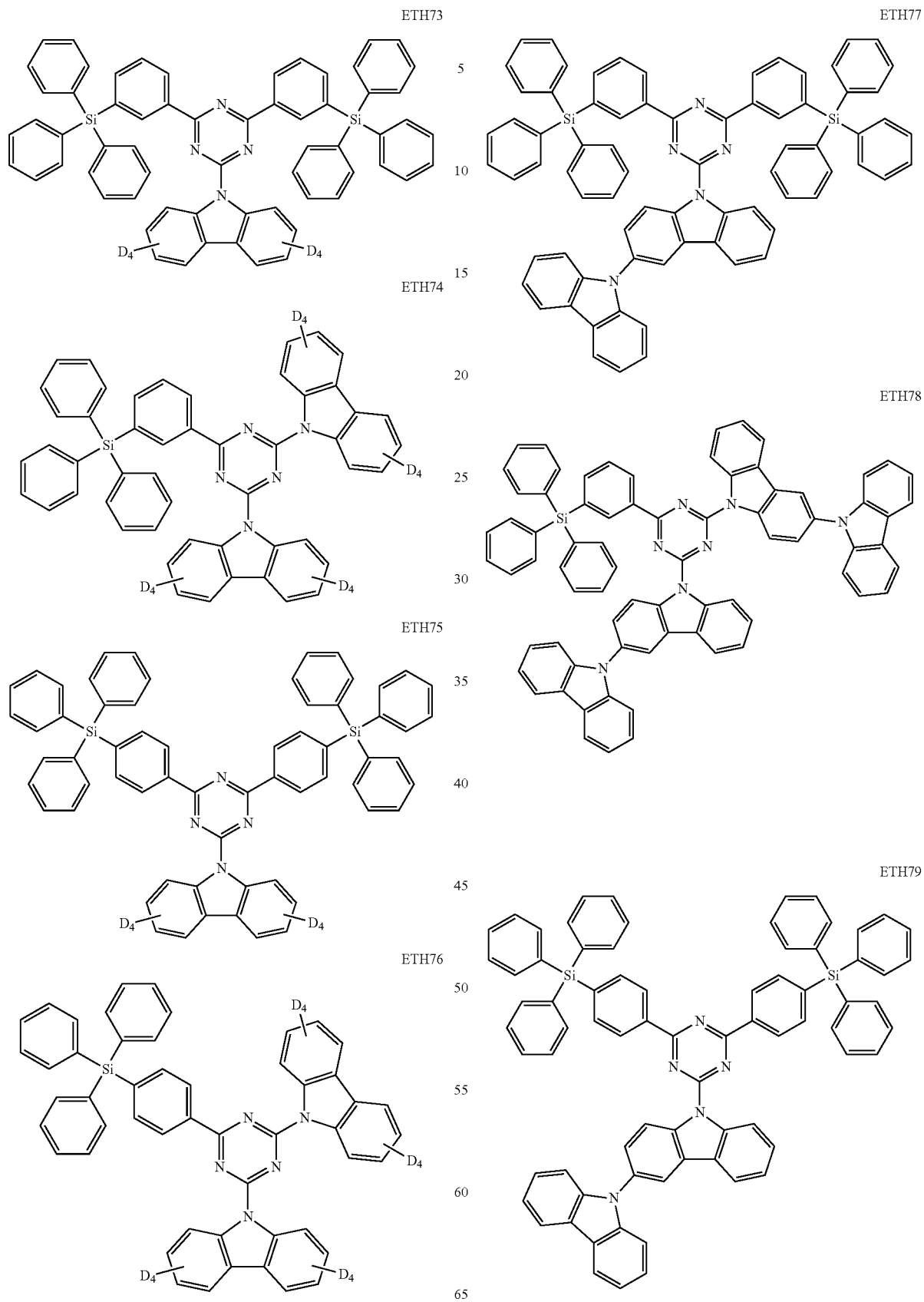

ETH80
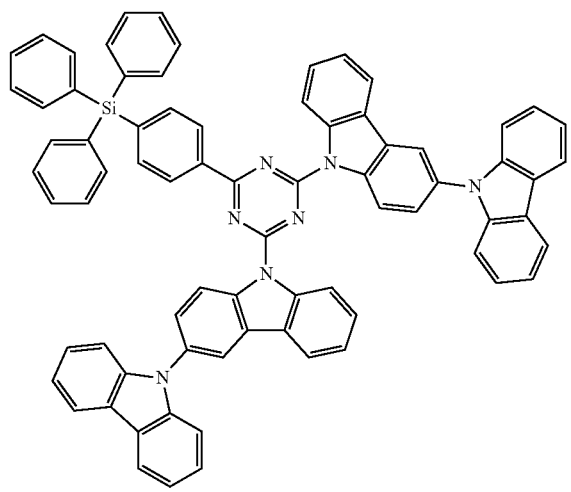
ETH81
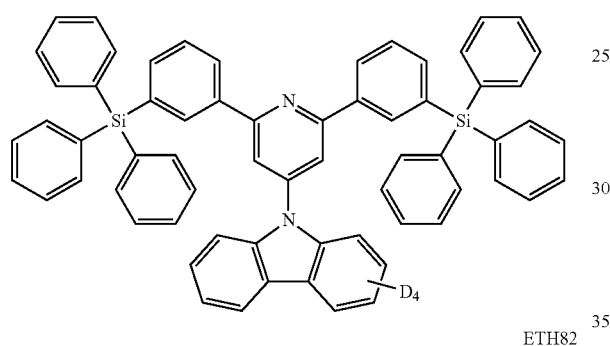
ETH82
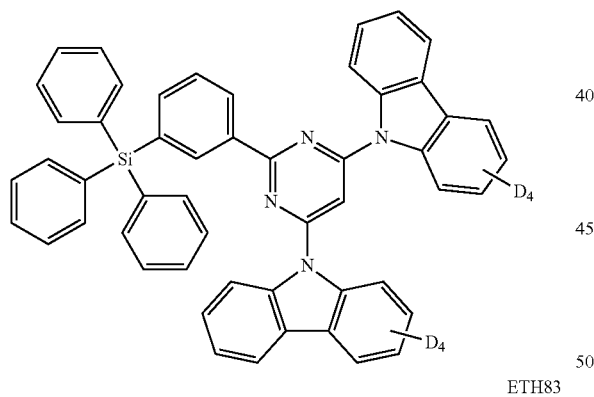
ETH83
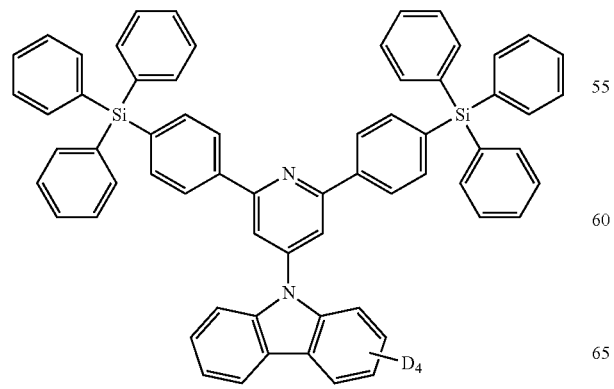
ETH84
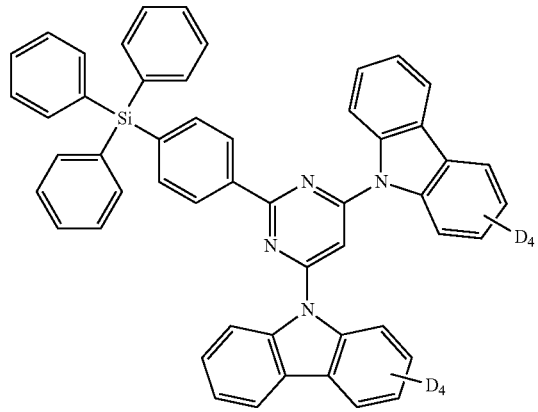
ETH85
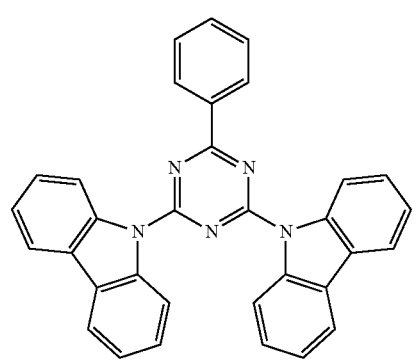
ETH86
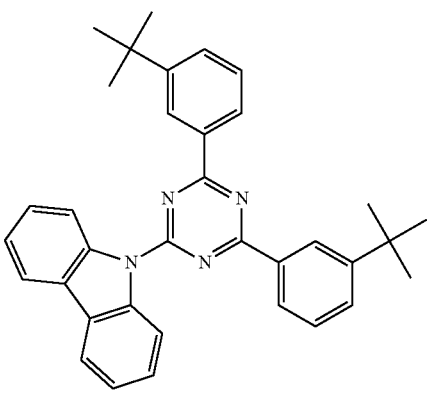
In an embodiment, the emission layer EML may include a compound represented by Formula E-2a or Formula E-2b below. The compound represented by Formula E-2a or Formula E-2b may be used as a phosphorescent host material.

[Formula E-2a]

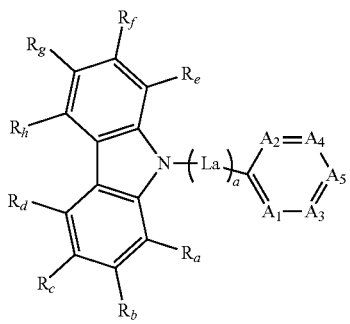

[Compound Group E-2]

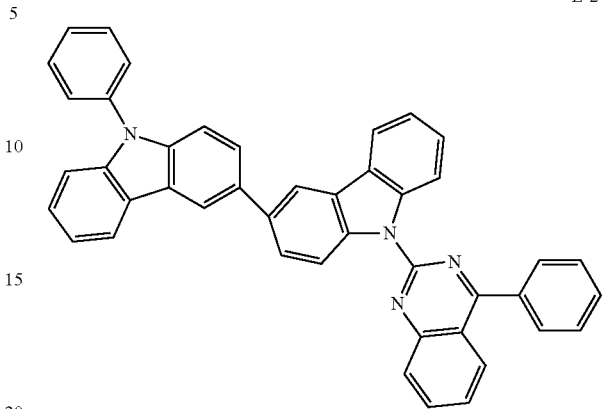

In Formula E-2a, a may be an integer of 0 to 10, and $L_1$ may be a direct linkage, a substituted or unsubstituted arylene group having 6 to 30 ring-forming carbon atoms, or a substituted or unsubstituted heteroarylene group having 2 to 30 ring-forming carbon atoms. In case that a is an integer of 2 or greater, $L_a$'s may each independently be a substituted or unsubstituted arylene group having 6 to 30 ring-forming carbon atoms, or a substituted or unsubstituted heteroarylene group having 2 to 30 ring-forming carbon atoms.

In Formula E-2a, $A_1$ to $A_5$ may be N or $Cr_i$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or linked to an adjacent group to form a ring. $R_a$ to $R_i$ may be linked to an adjacent group to form a hydrocarbon ring or a heterocycle containing N, O, S, etc. as a ring-forming atom.

In Formula E-2a, two or three selected from $A_1$ to $A_5$ may be N, and the rest may be $Cr_i$.

[Formula E-2b]

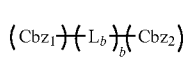

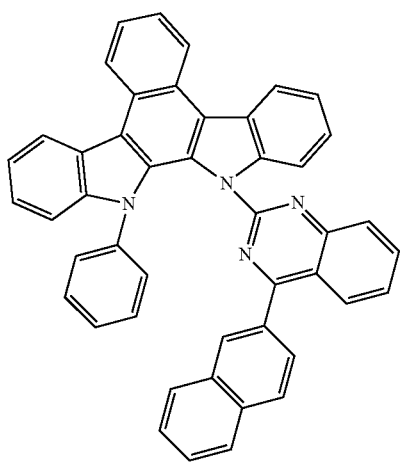

In Formula E-2b, Cbz1 and Cbz2 may each independently be an unsubstituted carbazole group or an aryl-substituted carbazole group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms, b may be an integer of 0 to 10, and in case that b is an integer of 2 or greater, $L_b$'s may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be represented by any one among compounds from Compound Group E-2 below. However, the compounds listed in Compound Group E-2 below are presented as an example, and the compound represented by Formula E-2a or Formula E-2b is not limited to those listed in Compound Group E-2 below.

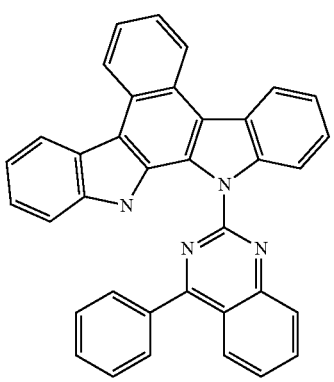

E-2-4
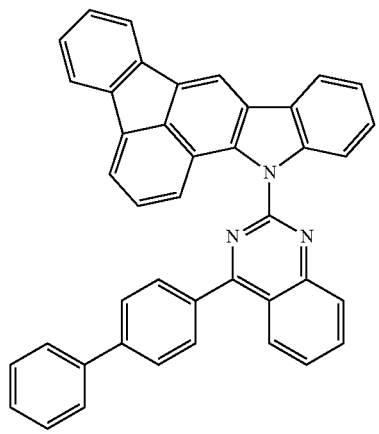
E-2-5
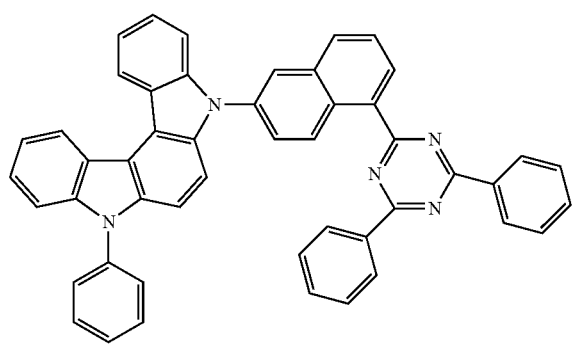
E-2-6
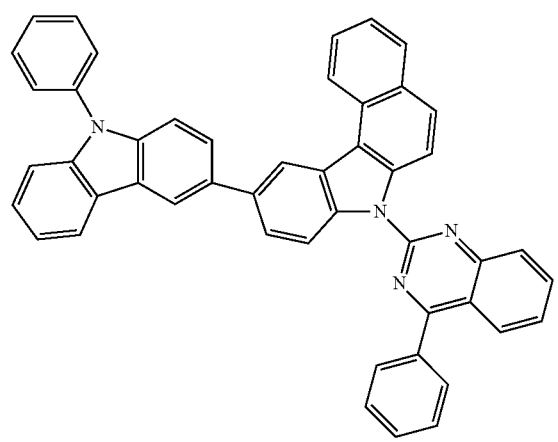
E-2-7
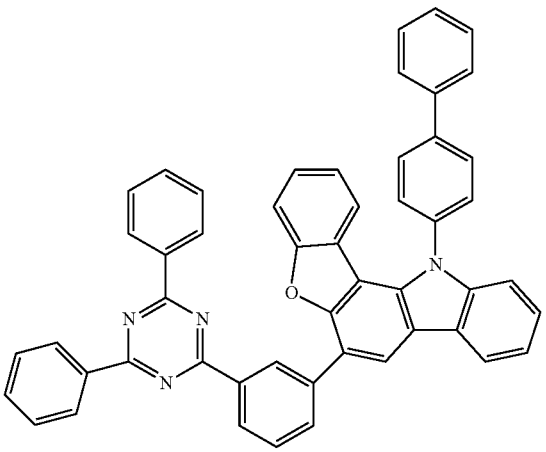
E-2-8
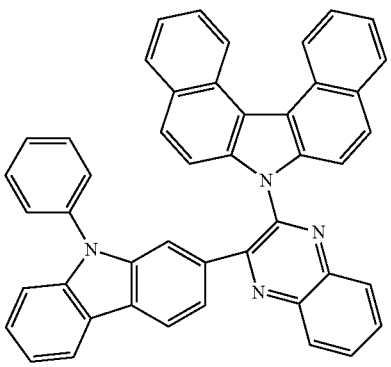
E-2-9
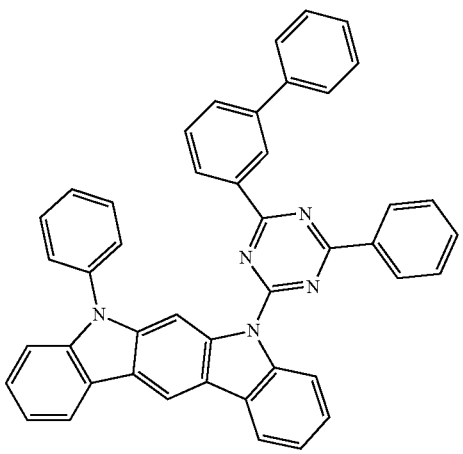

E-2-10
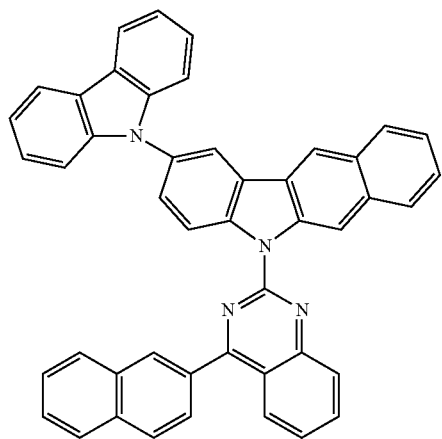
E-2-11
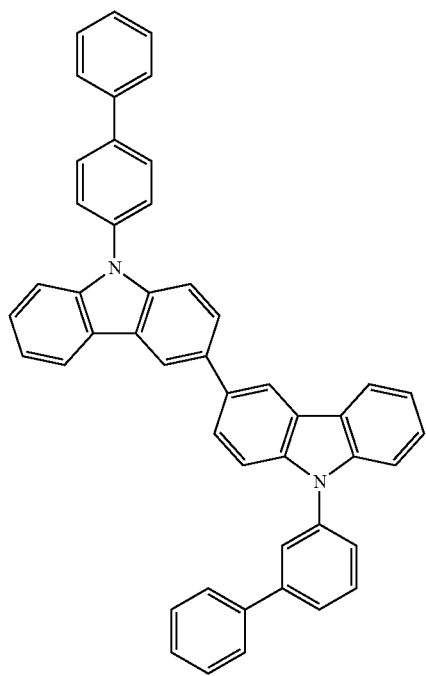
E-2-12
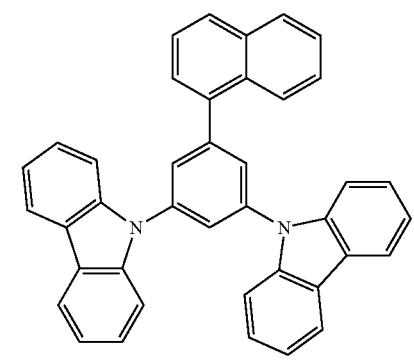
E-2-13
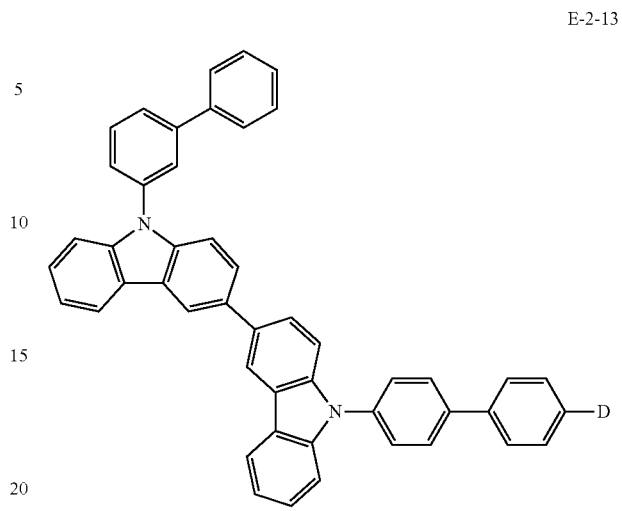
E-2-14
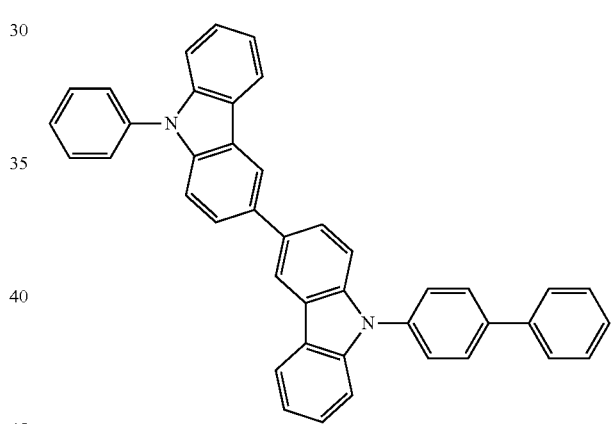
E-2-15
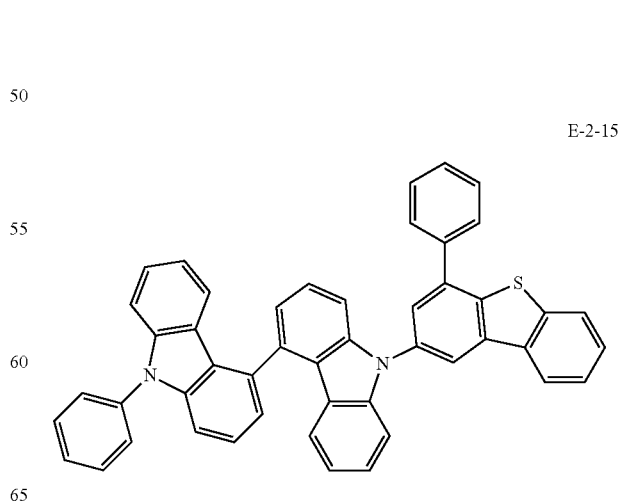

E-2-16
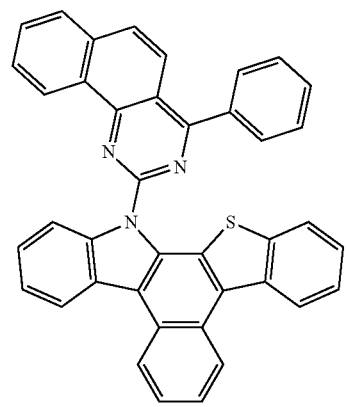
E-2-17
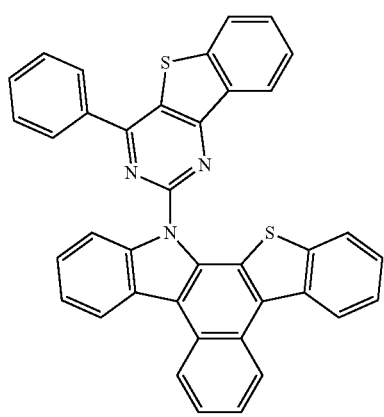
E-2-18
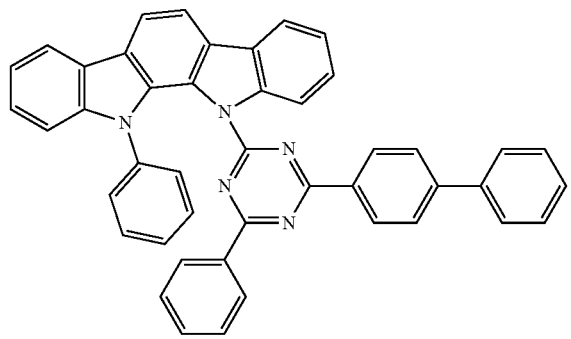
E-2-19
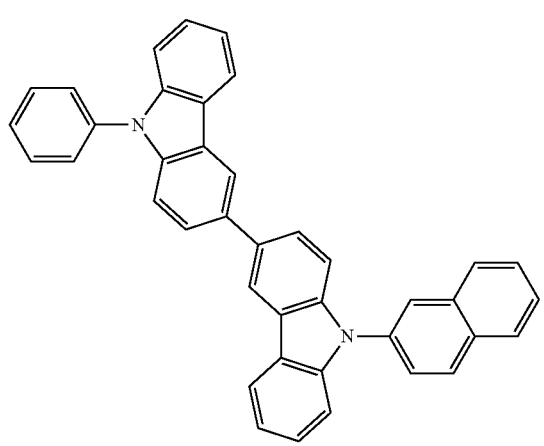
E-2-20
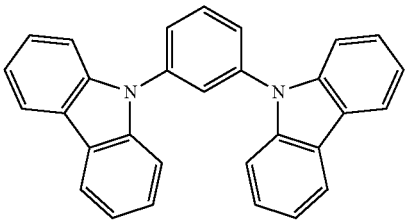
E-2-21
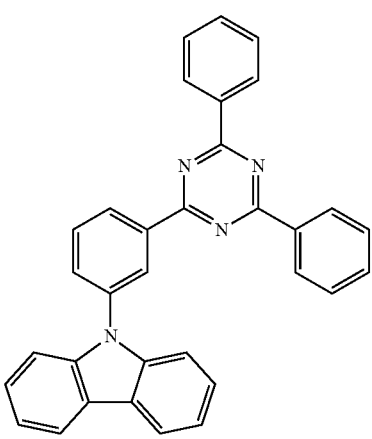
E-2-22
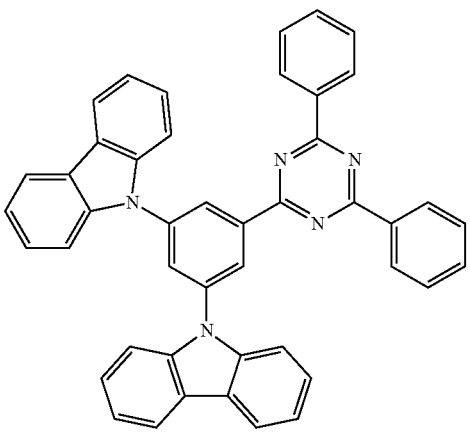
E-2-23
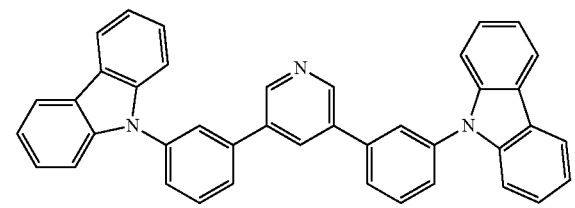

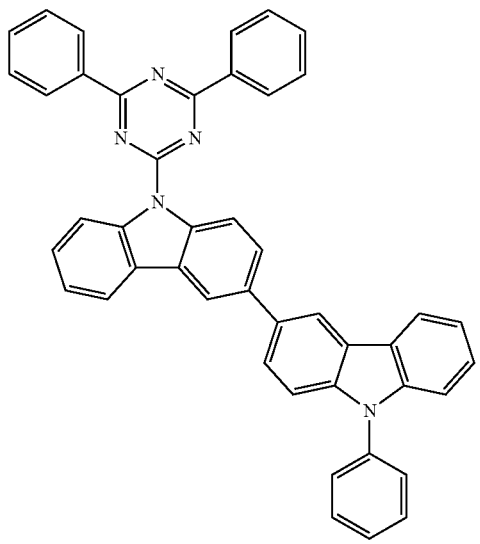

E-2-24

The emission layer EML may further include a general material in the art as a host material. For example, the emission layer EML may include, as a host material, at least one among bis(4-(9H-carbazol-9-yl)phenyl)diphenylsilane (BCPDS), (4-(1-(4-(diphenylamino)phenyl)cyclohexyl)phenyl)diphenyl-phosphine oxide (POPCPA), bis[2-(diphenylphosphino)phenyl]ether oxide (DPEPO), 4,4'-bis(N-carbazolyl)-1,1'-biphenyl (CBP), 1,3-bis(carbazolyl-9-yl)benzene (mCP), 2,8-bis(diphenylphosphoryl)dibenzofuran (PPF), 4,4',4''-tris(carbazol-9-yl)-triphenylamine (TCTA), and 1,3,5-tris(1-phenyl-1H-benzo[d]imidazol-2-yl)benzene (TPBi). However, an embodiment is not limited thereto, and for example, tris(8-hydroxyquinolino)aluminum ($Alq_3$), 9,10-di(naphthalene-2-yl)anthracene (ADN), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis (triphenylsilyl)benzene (UGH2), hexaphenylcyclotrisiloxane ($DPSiO_3$), octaphenylcyclotetrasiloxane ($DPSiO_4$), etc. may be used as a host material.

The emission layer EML may include a compound represented by Formula M-a or Formula M-b below. The compound represented by Formula M-a or Formula M-b below may be used as a phosphorescent dopant material.

[Formula M-a]

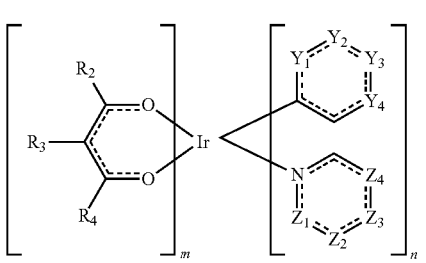

In Formula M-a above, $Y_1$ to $Y_4$, and $Z_1$ to $Z_4$ may each independently be $CR_1$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring. In Formula M-a, m is 0 or 1, and n is 2 or 3. In Formula M-a, in case that m is 0, n is 3, and in case that m is 1, n is 2.

The compound represented by Formula M-a may be used as a phosphorescent dopant.

The compound represented by Formula M-a may be represented by any one among compounds M-a1 to M-a21 below. However, the compounds M-a1 to M-a21 below are presented as an example, and the compound represented by Formula M-a is not limited to those represented by the compounds M-a1 to M-a21 below.

M-a1

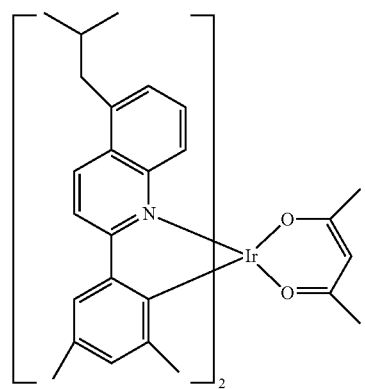

M-a2

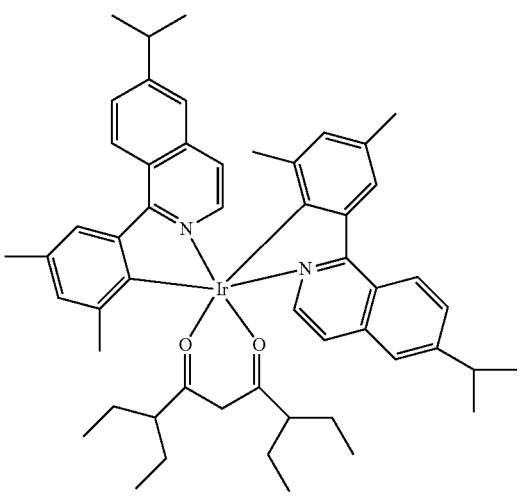

M-a3

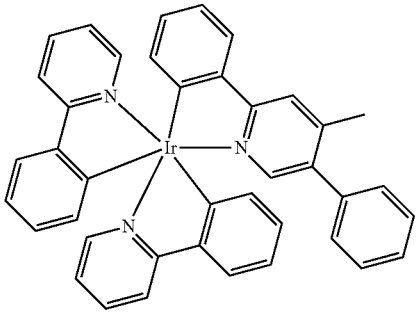

M-a4
M-a5
M-a6
M-a7
M-a8
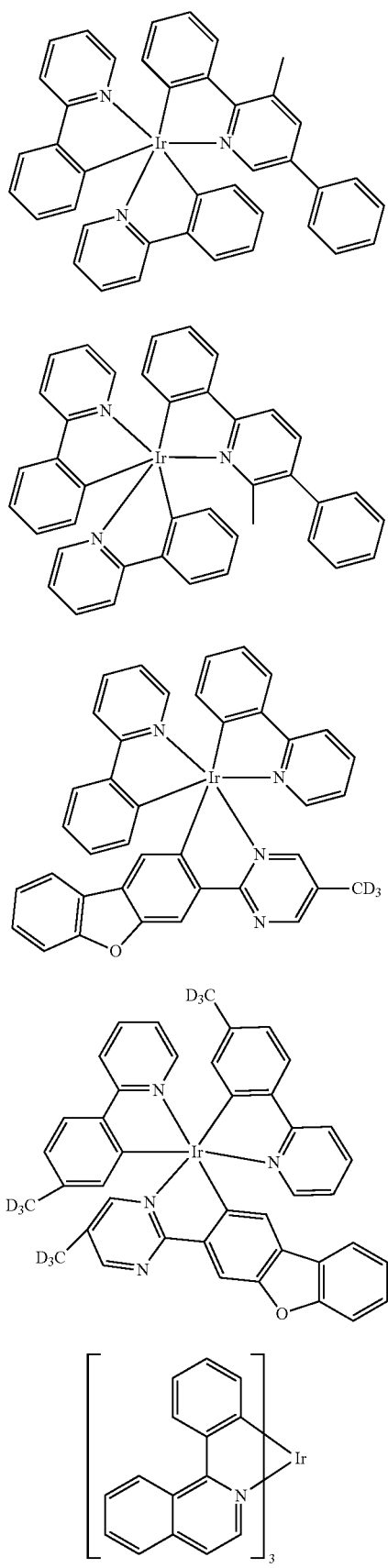
M-a9
M-a10
M-a11
M-a12
M-a13
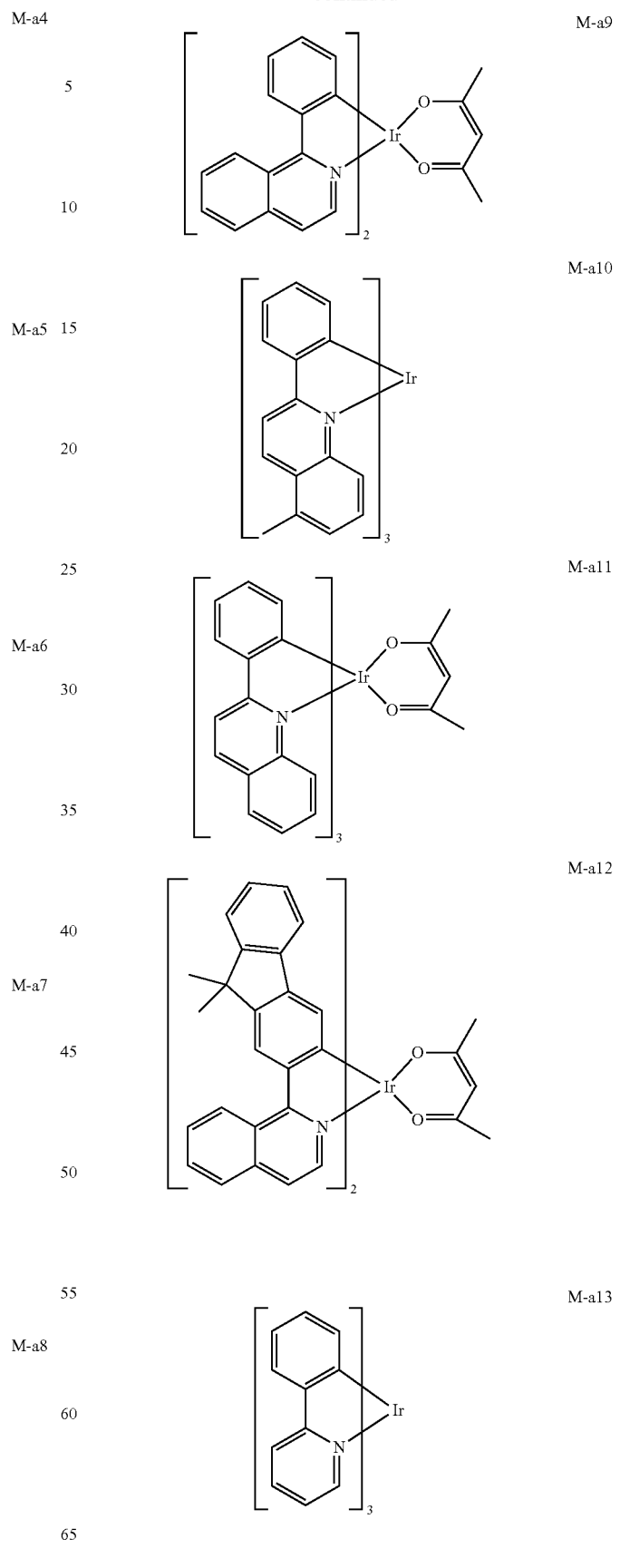

M-a14
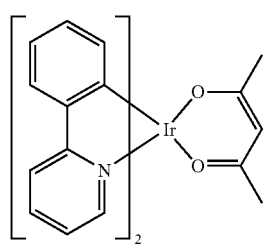
M-a15
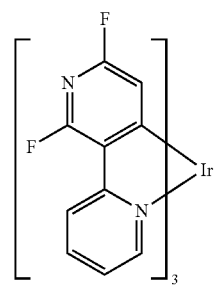
M-a16
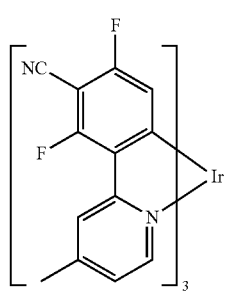
M-a17
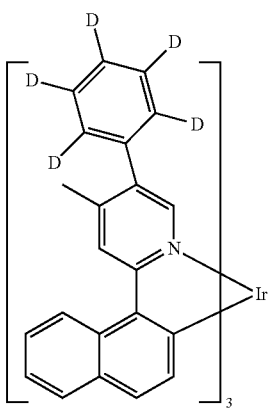
M-a18
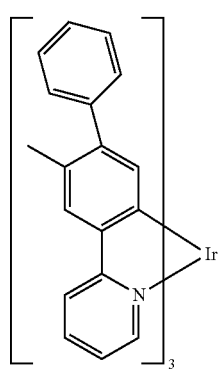
M-a19
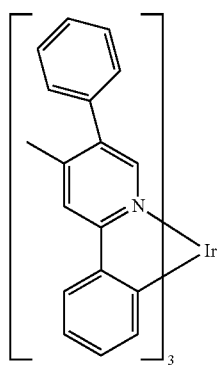
M-a20
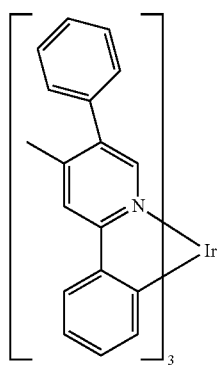
M-a21
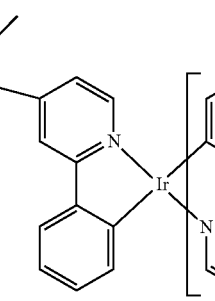
M-a22
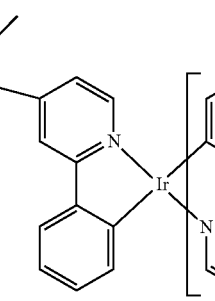
M-a23

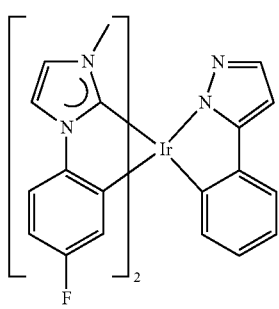

M-a24

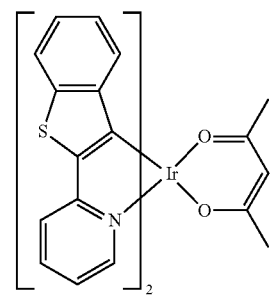

M-a25

The compounds M-a1 and M-a2 may be used as a red dopant material, and the compounds M-a3 to M-a7 may be used as a green dopant material.

[Formula M-b]

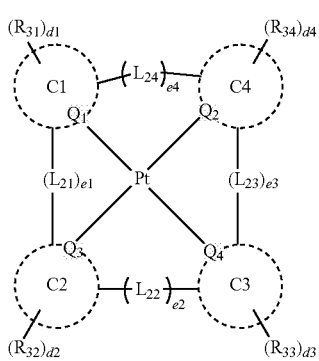

In Formula M-b, $Q_1$ to $Q_4$ are each independently C or N, and C1 to C4 are each independently a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ are each independently a direct linkage,

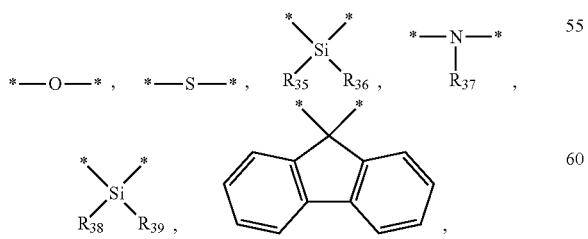

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 are each independently 0 or 1. $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, and d1 to d4 are each independently an integer of 0 to 4.

The compound represented by Formula M-b may be used as a blue phosphorescent dopant or a green phosphorescent dopant.

The compound represented by Formula M-b may be represented by any one among compounds below. However, the compounds below are presented as an example, and the compound represented by Formula M-b is not limited to those represented by the compounds below.

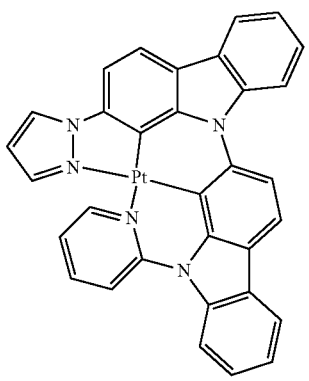

M-b-1

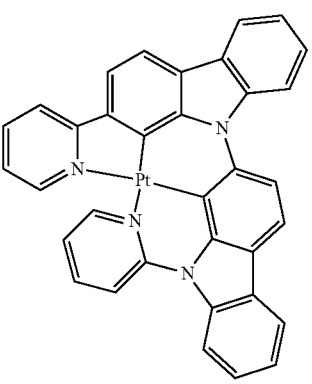

M-b-2

-continued
M-b-3
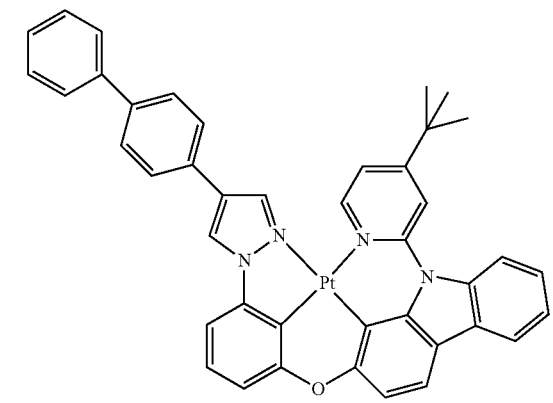
M-b-4
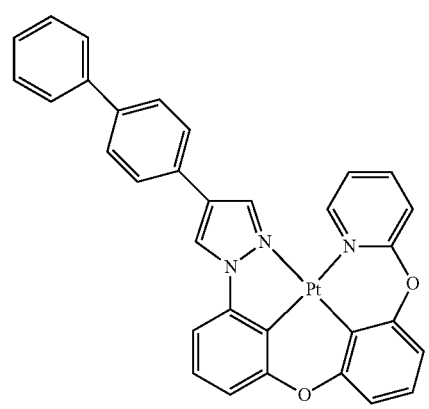
M-b-5
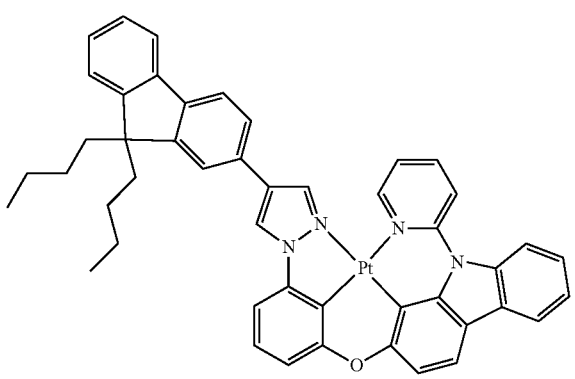
M-b-6
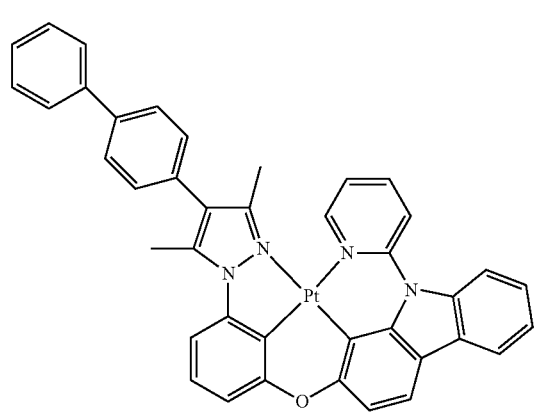
M-b-7
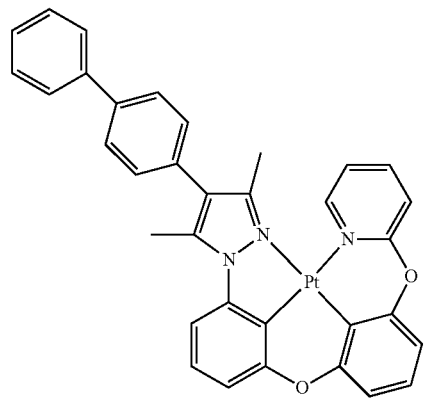
M-b-8
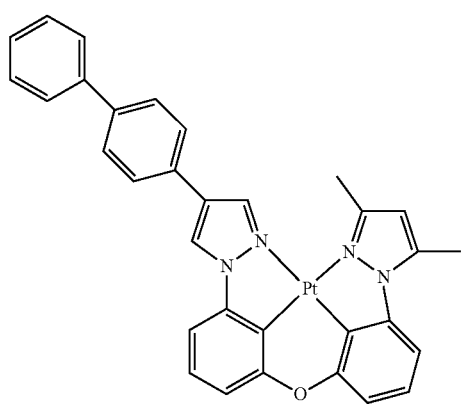
M-b-9
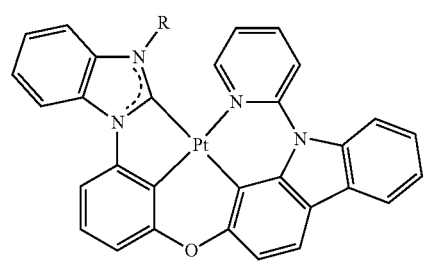
M-b-10
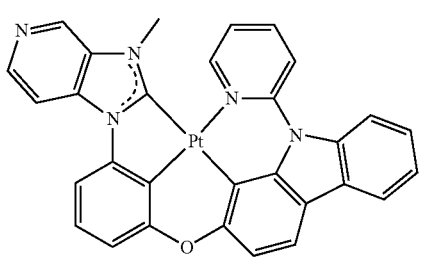
M-b-11
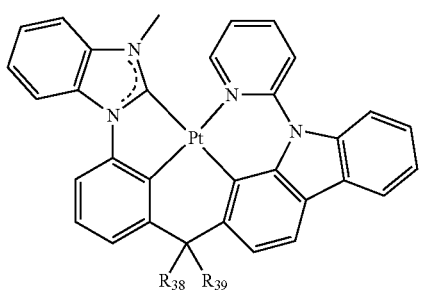

In the compounds above, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may include a compound represented by any one among Formulas F-a to F-c below. The compounds represented by Formulas F-a to F-c below may be used as a fluorescent dopant material.

[Formula F-a]

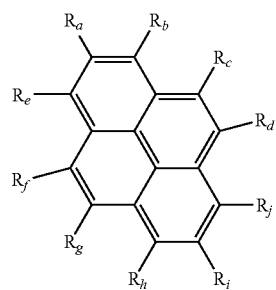

In Formula F-a above, two selected from $R_a$ to $R_j$ may each independently be substituted with *—$NAr_1Ar_2$. The others among $R_a$ to $R_j$ which are not substituted with *—$NAr_1Ar_2$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring forming carbon atoms. In *—$NAr_1Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group containing O or S as a ring-forming atom.

[Formula F-b]

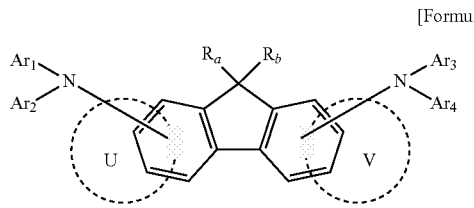

In Formula F-b above, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or linked to an adjacent group to form a ring. $Ar_1$ to $Ar_4$ may each independently be a substituted or unsubstituted aryl group having 6 to 30 ring-forming carbon atoms, or a substituted or unsubstituted heteroaryl group having 2 to 30 ring-forming carbon atoms.

In Formula F-b, U and V may each independently be a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may each independently be 0 or 1. For example, In Formula F-b, in case that the number of U or V is 1, one ring forms a fused ring in a portion indicated by U or V, and in case that the number of U or V is 0, it means that no ring indicated by U or V is present. By way of example, in case that the number of U is 0 and the number of V is 1, or in case that the number of U is 1 and the number of V is 0, a fused ring having a fluorene core of Formula F-b may be a cyclic compound having four rings. In case that both U and V are 0, the fused ring of Formula F-b may be a cyclic compound having three rings. In case that both U and V are 1, the fused ring having a fluorene core of Formula F-b may be a cyclic compound having five rings.

[Formula F-c]

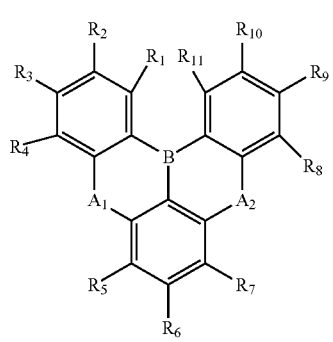

In Formula F-c, $A_1$ and $A_2$ may each independently be O, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring.

In Formula F-c, $A_1$ and $A_2$ may each independently be bonded to substituents of neighboring rings to form a fused ring. For example, in case that $A_1$ and $A_2$ are each independently $NR_m$, $A_1$ may be bonded to $R_4$ or $R_5$ to form a ring. $A_2$ may be bonded to $R_7$ or $R_8$ to form a ring.

The emission layer EML may include, as a dopant material, styryl derivatives (for example, 1,4-bis[2-(3-N-ethylcarbazoryl)vinyl]benzene (BCzVB), 4-(di-p-tolylamino)-4"-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi)), perylene and derivatives thereof (for example, 2,5,8,11-tetra-t-butylperylene (TBP)), pyrene and derivatives thereof (for example, 1,1-dipyrene, 1,4-dipyrenylbenzene, 1,4-bis (N,N-diphenylamino)pyrene, etc.

The emission layer EML may include a phosphorescent dopant material. For example, as a phosphorescent dopant, a metal complex including iridium (Ir), platinum (Pt), osmium (Os), gold (Au), titanium (Ti), zirconium (Zr), hafnium (Hf), europium (Eu), and terbium (Tb), or thulium (Tm) may be used. By way of example, iridium(III) bis(4, 6-difluorophenylpyridinato-N,C2'), (FIrpic), bis(2,4-difluorophenylpyridinato)-tetrakis(1-pyrazolyl)borate iridium(III) (Fir6), platinum octaethyl porphyrin (PtOEP), etc. may be used as a phosphorescent dopant. However, an embodiment is not limited thereto.

The emission layer EML may include a quantum dot material. The core of a quantum dot may be selected from a Group II-VI compound, a Group III-VI compound, a Group I-III-VI compound, a Group III-V compound, a Group III-II-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, and a mixture thereof.

The Group III-VI compound may include a binary compound such as $In_2S_3$ and $In_2Se_3$, a ternary compound such as $InGaS_3$ and $InGaSe_3$, or any combination thereof.

The Group I-III-VI compound may include a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, or any mixture thereof, or a quaternary compound such as $AgInGaS_2$ and $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

The binary compound, the ternary compound, or the quaternary compound may be present in particles having a uniform concentration distribution, or may be present in the same particles having a partially different concentration distribution. A core/shell structure in which one quantum dot surrounds another quantum dot may be present. The core/shell structure may have a concentration gradient in which the concentration of an element present in the shell becomes lower towards the core.

In an embodiment, a quantum dot may have the core/shell structure including a core having nano-crystals, and a shell surrounding the core, which are described above. The shell of the quantum dot may serve as a protection layer to prevent the chemical deformation of the core so as to keep semiconductor properties, and/or a charging layer to impart electrophoresis properties to the quantum dot. The shell may be a single layer or multiple layers. Examples of the shell of the quantum dot may be a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or a ternary compound such as $MgAl_2O_4$, $CoFe_2O_4$, $NiFe_2O_4$, and $CoMn_2O_4$, but an embodiment is not limited thereto.

The semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but an embodiment is not limited thereto.

The quantum dot may have, in an emission wavelength spectrum, a full width of half maximum (FWHM) of about 45 nm or less, about 40 nm or less, and about 30 nm or less, and in this range, the color purity or the color reproducibility may be improved. Light emitted through the quantum dot is emitted in all directions, and thus a wide viewing angle may be improved.

The form of a quantum dot is not particularly limited as long as it is a form commonly used in the art, and, a quantum dot in the form of spherical, pyramidal, multi-arm, or cubic nanoparticles, nanotubes, nanowires, nanofibers, nanoplatelets, and the like may be used.

The quantum dot may control the color of emitted light according to particle size thereof, and thus the quantum dot may have various colors of emitted light such as blue, red, and green.

The hole transport region HTR is provided on the first electrode EL1. The hole transport region HTR may include at least one among a hole injection layer (not shown), a hole transport layer (not shown), a buffer layer or a light emitting auxiliary layer (not shown), and an electron blocking layer (not shown). The hole transport region HTR may have, for example, a thickness in a range of about 50 Å to about 15000 Å.

The hole transport region HTR may have a single layer formed of a single material, a single layer formed of different materials, or a multilayer structure having layers formed of different materials.

For example, the hole transport region HTR may have a single-layer structure formed of the hole injection layer (not shown) or the hole transport layer (not shown), or a single-layer structure formed of a hole injection material or a hole transport material. The hole transport region HTR may have a single-layer structure formed of different materials, or a structure of a hole injection layer (not shown)/a hole transport layer (not shown), a hole injection layer (not shown)/a hole transport layer (not shown)/a buffer layer (not shown), a hole injection layer (not shown)/a buffer layer (not shown), a hole transport layer (not shown)/a buffer layer (not shown), or a hole injection layer (not shown)/a hole transport layer (not shown)/electron blocking layer (not shown), which may be stacked each other in order from the first electrode EL1, but an embodiment is not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-1 below.

[Formula H-1]

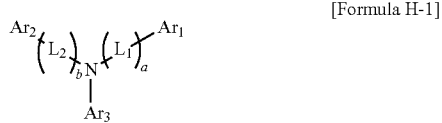

In Formula H-1 above, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. a and b may each independently be an integer of 0 to 10. In case that a or b is an integer of 2 or greater, $L_1$'s and $L_2$'s may each independently be a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. In Formula H-1, $Ar_3$ may be a substituted or unsubstituted aryl group having 6 to 30 ring-forming carbon atoms.

A compound represented by Formula H-1 above may be a monoamine compound. By way of example, the compound represented by Formula H-1 may be a diamine compound in which at least one of $Ar_{-1}$ to $Ar_3$ may include an amine group as a substituent. The compound represented by Formula H-1 may be a carbazole-based compound including a substituted or unsubstituted carbazole group in at least one of $Ar_1$ or $Ar_2$ or a substituted or unsubstituted fluorene-based group in at least one of $Ar_1$ or $Ar_2$.

The compound represented by Formula H-1 may be represented by any one among compounds from Compound Group H below. However, the compounds listed in Compound Group H below are presented as an example, and the compound represented by Formula H-1 is not limited to the those listed in Compound Group H below.

H-1-1

H-1-2

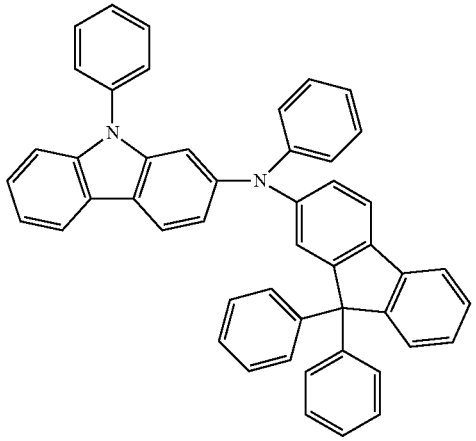

H-1-3

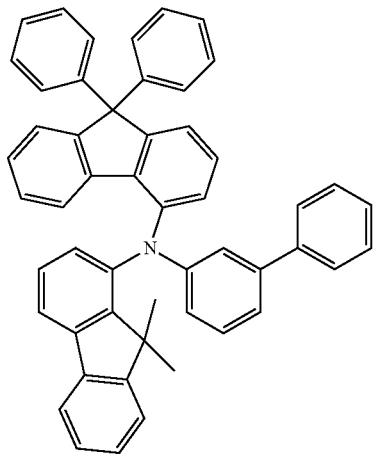

H-1-4

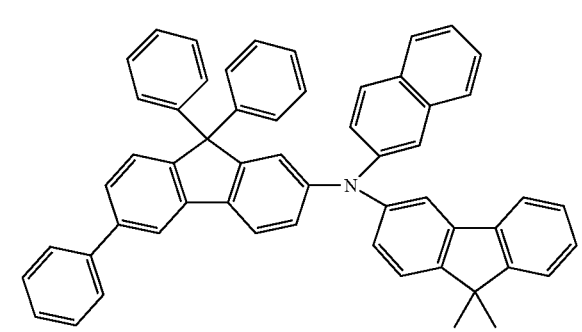

H-1-5

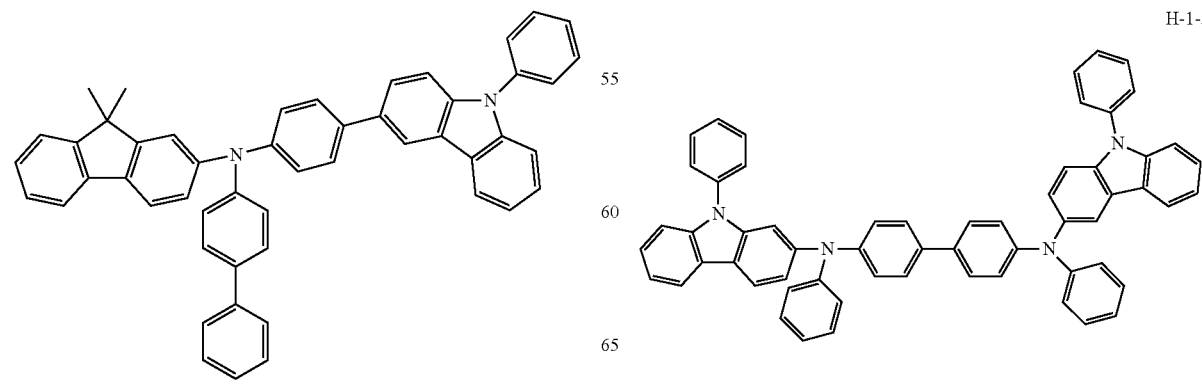

H-1-6
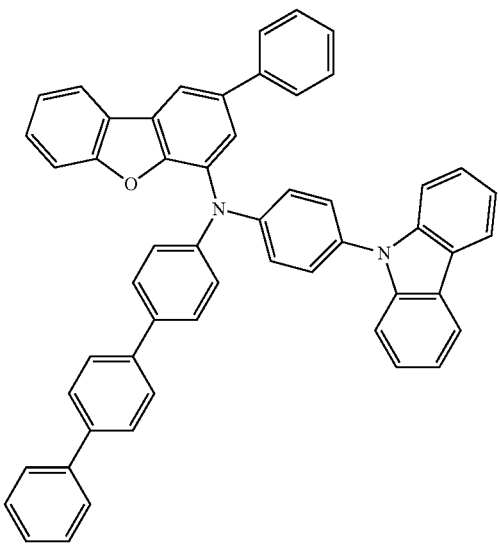
H-1-7
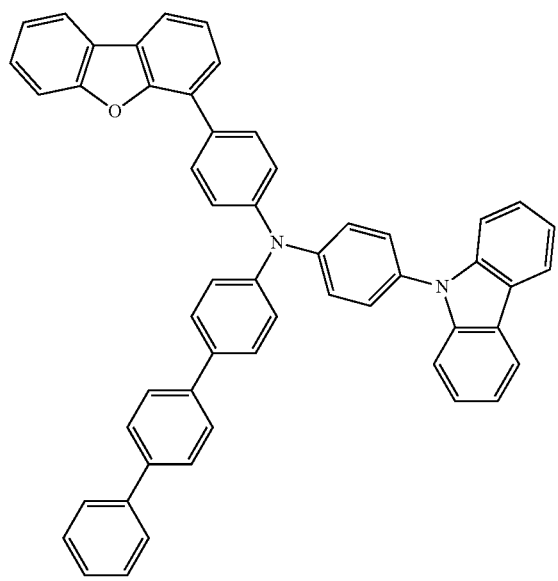
H-1-8
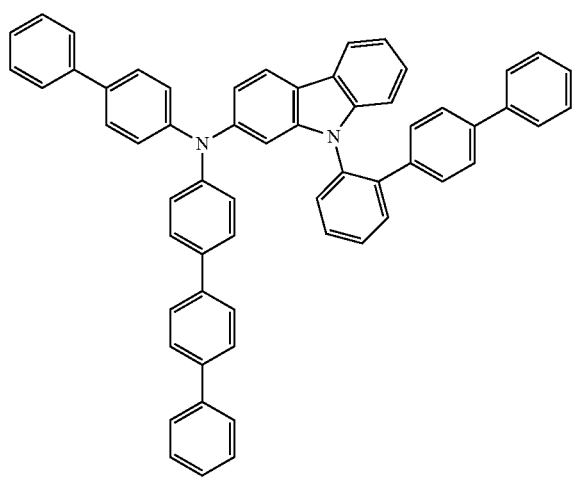
H-1-9
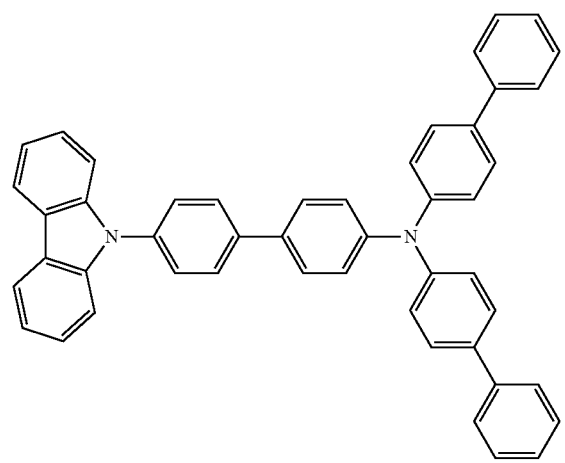
H-1-10
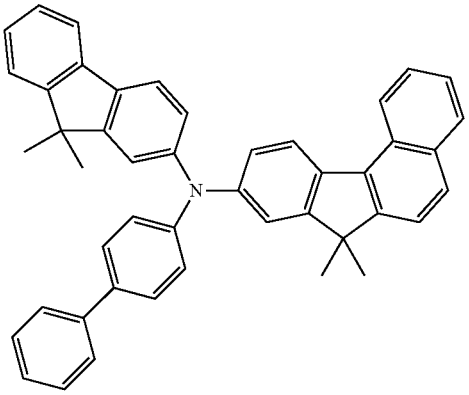
H-1-11
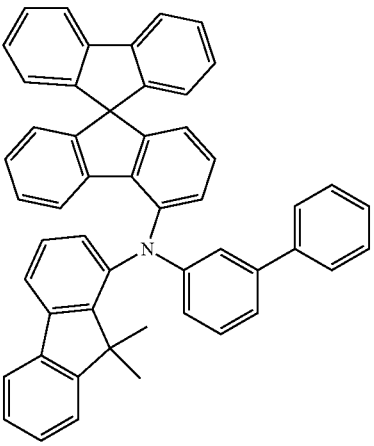

H-1-12
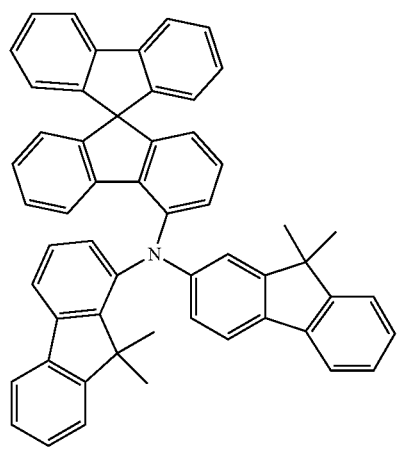
H-1-13
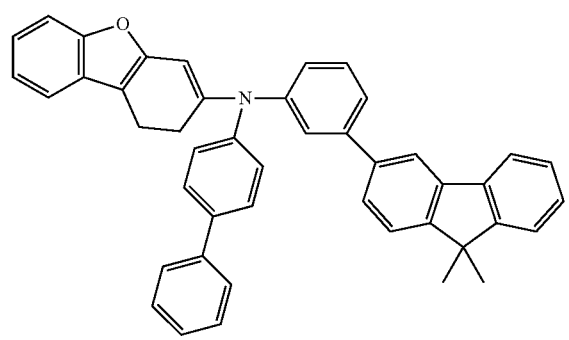
H-1-14
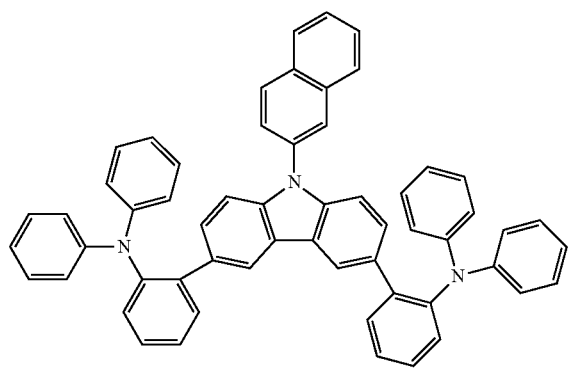
H-1-15
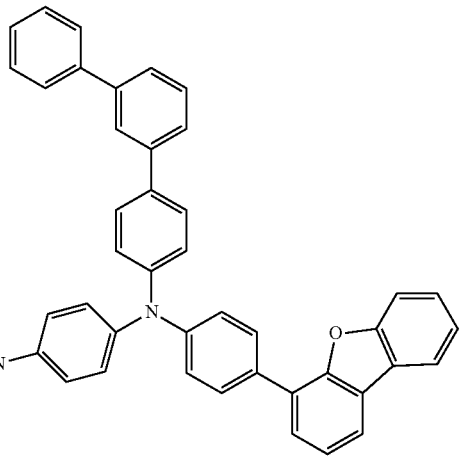
H-1-16
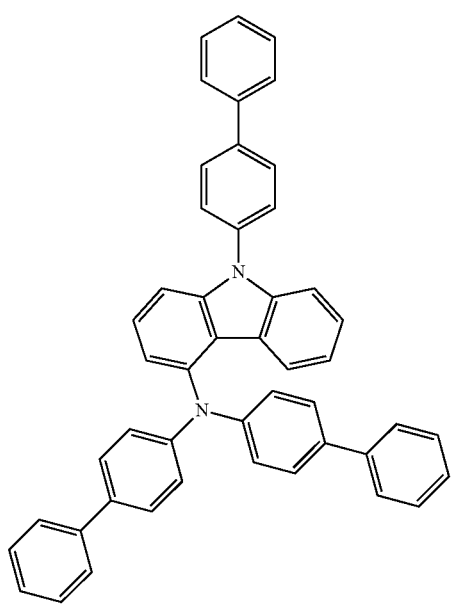
H-1-17
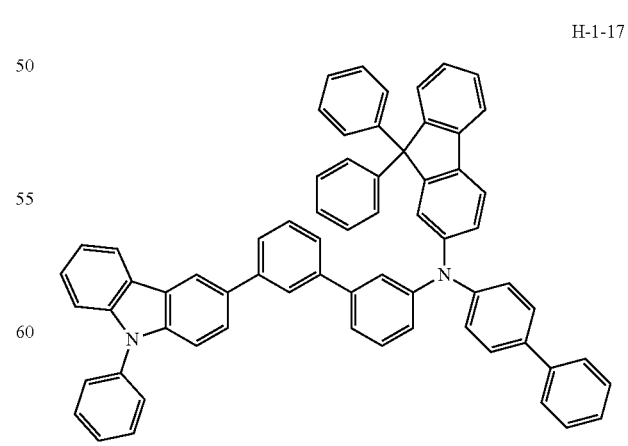

H-1-18

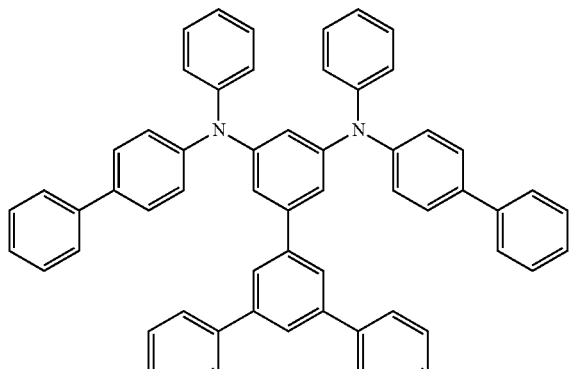

H-1-19

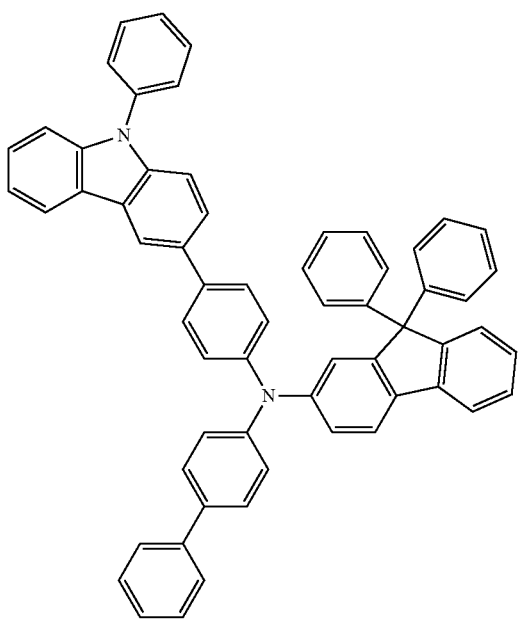

The hole transport region HTR may include a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4''-[tris(3-methylphenyl)phenylamino]triphenylamine] (m-MTDATA), 4,4',4''-tris(N,N-diphenylamino)triphenylamine (TDATA), 4,4',4''-tris{N,-(2-naphthyl)-N-phenylamino)-triphenylamine (2-TNATA), poly(3,4-ethylenedioxythiophene)/poly(4-styrene sulfonate) (PEDOT/PSS), polyaniline/dodecylbenzenesulfonic acid (PANI/DBSA), polyaniline/camphor sulfonic acid (PANI/CSA), polyaniline/poly(4-styrene sulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino [2,3-f: 2',3'-h]quinoxaline-2,3,6,7,10,11-hexacarbonitrile (HAT-CN), etc.

The hole transport region HTR may include carbazole-based derivatives such as N-phenyl carbazole and polyvinyl carbazole, fluorene-based derivatives, N,N'-bis(3-methylphenyl)-N,N'-diphenyl-[1,1-biphenyl]-4,4'-diamine (TPD), triphenylamine-based derivatives such as 4,4',4''-tris (N-carbazolyl)triphenylamine (TCTA), N,N'-di(1-naphtalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The hole transport region HTR may include 9-(4-tert-Butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region described above in at least one among the hole injection layer (not shown), the hole transport layer (not shown), and the electron blocking layer (not shown).

The hole transport region HTR may have a thickness in a range of about 100 Å to about 10000 Å, for example, in a range of about 100 Å to about 5000 Å. In case that the hole transport region HTR may include the hole injection layer (not shown), the hole injection layer (not shown) may have a thickness of, for example, in a range of about 30 Å to about 1000 Å. In case that the hole transport region HTR may include the hole transport layer (not shown), the hole transport layer (not shown) may have a thickness in a range of about 30 Å to about 1000 Å. For example, in case that the hole transport region HTR may include the electron blocking layer (not shown), the electron blocking layer (not shown) may have a thickness in a range of about 10 Å to about 1000 Å. In case that the thicknesses of the hole transport region HTR, the hole injection layer (not shown), the hole transport layer (not shown), and the electron blocking layer (not shown) satisfy the above-described ranges, satisfactory hole transport properties may be obtained without a substantial increase in driving voltage.

The hole transport region HTR may further include, in addition to the above-described materials, a charge generation material to increase conductivity. The charge generation material may be uniformly or non-uniformly dispersed in the hole transport region HTR. The charge generation material may be, for example, a p-dopant. The p-dopant may include at least one of halogenated metal compounds, quinone derivatives, metal oxides, or cyano group-containing compounds, but is not limited thereto. For example, the p-dopant may include halogenated metal compounds such as CuI and RbI, quinone derivatives such as tetracyanoquinodimethane (TCNQ) and 2,3,5,6-tetrafluoro-7,7,8,8-tetracyanoquinodimethane (F4-TCNQ), metal oxides such as tungsten oxides and molybdenum oxides, cyano group-containing compounds such as dipyrazino[2,3-f: 2',3'-h] quinoxaline-2,3,6, 7,10,11-hexacarbonitrile (HATCN) and 4-[[2,3-bis[cyano-(4-cyano-2,3,5,6-tetrafluorophenyl)methylidene] cyclopropylidene]-cyanomethyl]-2,3,5,6-tetrafluorobenzonitrile (NDP9), etc., but is not limited thereto.

As described above, the hole transport region (not shown) may further include at least one of a buffer layer (not shown) or an electron blocking layer (not shown) in addition to the hole injection layer (not shown) and the hole transport layer (not shown). The buffer layer (not shown) may compensate a resonance distance according to wavelengths of light emitted from an emission layer EML, and may thus increase light emitting efficiency. Materials which may be included in the hole transport region HTR may be used as materials included in the buffer layer (not shown). The electron blocking layer (not shown) is a layer that serves to prevent electrons from being injected from the electron transport region ETR to the hole transport region HTR.

The second electrode EL2 is provided on the hole transport region HTR. The second electrode EL2 may be a common electrode. The second electrode EL2 may be an anode, but an embodiment is not limited thereto. The second electrode may include at least one selected from Ag, Mg, Cu, Al, Pt, Pd, Au, Ni, Nd, Ir, Cr, Li, Ca, LiF, Mo, Ti, W, In, Sn, and Zn, two or more compounds selected therefrom, two or more mixtures selected therefrom, or an oxide thereof.

The second electrode EL2 may be a transmissive electrode, a transflective electrode, or a reflective electrode. In case that the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

In case that the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (for example, AgMg, AgYb, or MgAg). By way of example, the second electrode EL2 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the second electrode EL2 may include the above-described metal materials, a combination of two or more metal materials selected from the above-described metal materials, or oxides of the above-described metal materials.

Although not shown, the second electrode EL2 may be connected with an auxiliary electrode. In case that the second electrode EL2 is connected with the auxiliary electrode, the resistance of the second electrode EL2 may decrease.

Hereinafter, a method for manufacturing the light emitting element ED included in the display device DD (FIG. 1) will be described in detail with reference to FIGS. 5 to 10. Overlapping contents of the structural features in the light emitting element described with reference to FIGS. 1 to 4 will not be described again, but features of the manufacturing method will be described in detail.

Figure 5:
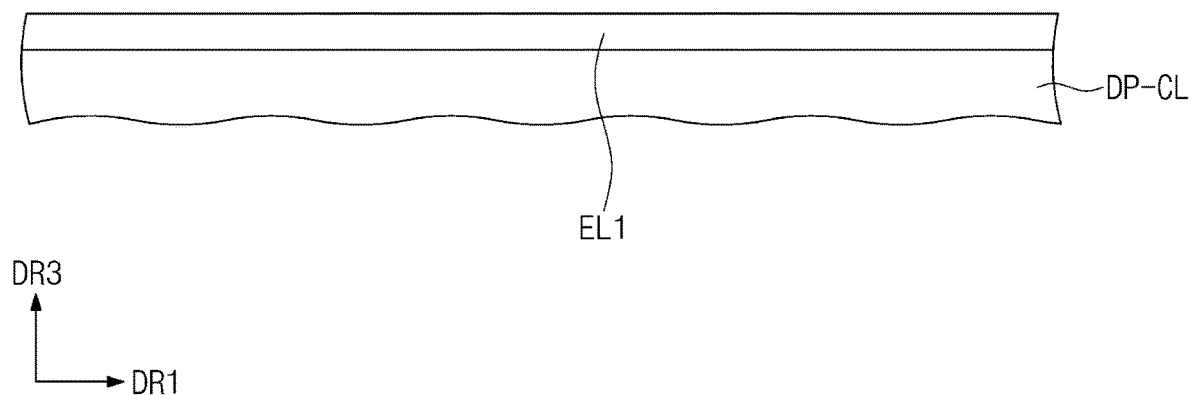
FIG. 5 is a view schematically showing a process of forming a first electrode on a circuit layer.

FIG. 5 is a view schematically showing a process of forming a first electrode on a circuit layer. Referring to FIG. 5, the forming of a first electrode EL1 may include depositing a first electrode EL1 on a circuit layer DP-CL. The first electrode EL1 may be formed through a deposition method to have a flat upper surface.

Figure 6:
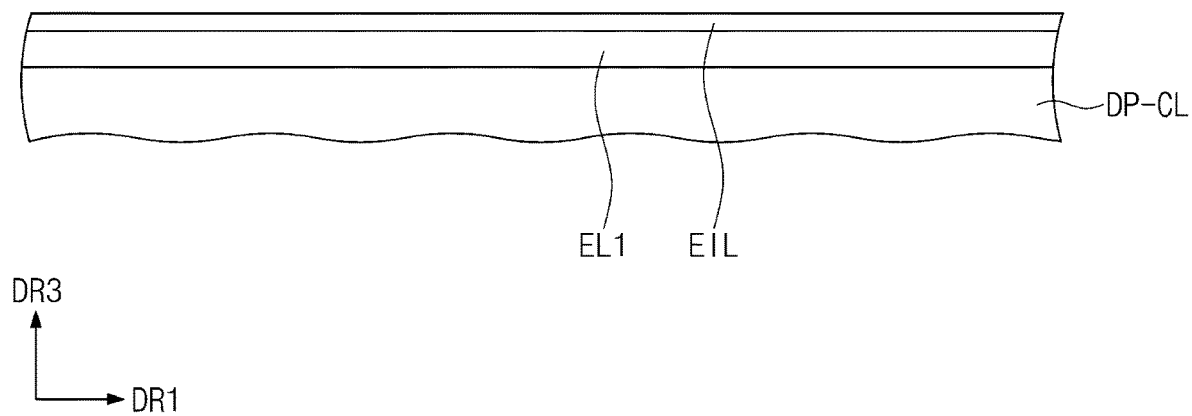
FIG. 6 is a view schematically showing a process of forming an electron injection layer on a first electrode.

FIG. 6 is a view schematically showing a process of forming an electron injection layer on a first electrode. Referring to FIG. 6, the forming of an electron injection layer EIL may include depositing an electron injection layer EIL on the first electrode EL1. The electron injection layer EIL may be formed through a deposition method to have a flat upper surface.

Figure 7:
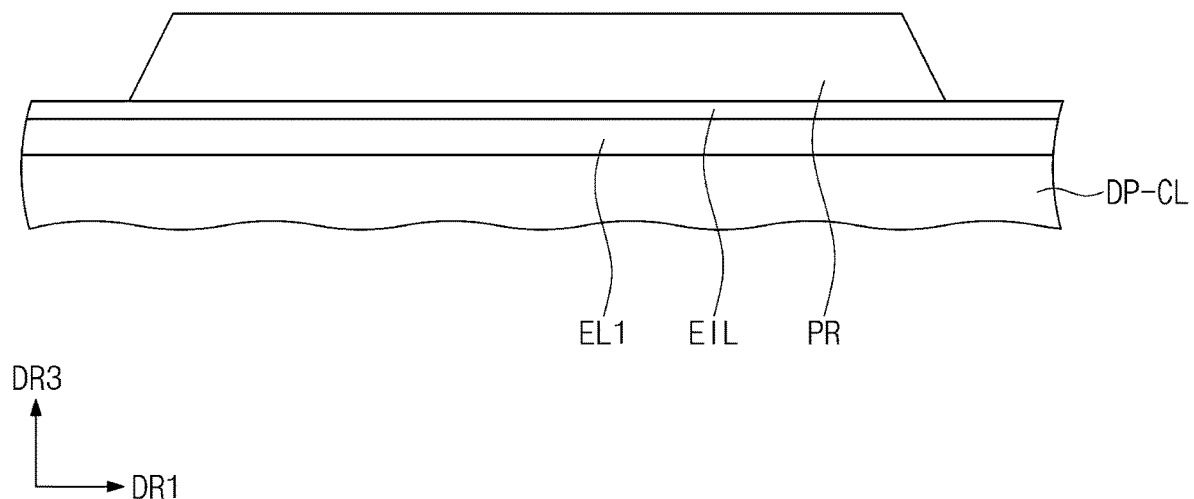
FIG. 7 is a view schematically showing a process of forming a photoresist layer on an electron injection layer.
Figure 8:
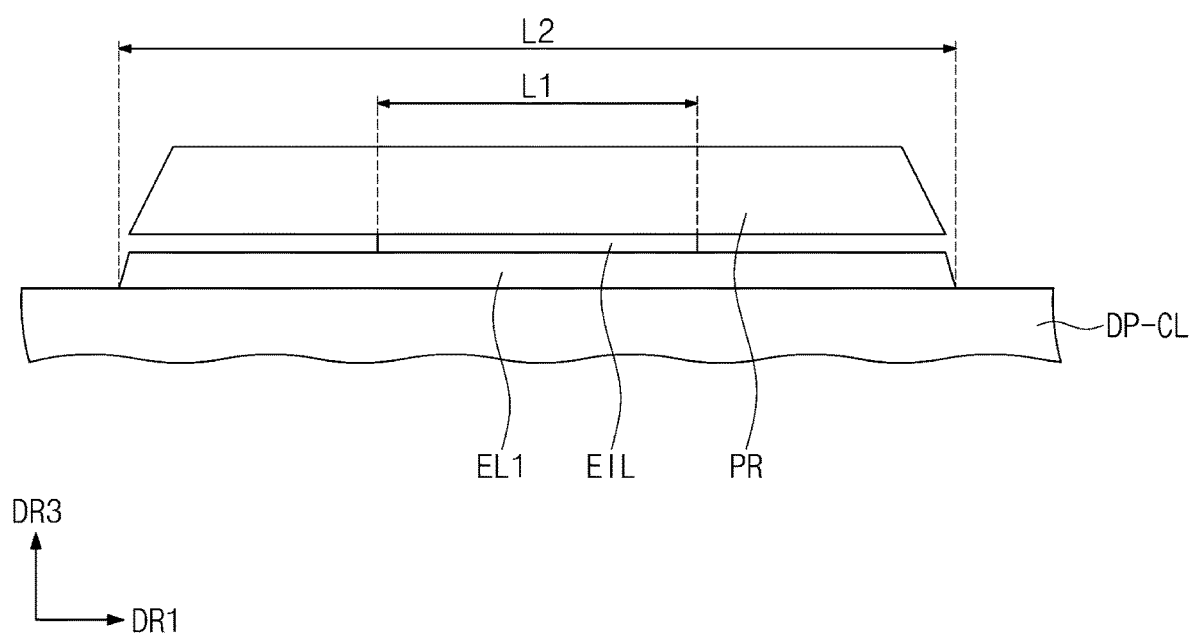
FIG. 8 is a view schematically showing a process of patterning an electron injection layer and a first electrode.

FIG. 7 is a view schematically showing a process of forming a photoresist layer on an electron injection layer. FIG. 8 is a view schematically showing a process of patterning an electron injection layer and a first electrode.

Referring to FIG. 7, the forming of a photoresist layer PR on the electron injection layer EIL may include forming a photoresist layer PR on a portion of the injection layer EIL to form the shape of the first electrode EL1 and the electron injection layer EIL shown in FIG. 3.

Referring to FIG. 8, the patterning of the electron injection layer EIL and the first electrode EL1 may include etching the electron injection layer EIL on the electron injection layer EIL exposed by the photoresist layer PR. After the etching of the electron injection layer EIL, the method may include etching the first electrode EL1 exposed by the electron injection layer EIL. The etching of the electron injection layer EIL and the first electrode EL1 may include wet etching the electron injection layer EIL and the first electrode EL1.

The electron injection layer EIL may have greater etching reactivity than the first electrode EL1. The electron injection layer EIL may have a greater etching rate than the first electrode EL1. Accordingly, only a portion of the first electrode EL1 exposed from the photoresist layer PR is etched, and in the electron injection layer EIL, a portion exposed from the photoresist layer PR and a portion covered by the photoresist layer PR may be further etched. As a result, the first length L1 of the electron injection layer EIL in the first direction DR1 may be formed to be shorter than the second length L2 of the first electrode EL1 in the first direction DR1. The edge EG1 of the electron injection layer EIL may be disposed closer to the center than the edge EG2 of the first electrode EL1.

In FIGS. 7 and 8, the first electrode EL1 and the electron injection layer EIL are shown to be patterned together through a single photolithography process, but an embodiment is not limited thereto. For example, the first electrode EL1 and the electron injection layer EIL may be patterned through an independent photolithography process. By way of example, after the first electrode EL1 is patterned through a primary photolithography process, the electron injection layer EIL is deposited on the first electrode EL1 to pattern the electron injection layer EIL through a secondary photolithography process.

Figure 9:
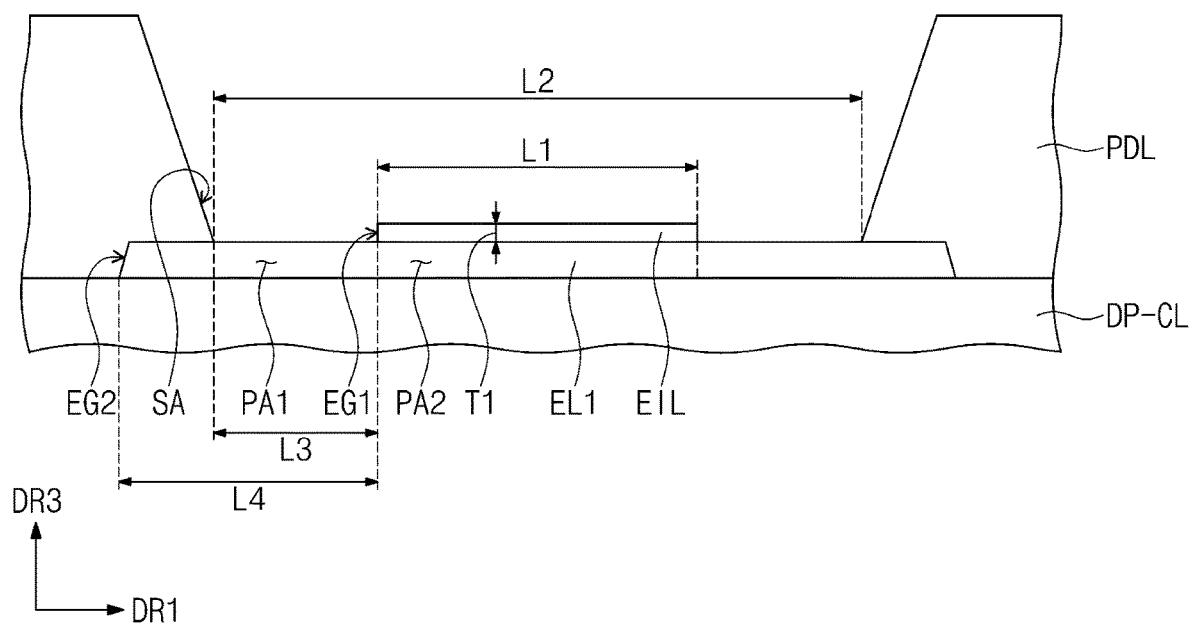
FIG. 9 schematically shows a process of forming a pixel defining film on an electron injection layer.

FIG. 9 schematically shows a process of forming a pixel defining film on an electron injection layer. Referring to FIG. 9, the forming of a pixel defining film PDL may include forming the pixel defining film PDL to cover a portion of the first electrode EL1 exposed from the electron injection layer EIL. The forming of the pixel defining film PDL may include forming the pixel defining film PDL to be spaced apart from the electron injection layer EIL in the first direction DR1. By way of example, the forming of the pixel defining film PDL may include forming the pixel defining film PDL such that the edge EG1 of the electron injection layer EIL is spaced apart from the side surface SA of the pixel defining film PDL by a third distance L3.

Figure 10:
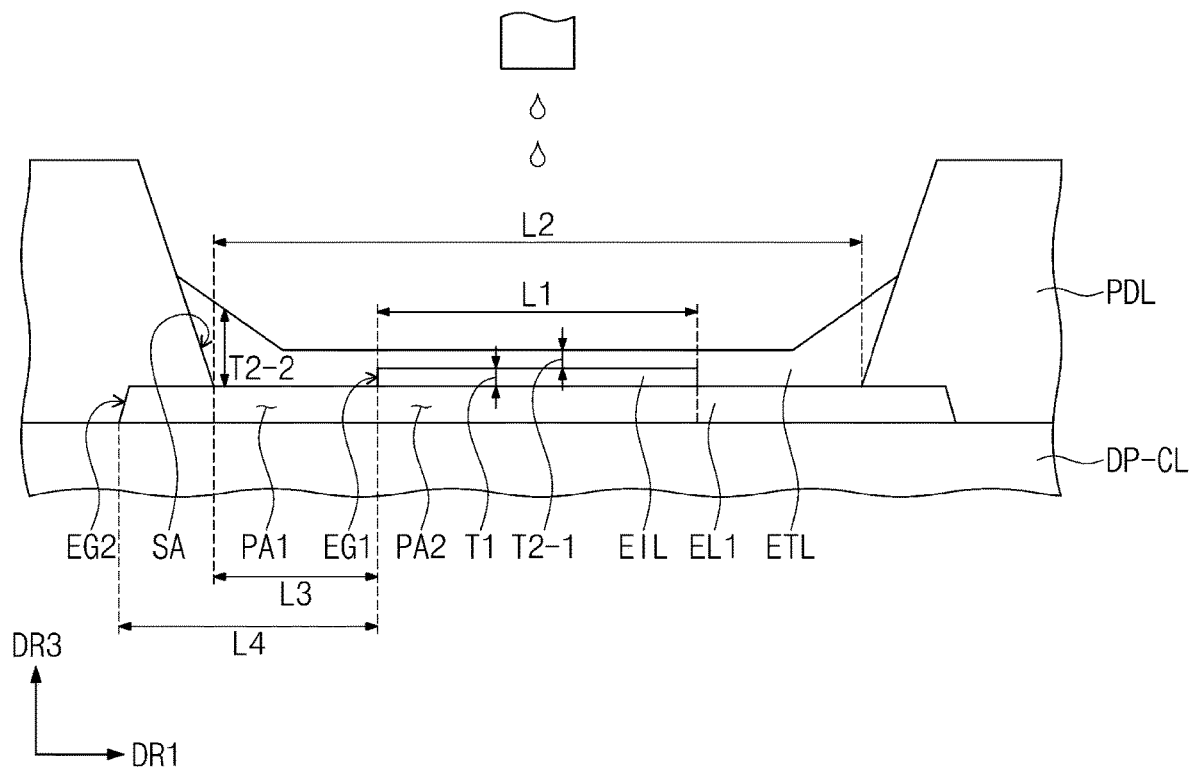
FIG. 10 is a view schematically showing a process of forming an electron transport layer on an electron injection layer.

FIG. 10 is a view schematically showing a process of forming an electron transport layer on an electron injection layer. Referring to FIG. 10, the forming of an electron transport layer ETL may include forming the electron transport layer ETL on the electron injection layer EIL through an inkjet printing method. The electron transport layer ETL formed through the inkjet printing method may be formed to follow the shape of the pixel defining film PDL. Accordingly, the thickness T2-2 of the electron transport layer ETL corresponding to the outer periphery may be greater than the thickness T2-1 of the electron transport layer ETL corresponding to the center.

A display device according to an embodiment may include a light emitting element including a first electrode, an electron injection layer disposed on the first electrode and exposing a portion of the first electrode, and an electron transport layer covering the electron injection layer on the electron injection layer. In detail, the display device according to an embodiment may include an electron transport region having a thicker outer periphery than a center. The electron transport region is divided into a center having a structure in which an electron injection layer and an electron transport layer may be stacked each other, and an outer periphery having a structure in which only an electron transport layer is stacked. In the outer periphery, the electron injection layer has greater electrical conductivity than the electron transport layer, and accordingly, the electron transport region may have a greater amount of current flowing at the center than at the outer periphery. As a result, the amount of current flowing at the center of the thinner electron transport region increases, and thus, the light emitting efficiency of the light emitting element may increase.

In an embodiment, a length of the electron injection layer is shorter than a length of the first electrode exposed by a pixel defining film. This is due to a difference in etching rates between the electron injection layer and the first electrode. For example, the electron injection layer and the first electrode are patterned through a same photolithography process, and a difference in length between the electron injection layer and the first electrode is caused in the photolithography process. The electron transport layer is disposed to cover the electron injection layer, and the electron transport layer is formed through an inkjet printing method.

An embodiment may provide a display device including a light emitting element having improved light emitting efficiency, with a structure in which an electron transport layer is disposed on a first electrode adjacent to a pixel defining film, and an electron injection layer and an electron transport layer are stacked each other on the first electrode spaced apart from the pixel defining film.

Although the disclosure has been described with reference to a embodiments, it will be understood that the disclosure should not be limited to these embodiments but various changes and modifications can be made by those skilled in the art without departing from the spirit and scope of the disclosure.

Hence, the technical scope of the disclosure is not limited to the detailed descriptions in the specification but should be determined with reference to the claims.

What is claimed is:

1. A display device comprising:
    a base layer;
    a circuit layer disposed on the base layer;
    a first electrode disposed on the circuit layer;
    a pixel defining film disposed on the circuit layer and having an opening exposing the first electrode;
    an electron injection layer disposed on the first electrode and exposing a portion of the first electrode;
    an electron transport layer disposed on the electron injection layer and overlapping the electron injection layer in plan view;
    an emission layer disposed on the electron transport layer;
    a hole transport region disposed on the emission layer; and
    a second electrode disposed on the hole transport region,
    wherein a first length of the electron injection layer in a direction is shorter than a second length of the first electrode exposed by the opening of the pixel defining film in a direction.

2. The display device of claim 1, wherein an average distance between an edge portion of the electron injection layer and a side surface of the pixel defining film adjacent to the edge portion of the electron injection layer is in a range of about 1 μm to about 2 μm.

3. The display device of claim 1, wherein
    the electron injection layer comprises ZnO, and
    the electron transport layer comprises ZnMgO.

4. The display device of claim 1, wherein the first electrode exposed by the opening of the pixel defining film comprises:
    a first portion exposed by the electron injection layer; and
    a second portion overlapped by the electron injection layer in plan view.

5. The display device of claim 4, wherein the first portion of the first electrode is overlapped by the electron transport layer in plan view.

6. The display device of claim 1, wherein the first electrode is a reflective electrode.

7. The display device of claim 1, wherein a difference between the first length of the electron injection layer and the second length of the first electrode is in a range of about 2 μm to about 4 μm.

8. The display device of claim 1, wherein a surface of the electron injection layer adjacent to the electron transport layer is a substantially flat surface.

9. The display device of claim 1, wherein the electron injection layer has a substantially uniform thickness.

10. The display device of claim 1, wherein
    the electron injection layer is provided through a deposition, and
    the electron transport layer is provided through an inkjet printing.

11. The display device of claim 1, wherein the emission layer comprises quantum dots.

12. A display device comprising:
    a pixel defining film having openings spaced apart in plan view; and
    light emitting elements including at least one functional layer disposed in each of the openings of the pixel defining film, wherein
    the light emitting elements each include:
        a first electrode;
        an electron injection layer disposed on the first electrode, having a substantially uniform thickness, and spaced apart from the pixel defining film;
        an electron transport layer disposed on the electron injection layer and being smaller in thickness at a center of the electron transport layer than at an outer periphery of the electron transport layer;
        an emission layer disposed on the electron transport layer;
        a hole transport region disposed on the emission layer; and
        a second electrode disposed on the hole transport region, and
    the first electrode includes:
        a first portion exposed by the electron injection layer; and
        a second portion overlapped by the electron injection layer in plan view.

13. The display device of claim 12, wherein a distance between an edge portion of the electron injection layer adjacent to the pixel defining film and an edge portion of the first electrode adjacent to the edge portion of the electron injection layer is in a range of about 1 μm to about 4 μm.

14. The display device of claim 12, wherein the electron transport layer overlaps the electron injection layer in plan view.

15. The display device of claim 12, wherein the electron injection layer has a greater electrical conductivity than an electrical conductivity of the electron injection layer.

16. The display device of claim 12, wherein the first portion of the first electrode is overlapped by the electron transport layer in plan view.

17. The display device of claim 12, wherein a surface of the electron injection layer adjacent to the electron transport layer is a substantially flat surface.

18. The display device of claim 12, wherein an average distance between an edge portion of the electron injection layer adjacent to the pixel defining film and a side surface of the pixel defining film adjacent to the edge portion of the electron injection layer is in a range of about 1 μm to about 2 μm.

19. A display device comprising:
light emitting elements, wherein
the light emitting elements each include:
- a first electrode;
- an electron injection layer disposed on the first electrode;
- an electron transport layer disposed on the electron injection layer;
- an emission layer disposed on the electron transport layer;
- a hole transport region disposed on the emission layer; and
- a second electrode disposed on the hole transport region, the electron injection layer has a smaller area than an area of the first electrode in plan view,
the electron injection layer has a substantially uniform thickness, and
the electron transport layer is smaller in thickness at a center of the electron transport layer than at an outer periphery of the electron transport layer.

20. The display device of claim 19, wherein the electron transport layer is disposed directly on the first electrode that is exposed from the electron injection layer.

* * * * *